(12) United States Patent
Jun et al.

(10) Patent No.: US 10,665,588 B2
(45) Date of Patent: May 26, 2020

(54) INTEGRATED CIRCUIT DEVICE AND METHOD OF FABRICATING THE SAME

(71) Applicant: Samsung Electronics Co., Ltd., Suwon-si, Gyeonggi-do (KR)

(72) Inventors: Hwi-chan Jun, Yongin-si (KR); Heon-jong Shin, Yongin-si (KR); In-chan Hwang, Siheung-si (KR); Jae-ran Jang, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 169 days.

(21) Appl. No.: 15/808,865

(22) Filed: Nov. 9, 2017

(65) Prior Publication Data

US 2018/0261596 A1 Sep. 13, 2018

(30) Foreign Application Priority Data

Mar. 10, 2017 (KR) ........................ 10-2017-0030534

(51) Int. Cl.
*H01L 29/66* (2006.01)
*H01L 21/768* (2006.01)
*H01L 21/265* (2006.01)
*H01L 27/088* (2006.01)
*H01L 29/08* (2006.01)
(Continued)

(52) U.S. Cl.
CPC .... *H01L 27/0886* (2013.01); *H01L 21/26513* (2013.01); *H01L 21/761* (2013.01); *H01L 21/76224* (2013.01); *H01L 21/76877* (2013.01); *H01L 21/823431* (2013.01); *H01L 21/823475* (2013.01); *H01L 21/823481* (2013.01); *H01L 23/528* (2013.01); *H01L 27/0207* (2013.01); *H01L 29/0646* (2013.01);
(Continued)

(58) Field of Classification Search
CPC ......... H01L 21/823431; H01L 29/0847; H01L 29/0646; H01L 29/6656; H01L 27/0207; H01L 29/0649; H01L 29/41791; H01L 21/761; H01L 21/76877; H01L 21/823481; H01L 29/66545; H01L 21/26513; H01L 21/76224; H01L 23/528; H01L 21/823475; H01L 27/0886
See application file for complete search history.

(56) References Cited

U.S. PATENT DOCUMENTS 8,609,510 B1 12/2013 Banna et al.
8,735,991 B2 5/2014 Shieh et al.
(Continued)

*Primary Examiner* — Savitri Mulpuri
(74) *Attorney, Agent, or Firm* — Renaissance IP Law Group LLP

(57) ABSTRACT

An integrated circuit device is provided as follows. A fin-type active region extends on a substrate in a first horizontal direction. A gate line extends on the fin-type active region in a second horizontal direction intersecting the first horizontal direction. A source/drain region is disposed in the fin-type active region at one side of the gate line. An insulating cover extends parallel to the substrate, with the gate line and the source/drain region arranged between the insulating cover and the substrate. A source/drain contact that vertically extends through the insulating cover has a first sidewall covered with the insulating cover and an end connected to the source/drain region. A fin isolation insulating unit vertically extends through the insulating cover into the fin-type active region. The source/drain region is arranged between the fin isolation insulating unit and the gate line.

18 Claims, 60 Drawing Sheets

(51) Int. Cl.

| | | |
|---|---|---|
| *H01L 29/417* | (2006.01) | |
| *H01L 29/06* | (2006.01) | |
| *H01L 21/8234* | (2006.01) | |
| *H01L 27/02* | (2006.01) | |
| *H01L 21/762* | (2006.01) | |
| *H01L 21/761* | (2006.01) | |
| *H01L 23/528* | (2006.01) | |
| *H01L 29/78* | (2006.01) | |

(52) U.S. Cl.
CPC ...... *H01L 29/0649* (2013.01); *H01L 29/0847* (2013.01); *H01L 29/41791* (2013.01); *H01L 29/6656* (2013.01); *H01L 29/66545* (2013.01); *H01L 29/7854* (2013.01)

(56) References Cited

U.S. PATENT DOCUMENTS

| | | | |
|---|---|---|---|
| 9,299,700 B2* | 3/2016 | Park | H01L 29/0653 |
| 9,490,176 B2 | 11/2016 | Chang et al. | |
| 9,659,827 B2* | 5/2017 | You | H01L 21/823878 |
| 10,056,289 B1* | 8/2018 | Cheng | H01L 21/764 |
| 10,128,240 B2* | 11/2018 | Min | H01L 21/823481 |
| 10,141,312 B2* | 11/2018 | Jeon | H01L 27/0924 |
| 10,153,212 B2* | 12/2018 | Jun | H01L 21/823481 |
| 2015/0214341 A1* | 7/2015 | Shin | H01L 29/66818 |
| | | | 257/401 |
| 2016/0111524 A1 | 4/2016 | Ha et al. | |
| 2016/0268392 A1 | 9/2016 | Zhu | |
| 2016/0308025 A1 | 10/2016 | Chudzik et al. | |
| 2016/0322264 A1 | 11/2016 | Chan et al. | |
| 2016/0322365 A1 | 11/2016 | Kim | |
| 2016/0322500 A1 | 11/2016 | Chan et al. | |
| 2016/0380052 A1* | 12/2016 | Kim | H01L 29/0653 |
| | | | 257/401 |
| 2018/0096935 A1* | 4/2018 | Kim | H01L 29/0847 |
| 2018/0138174 A1* | 5/2018 | Min | H01L 21/823481 |
| 2018/0358450 A1* | 12/2018 | Kim | H01L 29/6681 |
| 2019/0139831 A1* | 5/2019 | Zhu | H01L 21/823481 |

* cited by examiner

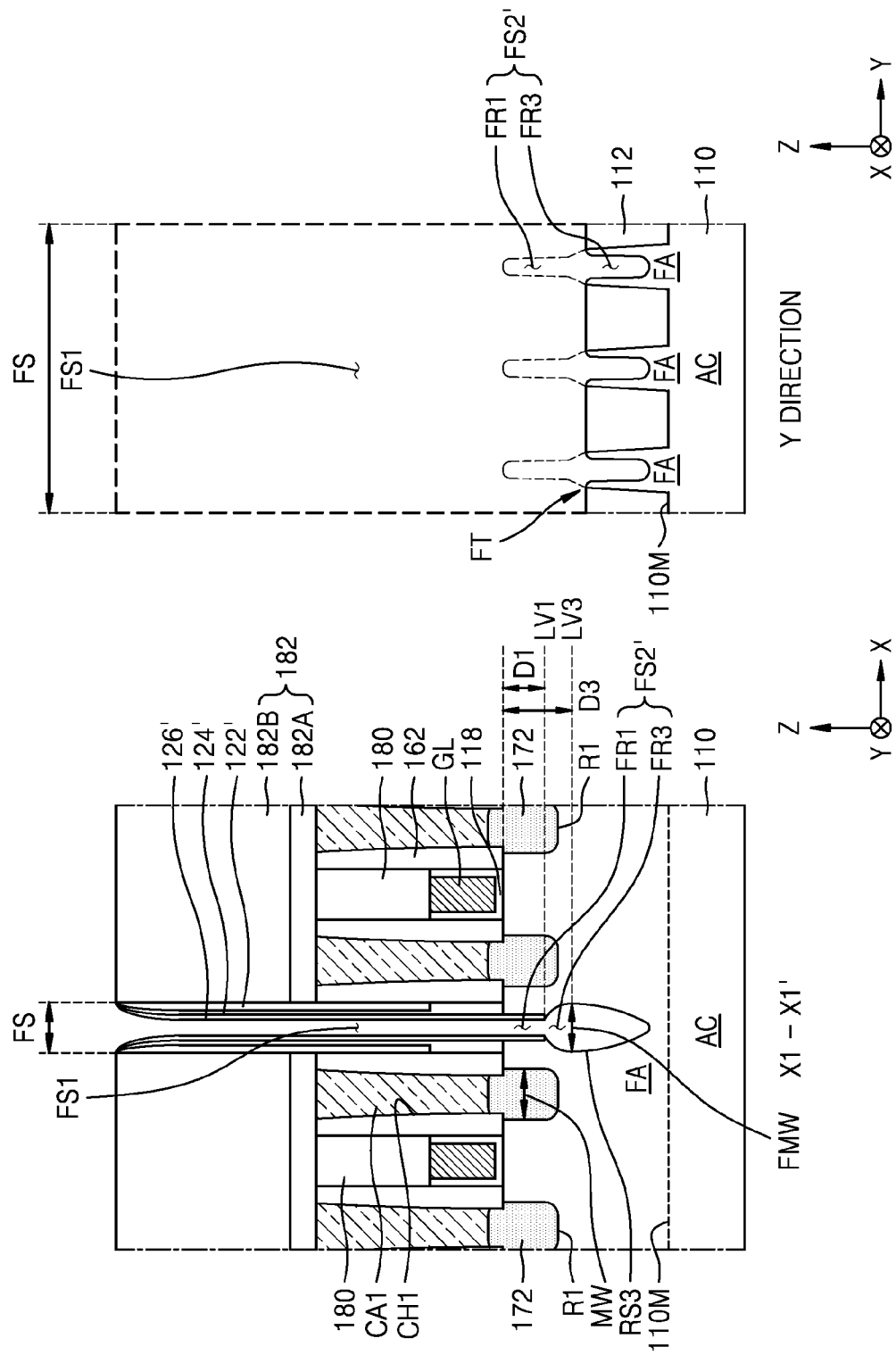

X1 – X1'

INTEGRATED CIRCUIT DEVICE AND METHOD OF FABRICATING THE SAME

CROSS-REFERENCE TO RELATED APPLICATION

This application claims priority under 35 U.S.C. § 119 to Korean Patent Application No. 10-2017-0030534, filed on Mar. 10, 2017, in the Korean Intellectual Property Office, the disclosure of which is incorporated by reference herein in its entirety.

TECHNICA1. FIELD

The present inventive concept relates to an integrated circuit device and a method of fabricating the same.

DISCUSSION OF RELATED ART

Due to the development of electronic technology, semiconductor devices have rapidly been down-scaled in recent years. Since semiconductor devices require accuracy of an operation as well as a fast operation speed, a structure of a transistor included in a semiconductor device needs to meet those requirements at a smaller size.

SUMMARY

According to an exemplary embodiment of the present inventive concept, an integrated circuit device is provided as follows. A fin-type active region extends on a substrate in a first horizontal direction. A gate line extends on the fin-type active region in a second horizontal direction intersecting the first horizontal direction. A source/drain region is disposed in the fin-type active region at one side of the gate line. An insulating cover extends parallel to the substrate, with the gate line and the source/drain region arranged between the insulating cover and the substrate. A source/drain contact vertically extends through the insulating cover. The source/drain contact has a first sidewall covered with the insulating cover and an end connected to the source/drain region. A fin isolation insulating unit vertically extends through the insulating cover into the fin-type active region. The fin isolation insulating unit is spaced apart from the gate line, with the source/drain region arranged between the fin isolation insulating unit and the gate line.

According to an exemplary embodiment of the present inventive concept, an integrated circuit device is provided as follows. A fin-type active region extends on a substrate in a first direction. A gate line extends on the fin-type active region in a second direction intersecting the first direction. A first source/drain region and a second source/drain region are disposed in the fin-type active region. An insulating cover extends parallel to the substrate, with the gate line, the first source/drain region and the second source/drain region arranged between the insulating cover and the substrate. A fin isolation insulating unit extends vertically through the insulating cover between the first source/drain region and the second source/drain region. An end of the fin isolation insulating unit is buried in the fin-type active region. The end of the fin isolation insulating unit is lower than a bottom surface of the first source/drain region.

According to an exemplary embodiment of the present inventive concept, a method of fabricating an integrated circuit device is provided as follows. A fin-type active region is formed on a substrate. A first source/drain region and a second source/drain region are formed in the fin-type active region. A gate line is formed on the fin-type active region. An insulating cover is formed to extend parallel to the substrate to cover the gate line, the first source/drain region and the second source/drain region. A fin isolation insulating unit vertically extends through the insulating cover into the fin-type active region between the first source/drain region and the second source/drain region. A bottom surface of the fin isolation insulating unit is lower than a bottom surface of the first source/drain region.

BRIEF DESCRIPTION OF THE DRAWINGS

These and other features of the present inventive concept will become more apparent by describing in detail exemplary embodiments thereof with reference to the accompanying drawings of which:

FIGS. 10A and 10B are cross-sectional views illustrating a method of fabricating an integrated circuit device, according to an exemplary embodiment of the present inventive concept;

DETAILED DESCRIPTION OF EXEMPLARY EMBODIMENTS

Figure 1:
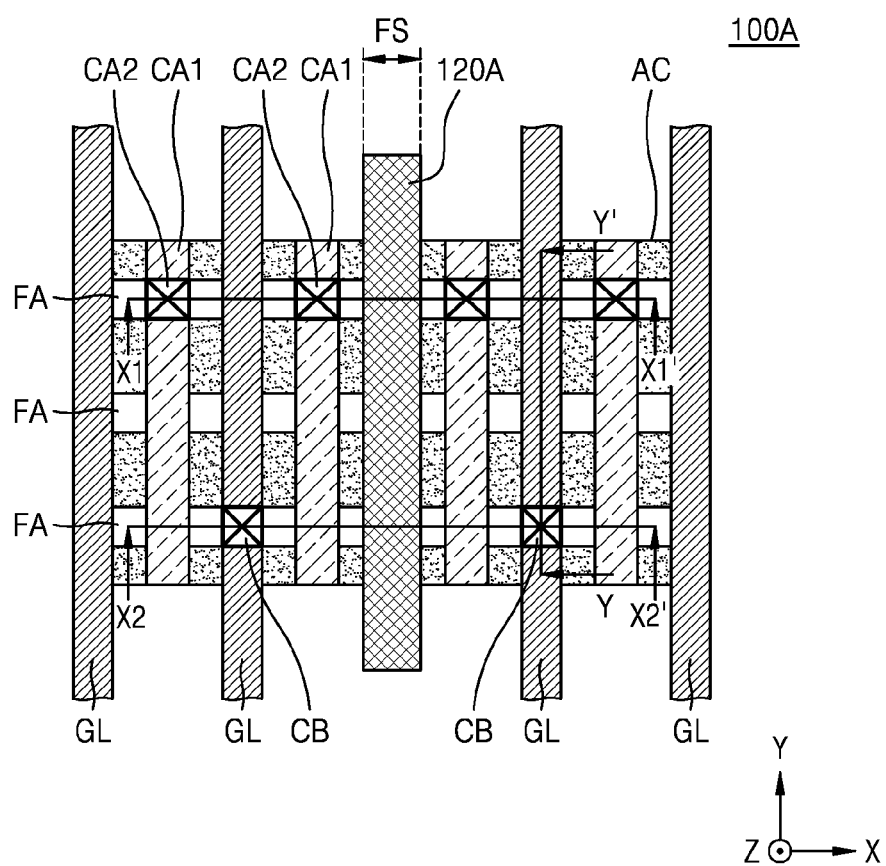
FIG. 1 is a planar layout diagram illustrating an integrated circuit device, according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. Like reference numerals may refer to the like elements throughout the specification and drawings.

Figure 2A:
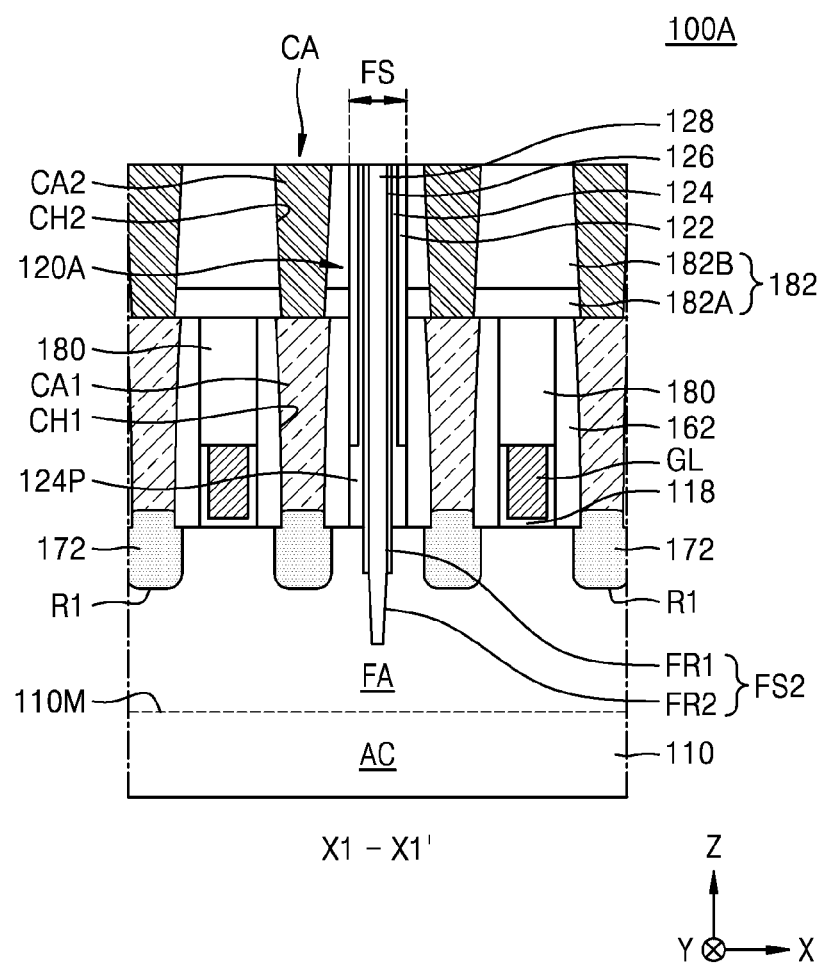
FIG. 2A is a cross-sectional view of the integrated circuit device, taken along line X1-X1' of FIG. 1, according to an exemplary embodiment of the present inventive concept.
Figure 2B:
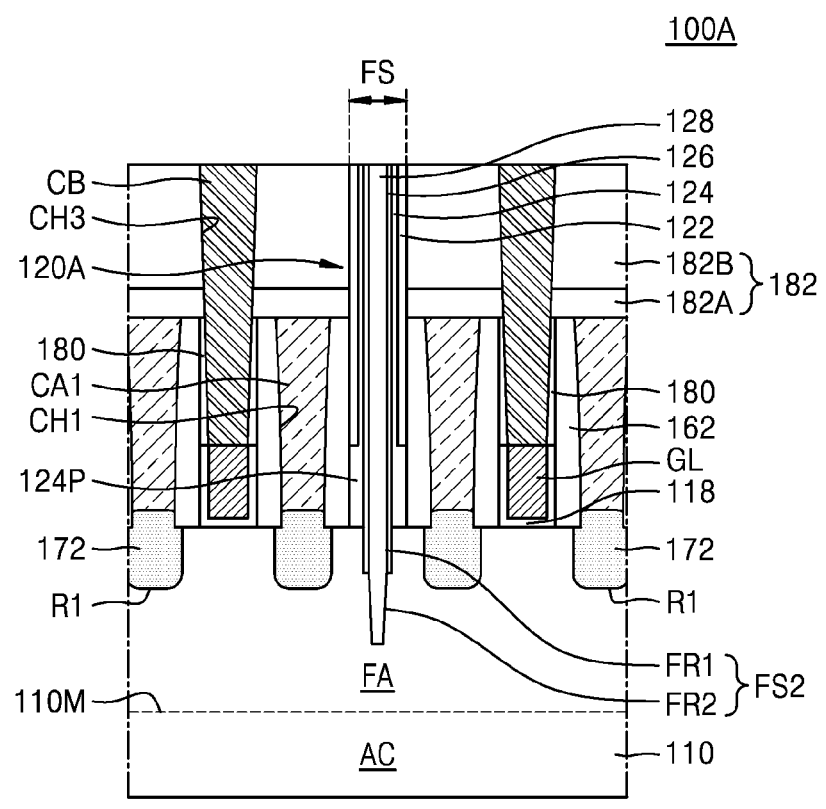
FIG. 2B is a cross-sectional view of the integrated circuit device, taken along line X2-X2' of FIG. 1, according to an exemplary embodiment of the present inventive concept.
Figure 2C:
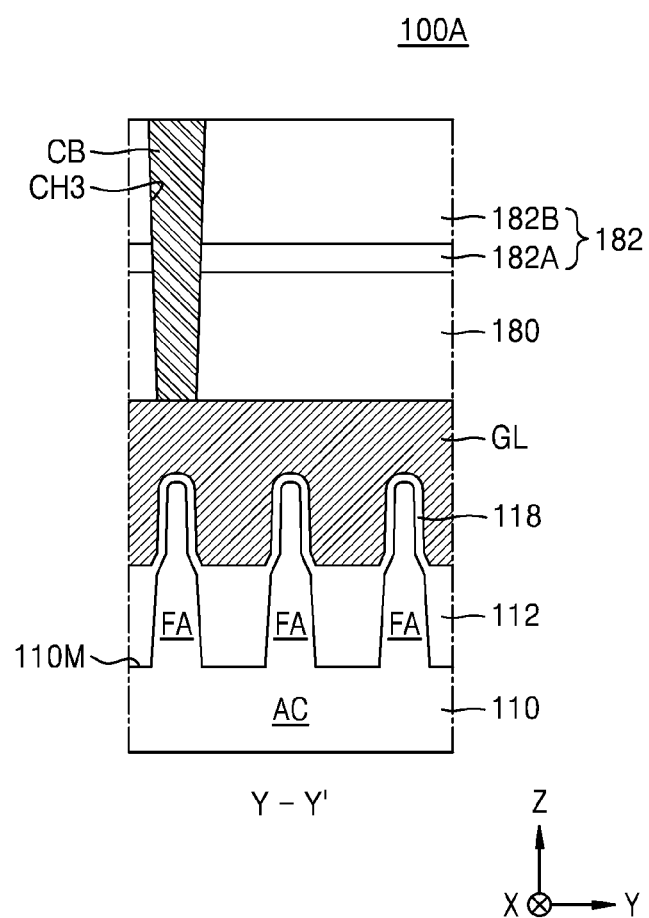
FIG. 2C is a cross-sectional view of the integrated circuit device, taken along line Y-Y' of FIG. 1, according to an exemplary embodiment of the present inventive concept.

FIGS. 1 and 2A to 2C are diagrams illustrating an integrated circuit device according to an exemplary embodiment. FIG. 1 is a planar layout diagram illustrating an integrated circuit device 100A, FIG. 2A is a cross-sectional view of the integrated circuit device 100A, taken along line X1-X1' of FIG. 1, FIG. 2B is a cross-sectional view of the integrated circuit device 100A, taken along line X2-X2' of FIG. 1, and FIG. 2C is a cross-sectional view of the integrated circuit device 100A, taken along line Y-Y' of FIG. 1. The integrated circuit device 100A shown in FIGS. 1 and 2A to 2C may constitute a logic cell including a fin field effect transistor (FinFET) device.

Referring to FIGS. 1 and 2A to 2C, a substrate 110 having a main surface 110M extending in horizontal directions includes a device active region AC. The substrate 110 may include a semiconductor material such as Si and Ge, or a compound semiconductor material such as SiGe, SiC, GaAs, InAs, and InP. The substrate 110 may include a conductive region, for example, an impurity-doped well, or an impurity-doped structure.

A plurality of fin-type active regions FA protrude from the device active region AC of the substrate 110. The plurality of fin-type active regions FA extends parallel to each other in one direction (X direction). An isolation insulating film 112 is formed on the device active region AC and between the plurality of fin-type active regions FA. The plurality of fin-type active regions FA further protrude in a fin shape upwards from the isolation insulating film 112.

A plurality of gate insulating films 118 and a plurality of gate lines GL extend over the substrate 110 in a horizontal direction (Y direction) intersecting the plurality of fin-type active regions FA. The plurality of gate insulating films 118 and the plurality of gate lines GL extend to cover a top surface and both sidewalls of each of the plurality of fin-type active regions FA and a top surface of the isolation insulating film 112. A plurality of metal-oxide-semiconductor (MOS) transistors may be formed along the plurality of gate lines GL over the device active region AC. Each of the plurality of MOS transistors may be a 3-dimensional-structured MOS transistor, in which a channel is formed on the top surface, and both sidewalls of each of the plurality of fin-type active regions FA.

The plurality of gate insulating films 118 may include a silicon oxide film, a high-K dielectric film, or a combination thereof. The high-K dielectric film may include a material having a greater dielectric constant than a silicon oxide film. For example, the plurality of gate insulating films 118 may have a dielectric constant of about 10 to about 25. The high-K dielectric film may include a metal oxide or a metal oxynitride. The high-K dielectric film may include a metal oxide or a metal oxynitride. An interfacial layer (not shown) may be arranged between one of the plurality of fin-type active regions FA and one of the plurality of gate insulating films 118. The interfacial layer may include an oxide film, a nitride film, or an oxynitride film.

The plurality of gate lines GL may include a work function metal-containing layer and a gap-fill metal film. The work function metal-containing layer may include Ti, W, Ru, Nb, Mo, Hf, Ni, Co, Pt, Yb, Tb, Dy, Er, or Pd. The gap-fill metal film may include a W film or an Al film. In an exemplary embodiment, each of the plurality of gate lines GL may include a stacked structure of TiAlC/TiN/W, a stacked structure of TiN/TaN/TiAlC/TiN/W, or a stacked structure of TiN/TaN/TiN/TiAlC/TiN/W.

The plurality of gate lines GL and the plurality of gate insulating films 118 are covered with a plurality of gate insulating capping layers 180. The plurality of gate insulating capping layers 180 may include a silicon nitride film. Both sidewalls of the plurality of gate lines GL and the plurality of gate insulating films 118 are covered with a plurality of insulating spacers 162. The plurality of insulating spacers 162 may extend, in line shapes, parallel to the plurality of gate lines GL in a length direction of the plurality of gate lines GL (Y direction). The plurality of insulating spacers 162 may include a silicon nitride film, a SiOCN film, a SiCN film, or a combination thereof.

A plurality of source/drain regions 172 may be formed in the plurality of fin-type active regions FA at both sides of the plurality of gate lines GL. One of the plurality of gate lines GL and one of the plurality of source/drain regions 172 adjacent to each other are spaced apart from each other, with one of the plurality of gate insulating films 118 and one of the plurality of insulating spacers 162 arranged therebetween. For example, the one of the plurality of source/drain regions 172 is disposed at one side of the one of the plurality of gate lines GL. The plurality of source/drain regions 172 may each include an impurity-ion-implanted region formed in a partial area of one of the plurality of fin-type active regions FA. The plurality of source/drain regions 172 may each include a semiconductor epitaxial layer epitaxially grown on a plurality of recess regions R1 formed in one of the plurality of fin-type active regions FA. The plurality of source/drain regions 172 may each include an epitaxially grown Si layer, an epitaxially grown SiC layer, or a plurality of epitaxially grown SiGe layers. Some regions among the plurality of source/drain regions 172 may be covered with an inter-gate dielectric 164 (see FIG. 7B). The inter-gate dielectric 164 may include a silicon oxide film.

The substrate 110 includes a fin isolation region FS extending on the plurality of fin-type active regions FA in a direction across the device active region AC and the plurality of fin-type active regions FA. The fin isolation region FS may extend parallel to the plurality of gate lines GL.

An insulating cover 182 horizontally extends parallel to the substrate 110, over the plurality of fin-type active regions FA. The insulating cover 182 extends to cover the device active region AC on both sides of the fin isolation region FS without covering a top surface of the fin isolation region FS. The plurality of gate lines GL, the plurality of insulating spacers 162, the inter-gate dielectric 164, the plurality of source/drain regions 172, and the plurality of gate insulating capping layers 180 are arranged between the substrate 110 and the insulating cover 182. The insulating cover 182 has a double-layered structure including a first insulating cover 182A and a second insulating cover 182B. The first insulating cover 182A and the second insulating cover 182B may include different materials from each other. For example, the first insulating cover 182A may include a silicon nitride film, and the second insulating cover 182B may include a silicon oxide film. The present inventive concept is not limited thereto. For example, the insulating cover 182 may be formed of a single layer.

A plurality of source/drain contacts CA and a plurality of gate contacts CB vertically extend through the insulating cover 182. Each of the plurality of source/drain contacts CA includes a lower source/drain contact CA1 and an upper source/drain contact CA2, which are vertically connected to each other. The lower source/drain contact CA1 vertically extends through the inter-gate dielectric 164 of FIG. 7B and has an end connected to at least one of the plurality of source/drain regions 172. The lower source/drain contact CA1 extends in a direction across the plurality of fin-type active regions FA. FIG. 1 illustrates an example in which the lower source/drain contact CA1 is formed in plural over three fin-type active regions to cross the three fin-type active regions in the Y direction. A top surface of the lower source/drain contact CA1 is at substantially the same level as a top surface of each of the plurality of gate insulating capping layers 180. The upper source/drain contact CA2 has a sidewall covered with the insulating cover 182 and vertically extends from the top surface of the lower source/drain contact CA1 to a top surface of the insulating cover 182.

Each of the plurality of gate contacts CB vertically extends from a top surface of one of the plurality of gate lines GL to the top surface of the insulating cover 182. Each of the plurality of gate contacts CB has an end connected to one of the plurality of gate lines GL and a sidewall covered with the insulating cover 182.

The lower source/drain contact CA1. the upper source/drain contact CA2, and each of the plurality of gate contacts CB may include a metal film and a conductive barrier film surrounding the metal film. The metal film may include Co, Cu, W, Ru, Mn, or a combination thereof, and the conductive barrier film may include Ti, Ta, TiN, TaN, or a combination thereof.

A fin isolation insulating unit 120A is formed in the fin isolation region FS to vertically extend parallel to the plurality of gate lines GL on the plurality of fin-type active regions FA. The fin isolation insulating unit 120A is horizontally spaced apart from one of the plurality of gate lines GL. One of the plurality of source/drain regions 172 is arranged between the fin isolation insulating unit 120A and one of the two gate lines. One of the plurality of source/drain regions 172 is arranged between the fin isolation insulating unit 120A and the other of the two gate lines. The fin isolation insulating unit 120A vertically extend from the inside of the one of the plurality of fin-type active regions FA to the top surface of the insulating cover 182. The fin isolation insulating unit 120A has a sidewall covered with the insulating cover 182. A portion of a sidewall of each of the plurality of source/drain contacts CA and the plurality of gate contacts CB, which is covered with the insulating cover 182, and a portion of the sidewall of the fin isolation insulating unit 120A, which is covered with the insulating cover 182, may be at the same level. A top surface of each of the plurality of source/drain contacts CA, a top surface of each of the plurality of gate contacts CB, the top surface of the insulating cover 182, and a top surface of the fin isolation insulating unit 120A extend on the same plane, or are positioned at substantially the same level.

In the fin isolation region FS, the fin isolation insulating unit 120A includes a fin isolation insulating film 128 extending parallel to the plurality of gate lines GL and having an end, which fills a fin inside isolation space FS2 in one of the plurality of fin-type active regions FA, and a sidewall covered with the insulating cover 182. For example, the end of fin isolation insulating film 128 is buried in the one of the plurality of fin-type active regions FA. The fin inside isolation space FS2 includes a lower fin recess FR2 and an upper fin recess FR1, which communicate with each other. For example, the lower fin recess FR2 is connected to the upper fin recess FR1.

The fin isolation insulating unit 120A further includes a first fin isolation spacer 122, a second fin isolation spacer 124, and a third fin isolation spacer 126, which cover a sidewall of the fin isolation insulating film 128. The first fin isolation spacer 122 vertically extends between the fin isolation insulating film 128 and the insulating cover 182 to cover the sidewall of the fin isolation insulating film 128. The first fin isolation spacer 122 has a bottom surface that is at a higher level than an uppermost surface of the one of the plurality of fin-type active regions FA. The second fin isolation spacer 124 vertically extends between the fin isolation insulating film 128 and the first fin isolation spacer 122. The second fin isolation spacer 124 includes a protrusion 124P which is between the first fin isolation spacer 122 and the one of the plurality of fin-type active regions FA and protrudes in an opposite direction to the fin isolation insulating film 128. The third fin isolation spacer 126 vertically extends between the fin isolation insulating film 128 and the second fin isolation spacer 124 and from the inside of the upper fin recess FR1 of the fin inside isolation space FS2 to the top surface of the insulating cover 182. Each of the first fin isolation spacer 122, the second fin isolation spacer 124, and the third fin isolation spacer 126 may include a silicon nitride film. The fin isolation insulating film 128 may include a silicon oxide film, a silicon nitride film, or a combination thereof.

Figure 3A:
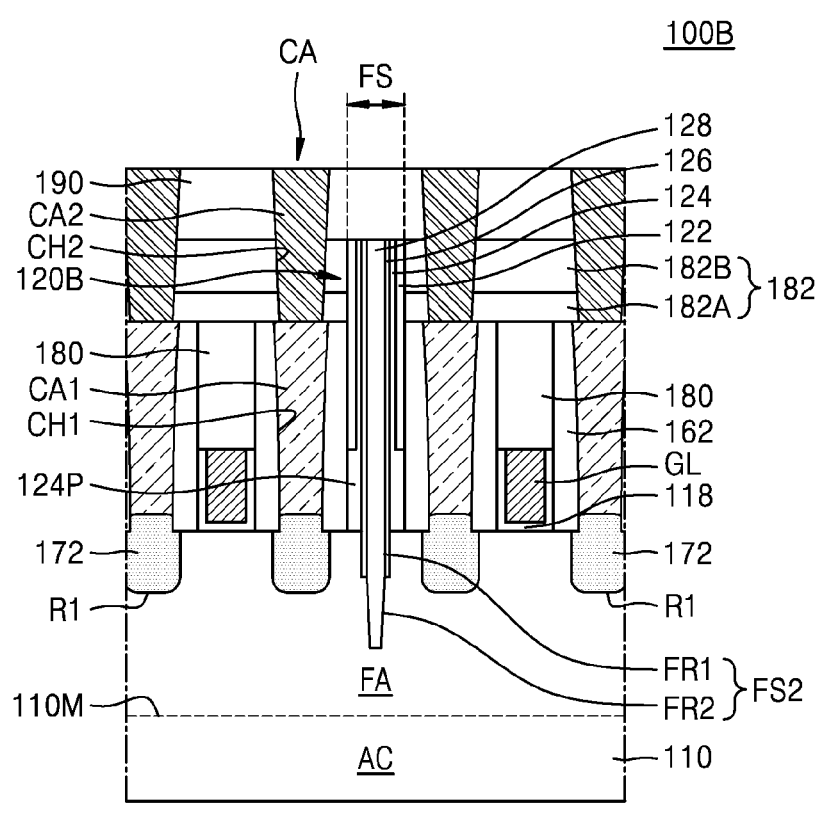
FIGS. 3A and 3B, FIG. 4, FIGS. 5A and 5B, and FIGS. 6A and 6B are cross-sectional views illustrating integrated circuit devices, according to an exemplary embodiment of the present inventive concept.
Figure 3B:
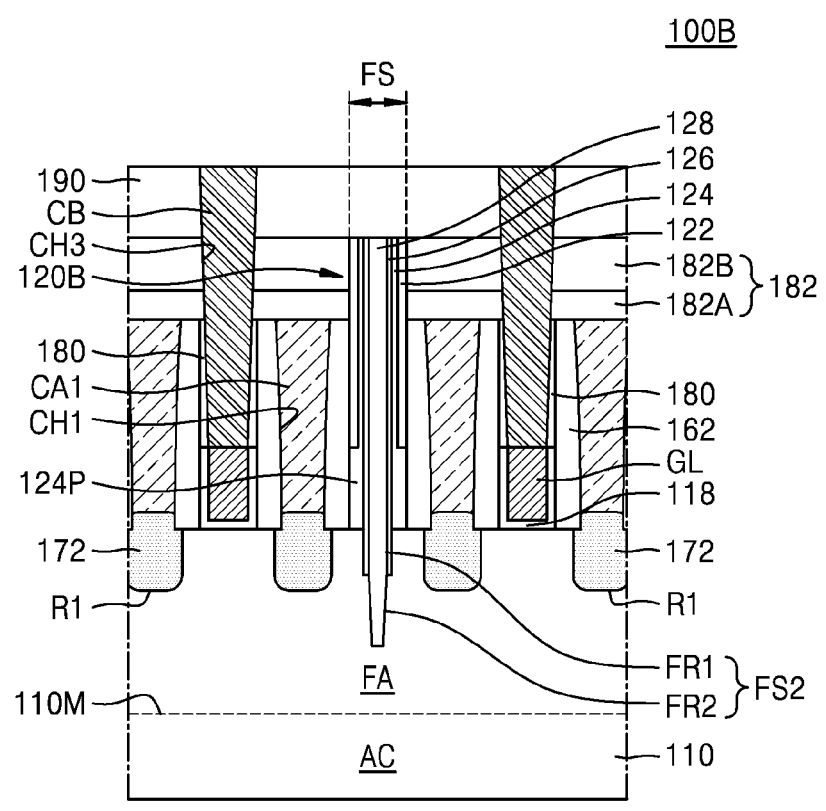

FIGS. 3A and 3B are cross-sectional views illustrating an integrated circuit device, according to an exemplary embodiment. FIGS. 3A and 3B respectively illustrate configurations of portions of the integrated circuit device, which correspond to cross-sections taken along lines X1-X1' and X2-X2' of FIG. 1.

An integrated circuit device 100B shown in FIGS. 3A and 3B has substantially the same configuration as the integrated circuit device 100A shown in FIGS. 2A to 2C. However, the integrated circuit device 100B includes a fin isolation insulating unit 120B arranged in the fin isolation region FS. A top surface of the fin isolation insulating unit 120B and the top surface of the insulating cover 182 are covered with an upper insulating film 190. The fin isolation insulating unit 120B may have substantially the same configuration as the fin isolation insulating unit 120A of FIGS. 2A, 2B and 2C, except that the fin isolation insulating unit 120B has a Z-direction length that is less than that of the fin isolation insulating unit 120A shown in FIGS. 2A to 2C. The upper insulating film 190 may include a silicon oxide film, or a low-K dielectric film having a dielectric constant of about 2.2 to about 3.0. The low-K dielectric film may include a SiOC film, a SiCOH film, or a combination thereof.

Referring to FIGS. 3A and 3B, in the integrated circuit device 100B, the top surface of the fin isolation insulating unit 120B and the top surface of the insulating cover 182 extend on the same plane. Each of the plurality of source/drain contacts CA and each of the plurality of gate contacts CB protrude from the top surface of the insulating cover 182 in an opposite direction to the substrate 110 and extend through the upper insulating film 190. The top surfaces of the plurality of source/drain contacts CA and the top surfaces of the plurality of gate contacts CB are located at a higher level from the substrate 110 than the top surface of the fin isolation insulating unit 120B. The top surfaces of the plurality of source/drain contacts CA, the top surfaces of the plurality of gate contacts CB, and a top surface of the upper insulating film 190 extend on the same plane or are positioned at substantially the same level.

Figure 4:
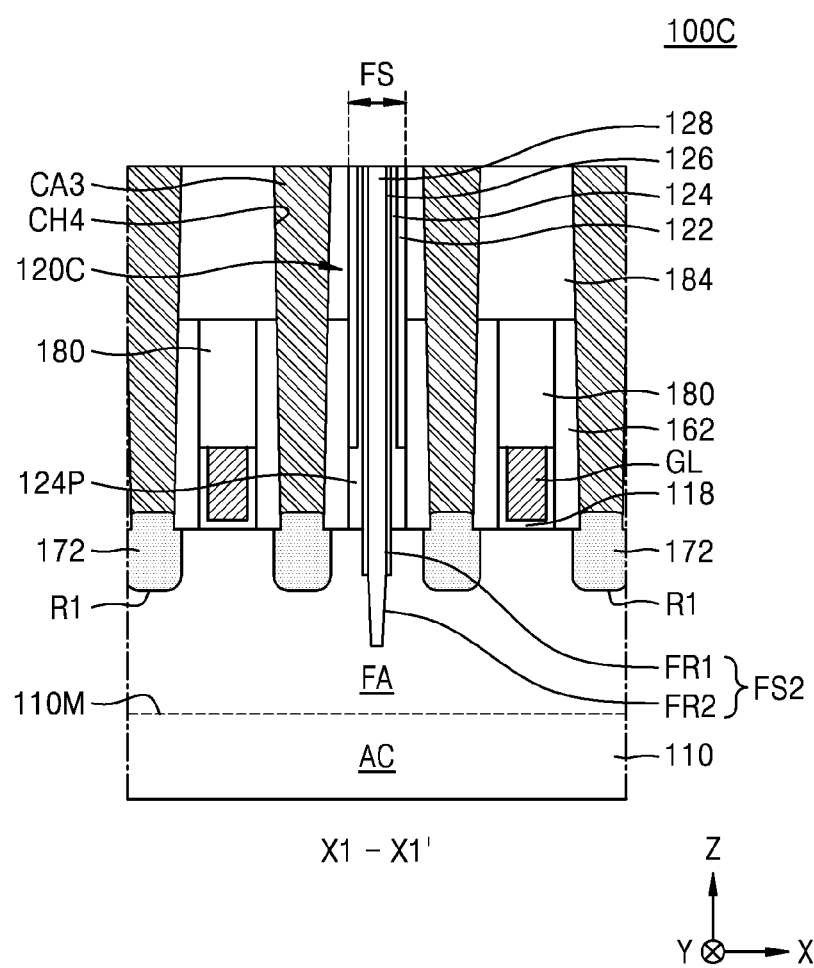

FIG. 4 is a cross-sectional view illustrating an integrated circuit device, according to an exemplary embodiment. FIG. 4 illustrates a configuration of a portion of the integrated circuit device, which corresponds to a cross-section taken along the line X1-X1' of FIG. 1.

Referring to FIG. 4, an integrated circuit device 100C has substantially the same configuration as the integrated circuit device 100A shown in FIGS. 2A to 2C. However, the integrated circuit device 100C includes an insulating cover 184 including a single layer instead of the insulating cover 182 of FIGS. 2A to 2C. A fin isolation insulating unit 120C in the fin isolation region FS vertically extends from the inside of one of the plurality of fin-type active regions FA to a top surface of the insulating cover 184 through the insulating cover 184. The fin isolation insulating unit 120C may have substantially the same configuration as the fin isolation insulating unit 120A shown in FIGS. 2A to 2C. The insulating cover 184 extends to cover the device active region AC on both sides of the fin isolation region FS without covering a top surface of the fin isolation region FS. The insulating cover 184 may include silicon oxide.

In addition, the integrated circuit device 100C includes a plurality of source/drain contacts CA3 each connected to one of the plurality of source/drain regions 172. Each of the plurality of source/drain contacts CA3 has an integral contact structure vertically extending from one of the plurality of source/drain regions 172 to the top surface of the insulating cover 184. Top surfaces of the plurality of source/drain contacts CA3, a top surface of the fin isolation insulating unit 120C, and the top surface of the insulating cover 184 are extend on the same plane or positioned at substantially the same level. Constituent materials of the plurality of source/drain contacts CA3 are as described regarding the constituent materials of the upper source/drain contact CA2 with reference to FIGS. 2A to 2C.

Figure 5A:
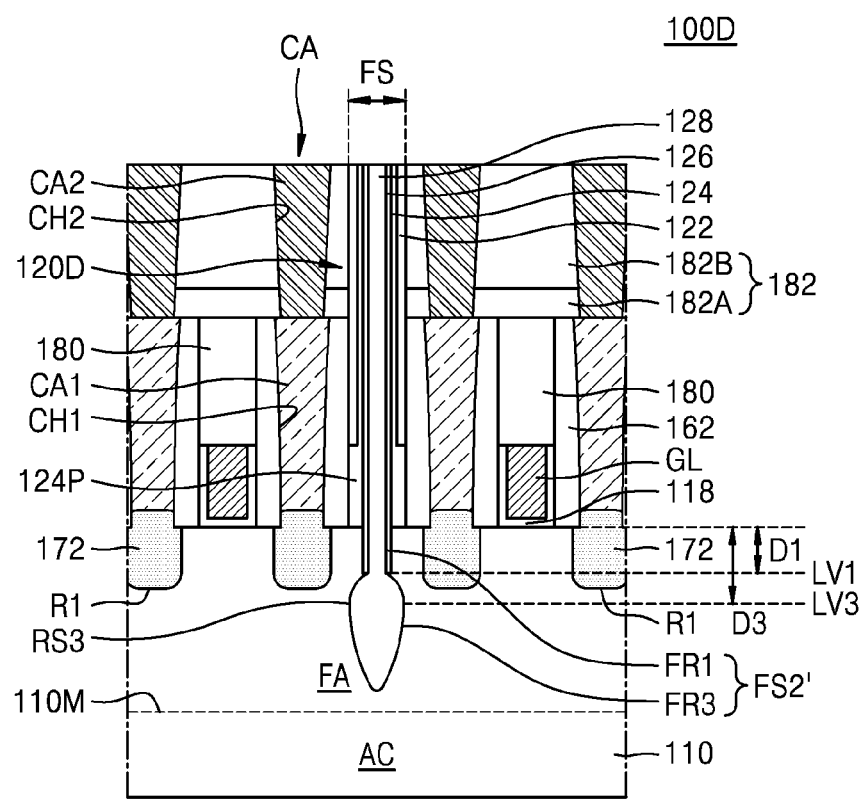
Figure 5B:
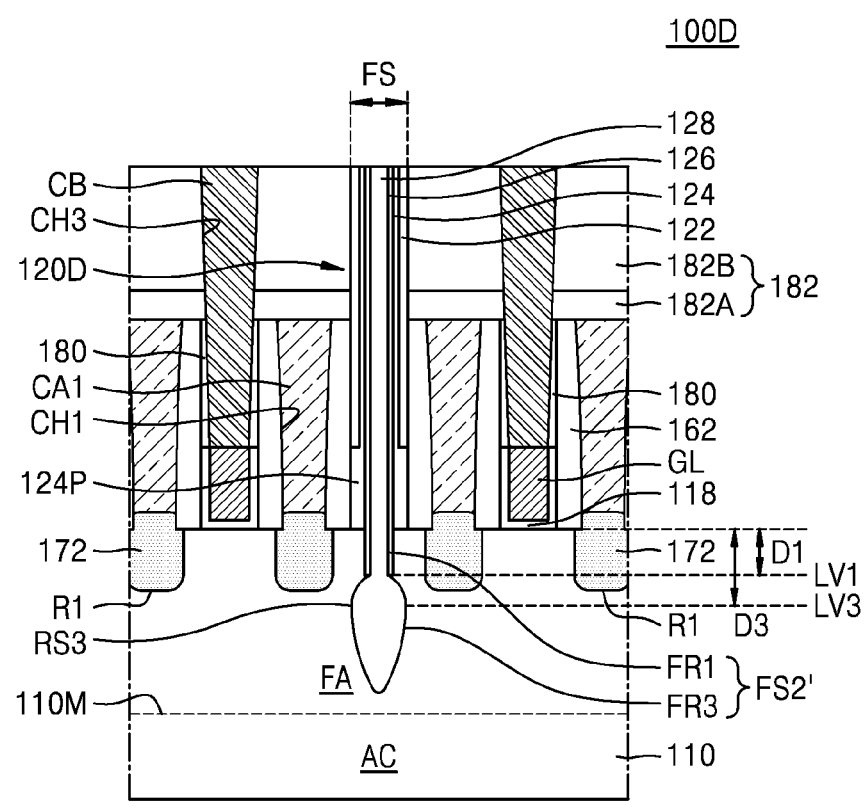

FIGS. 5A and 5B are cross-sectional views illustrating an integrated circuit device, according to an exemplary embodiment. FIGS. 5A and 5B respectively illustrate configurations of portions of the integrated circuit device, which correspond to cross-sections taken along the lines X1-X1' and X2-X2' of FIG. 1.

An integrated circuit device 100D shown in FIGS. 5A and 5B has substantially the same configuration as the integrated circuit device 100A shown in FIGS. 2A to 2C. However, in the integrated circuit device 100D, a fin isolation insulating unit 120D different from the fin isolation insulating unit 120A of FIGS. 2A to 2C is formed in the fin isolation region FS. The fin isolation insulating unit 120D vertically extends from a fin inside isolation space FS2' in one of the plurality of fin-type active regions FA to the top surface of the insulating cover 182 through the insulating cover 182. The fin isolation insulating unit 120D includes the fin isolation insulating film 128 extending parallel to the plurality of gate lines GL and having an end, which fills the fin inside isolation space FS2', and a sidewall covered with the insulating cover 182. The fin inside isolation space FS2' includes a lower fin recess FR3 and the upper fin recess FR1 communicating with the lower fin recess FR3. For example, the lower fin recess FR3 is connected to the upper fin recess FRE The lower fin recess FR3 has a round-shaped sidewall RS3 extending in a depth direction of the one of the plurality of fin-type active regions FA. The fin isolation insulating film 128 has a convexly protruding sidewall facing the round-shaped sidewall RS3. In the X direction, a portion of the fin isolation insulating film 128, which fills the lower fin recess FR3, has a width greater than a width of a portion of the fin isolation insulating film 128, which is in a top portion of the one of the plurality of fin-type active regions FA. For example, the fin isolation insulating film 128 has a first width in the lower fin recess FR3 and a second width over the one of the plurality of fin-type active regions FA. The first width is greater than the second width.

A bottom level LV1 of the upper fin recess FR1 corresponds to a first depth D1 from the top surface of the one of the plurality of fin-type active regions FA. The upper fin recess FR1 extends lower than a level of a portion of the source/drain region 172, which has a maximum width MW (see FIG. 10A) in the X direction, and thus, the bottom level LV1 of the upper fin recess FR1 is closer to the substrate 110 than the maximum-width MW portion of the source/drain region 172. The bottom level LV1 of the upper fin recess FR1 is higher than a bottom surface of one of the plurality of source/drain regions 172 from the substrate 110. The present inventive concept is not limited thereto. In an exemplary embodiment, the bottom level LV1 of the upper fin recess FR1 may be higher than the maximum-width MW portion of one of the plurality of source/drain regions 172 from the substrate 110. In an exemplary embodiment, the bottom level LV1 of the upper fin recess FR1 may be lower than the bottom surface of the one of the plurality of source/drain regions 172 from the substrate 110.

The lower fin recess FR3 is formed at a position lower than the bottom level LV1 of the upper fin recess FRE Thus, a level LV3 of a portion of the lower fin recess FR3, which has a maximum width FMW (see FIG. 10A) in the X direction, that is, a length direction of the one of the plurality of fin-type active regions FA, corresponds to a third depth D3 that is greater than the first depth D1 from the top surface of the one of the plurality of fin-type active regions FA. Therefore, the maximum width FMW (see FIG. 10A) may be increased without an adverse effect on the plurality of source/drain regions 172. The lower fin recess FR3 extending in the depth direction of the one of the plurality of fin-type active regions FA has the round-shaped sidewall RS3, and any contact between the round-shaped sidewall RS3 and its adjacent source/drain region of the plurality of source/drain regions 172 may be avoided.

Figure 6A:
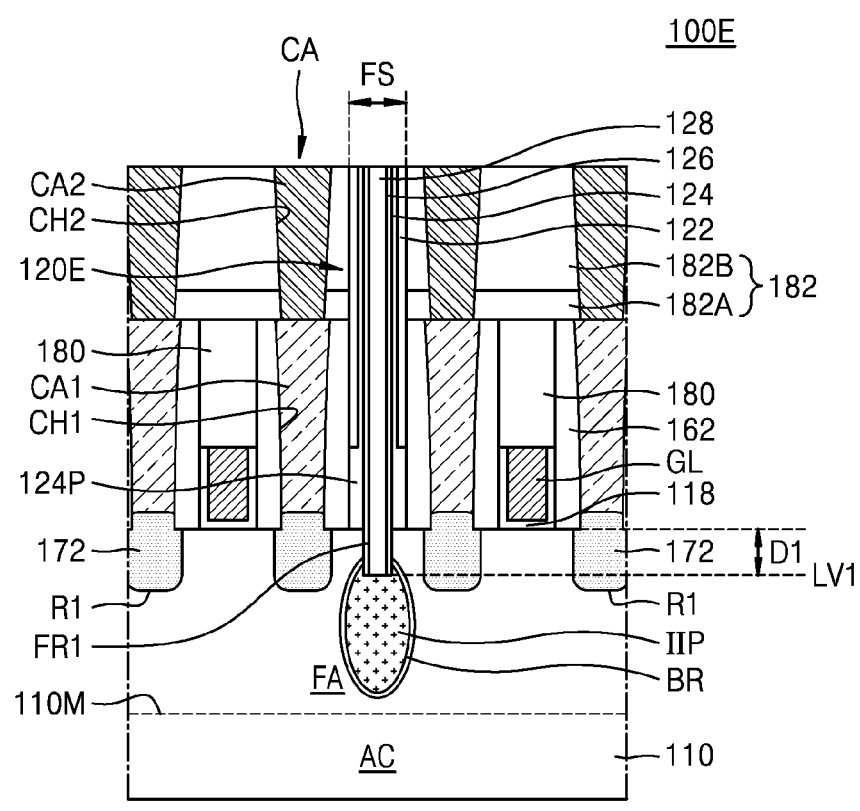
Figure 6B:
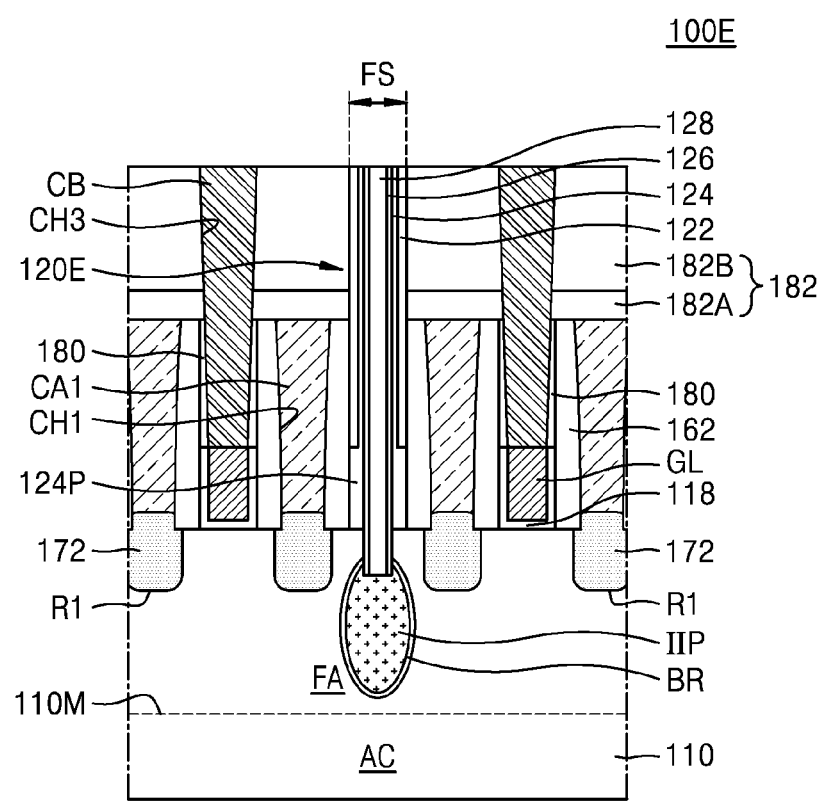

FIGS. 6A and 6B are cross-sectional views illustrating an integrated circuit device, according to an exemplary embodiment. FIGS. 6A and 6B respectively illustrate configurations of portions of the integrated circuit device, which correspond to cross-sections taken along the lines X1-X1' and X2-X2' of FIG. 1.

An integrated circuit device 100E shown in FIGS. 6A and 6B has substantially the same configuration as the integrated circuit device 100A shown in FIGS. 2A to 2C. However, in the integrated circuit device 100E, a fin isolation insulating unit 120E different from the fin isolation insulating unit 120A of FIGS. 2A to 2C is formed in the fin isolation region FS. The fin isolation insulating unit 120E includes an insulating ion implantation region IIP extending from the upper fin recess FR1 to the inside of one of the plurality of fin-type active regions FA, and a barrier ion implantation region BR surrounding the insulating ion implantation region IIP. The barrier ion implantation region BR and the insulating ion implantation region IIP may include impurity regions of conductivity types different from or opposite to each other.

The insulating ion implantation region IIP may be an impurity region of a conductivity type different from, or opposite to, a conductivity type of the one of the plurality of fin-type active regions FA. For example, if the plurality of fin-type active regions FA includes an N-type semiconductor, the insulating ion implantation region IIP may include a P-type impurity region. If the plurality of fin-type active regions FA includes a P-type semiconductor, the insulating ion implantation region IIP may include an N-type impurity region. The insulating ion implantation region IIP is surrounded by the barrier ion implantation region BR. Thus, the insulating ion implantation region IIP is spaced apart from the one of the plurality of fin-type active regions FA and the plurality of source/drain regions 172, with the barrier ion implantation region BR arranged between the insulating ion implantation region IIP and the one of the plurality of fin-type active regions FA as well as one of the plurality of source/drain regions 172 adjacent to the insulating ion implantation region IIP. The barrier ion implantation region BR may be an impurity region of the same conductivity type as the conductivity type of the one of the plurality of fin-type active regions FA. The barrier ion implantation region BR may be an impurity region of a conductivity type opposite to a conductivity type of the plurality of source/drain regions 172.

In the integrated circuit device 100E, the fin isolation insulating film 128 of the fin isolation insulating unit 120E has an end filling the upper fin recess FR1, and the insulating ion implantation region IIP is in contact with the end of the fin isolation insulating film 128 at a bottom surface of the upper fin recess FRE For example, the insulating ion implantation region IIP is connected to the end of the fin isolation insulating film 128.

In the X direction, a width of the insulating ion implantation region IIP is greater than a width of the upper fin recess FRE Since the insulating ion implantation region IIP and the barrier ion implantation region BR are formed at a position lower than the bottom level LV1 of the upper fin recess FR1, portions of the insulating ion implantation region IIP and the barrier ion implantation region BR, which have a maximum total width along the X direction, are positioned at a level lower than the level corresponding to the first depth D1 from the top surface of one of the plurality of fin-type active regions FA. Therefore, even though the maximum total width of the insulating ion implantation region IIP and the barrier ion implantation region BR is increased, there may be no adverse effect on the plurality of source/drain regions 172. For example, any contact between the barrier ion implanting region BR and its adjacent source/drain region of the plurality of source/drain regions 172 may be avoided.

The integrated circuit devices 100A, 100B, 100C, 100D, or 100E described with reference to FIGS. 1 to 6B include the insulating cover 182 or 184, which extends to cover the device active region AC on both sides of the fin isolation region FS without covering the top surface of the fin isolation region FS, and the fin isolation insulating unit 120A, 120B, 120C, 120D, or 120E, which vertically extends from the inside of one of the plurality of fin-type active regions FA through the insulating cover 182 or 184. Even though including gate lines having limited line widths due to high down-scaling, the integrated circuit device 100A, 100B, 100C, 100D, or 100E according to the inventive concept has a structure in which each of the plurality source/drain contacts CA or CA3 and the fin isolation insulating unit 120A, 120B, 120C, 120D, or 120E are self-aligned by at least one of the plurality of insulating spacers 162 extending in a line shape to cover a sidewall of the gate line GL adjacent to each of the plurality source/drain contacts CA or CA3 and the fin isolation insulating unit 120A, 120B, 120C, 120D, or 120E. Therefore, the fin isolation insulating unit with a relatively small area for stable insulation may be provided in the formation of an insulation region between adjacent transistors, and the integrated circuit device may exhibit desired performance with a minimum area.

Figure 7A:
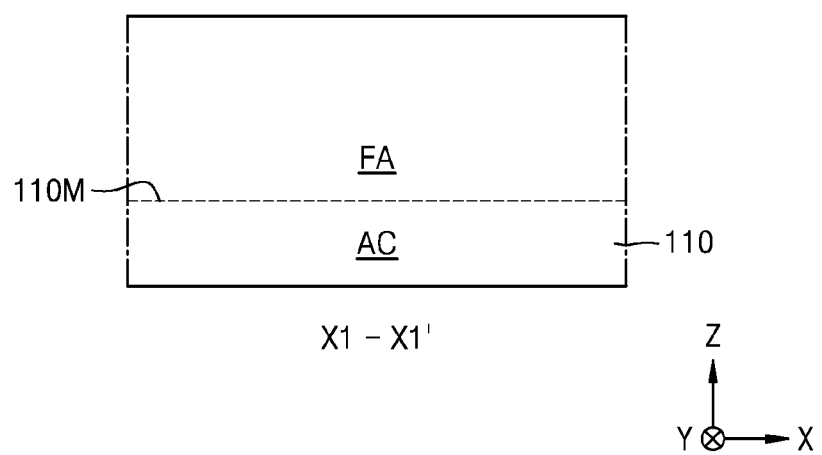
FIGS. 7A to 7S are cross-sectional views illustrating a method of fabricating an integrated circuit device, according to an exemplary embodiment of the present inventive concept.
Figure 7B:
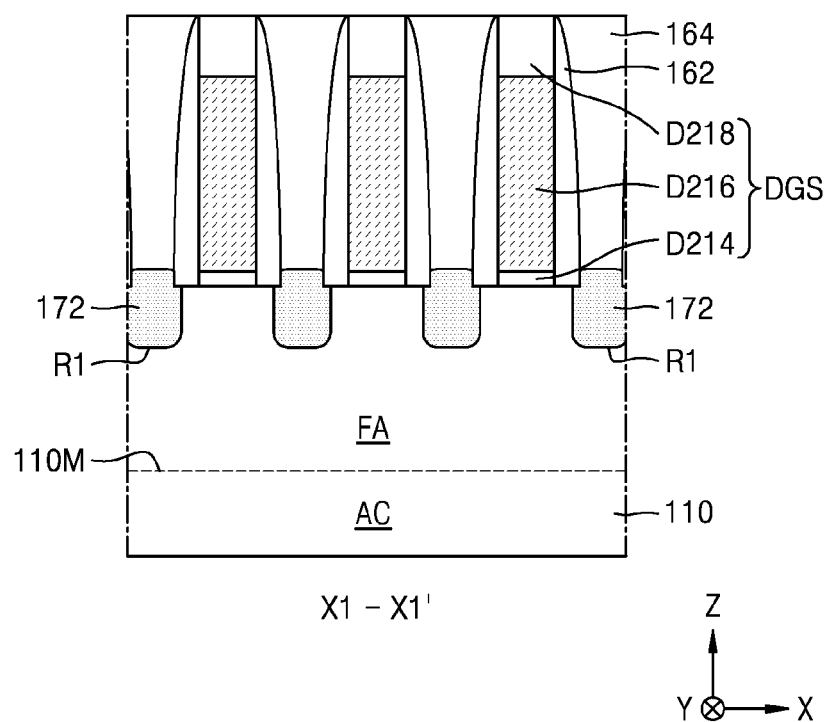
Figure 7C:
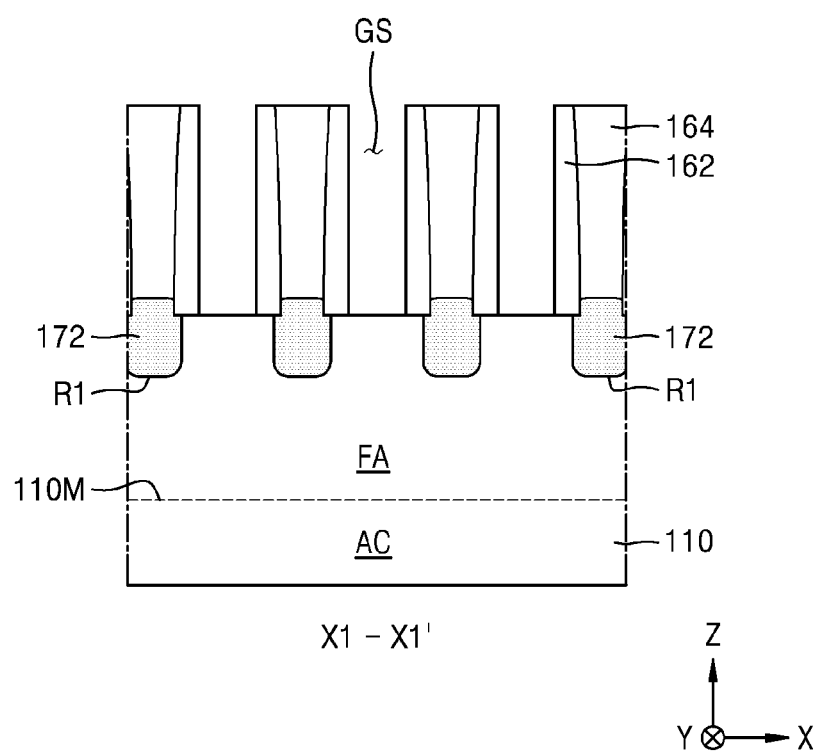
Figure 7D:
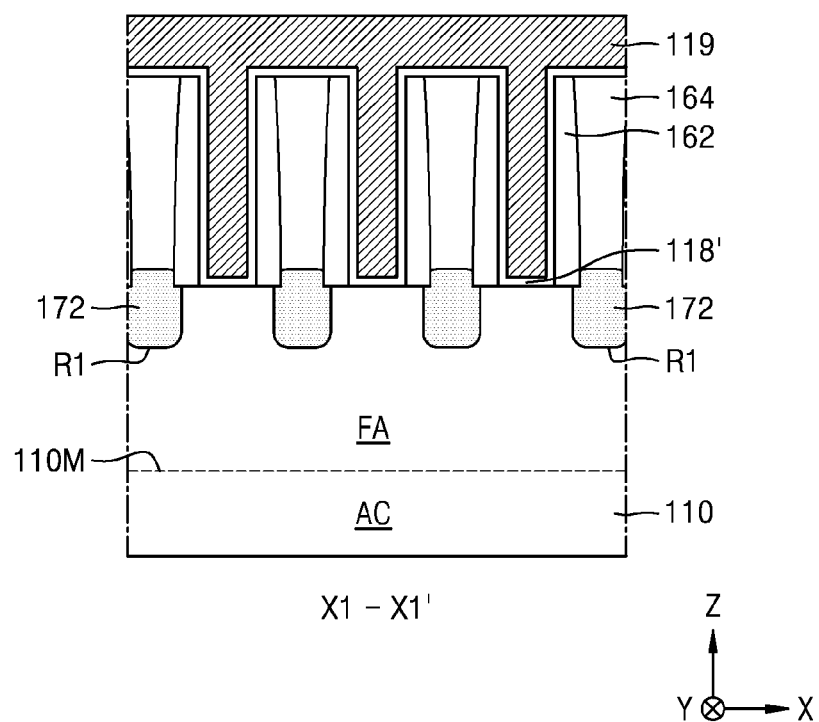
Figure 7E:
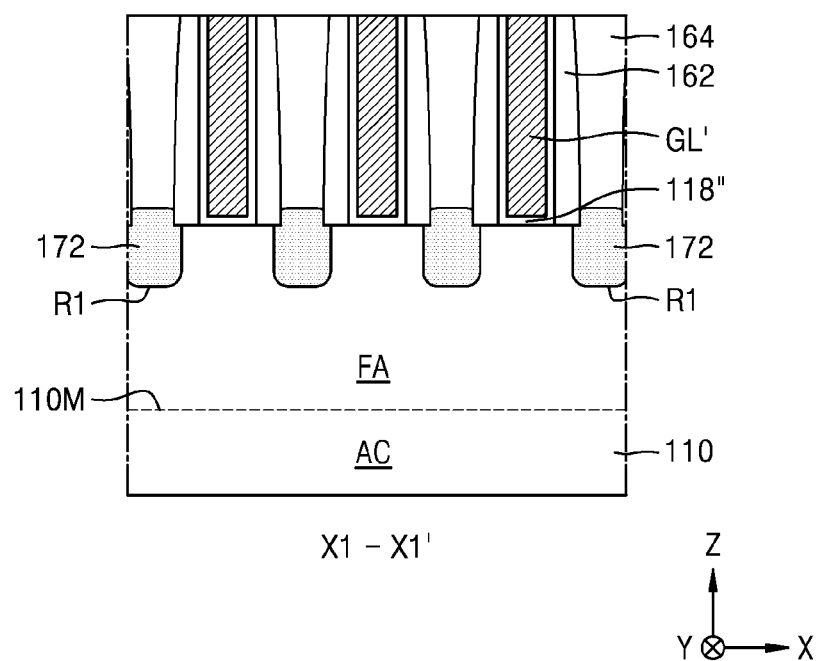
Figure 7F:
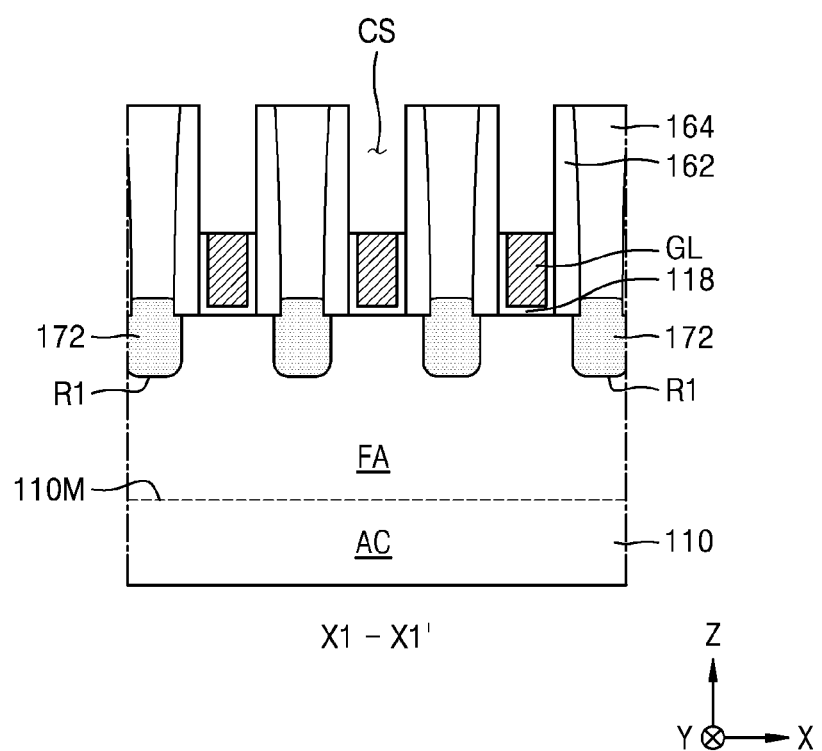
Figure 7G:
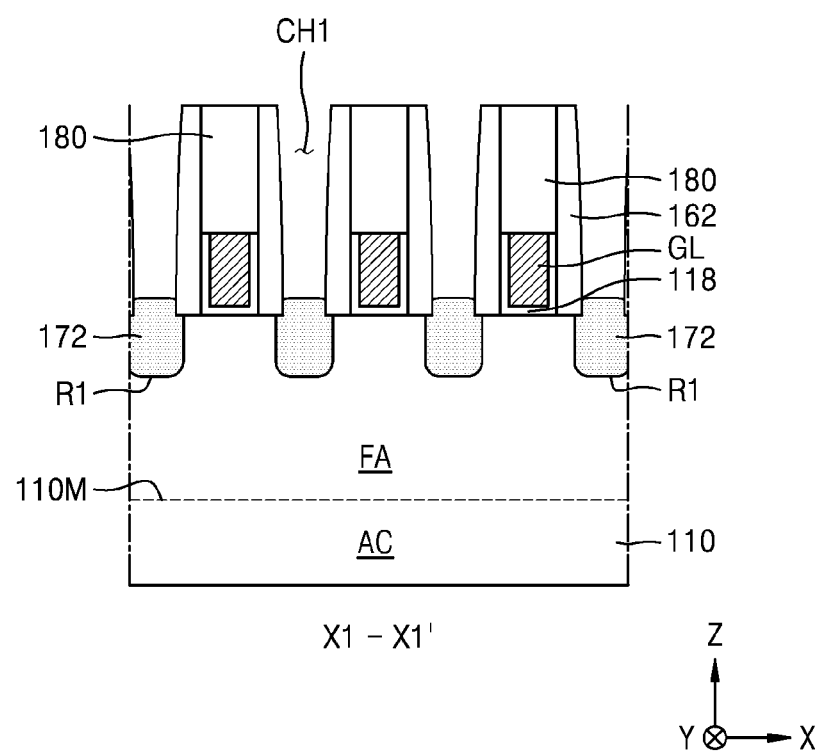
Figure 7H:
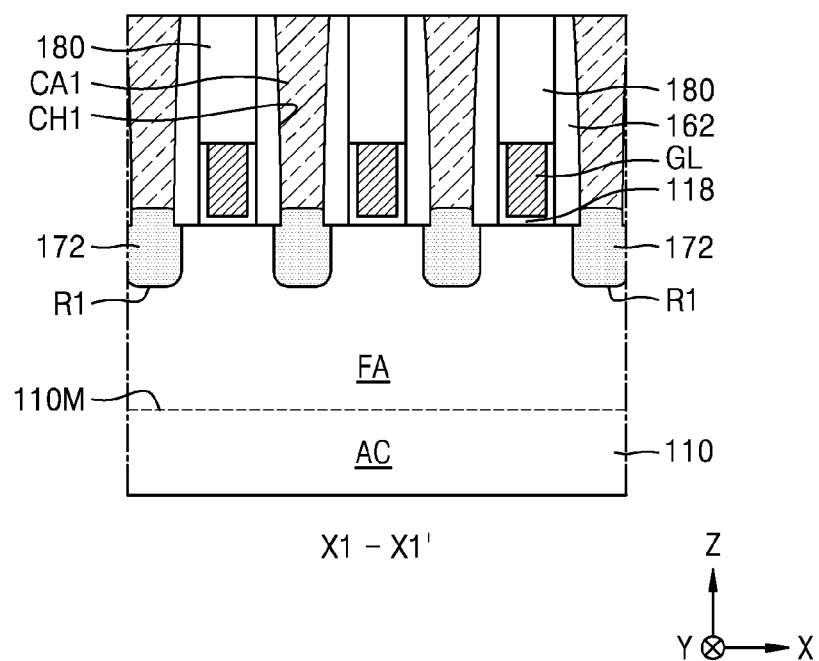
Figure 7I:
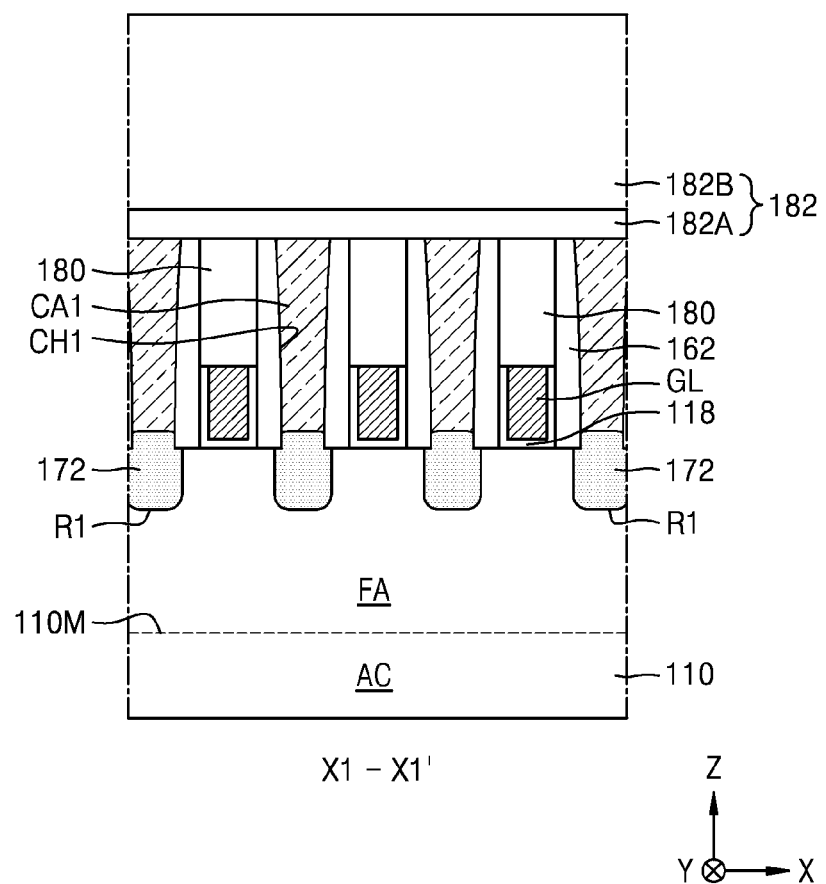
Figure 7J:
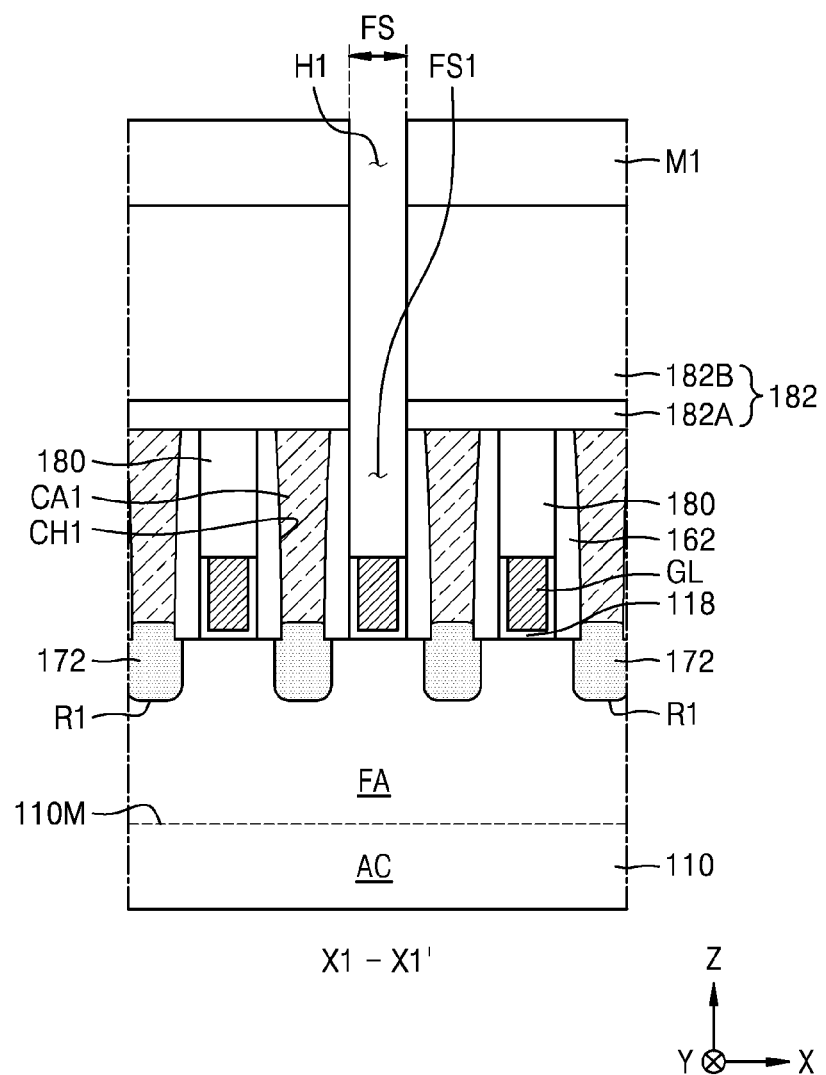
Figure 7K:
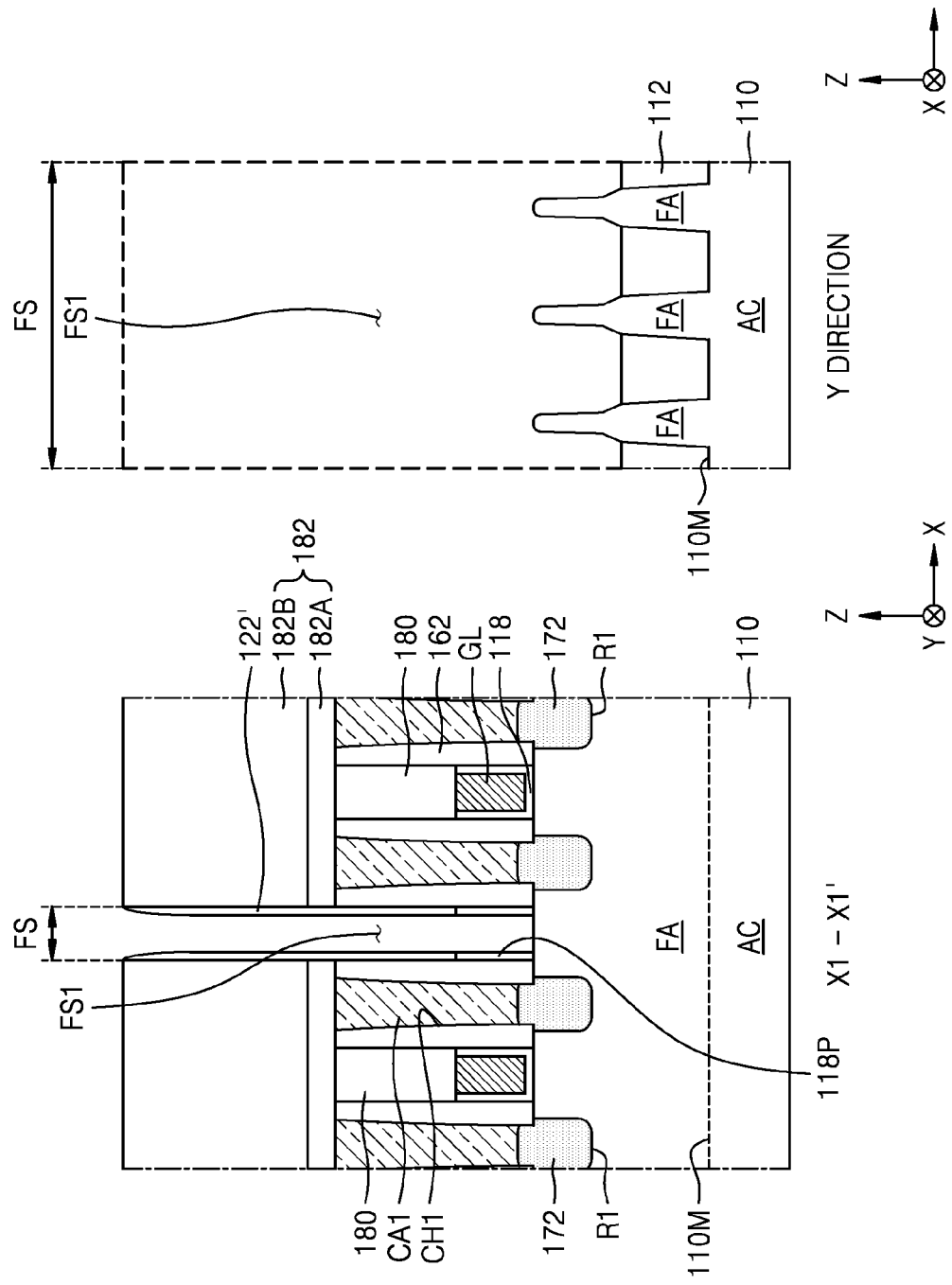
Figure 7L:
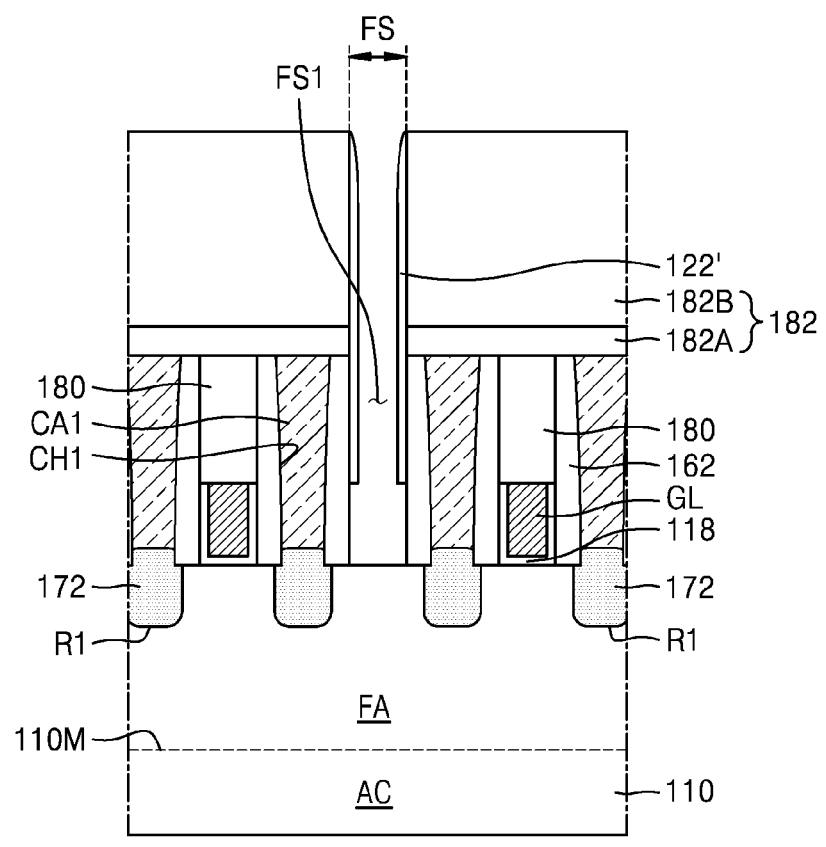
Figure 7M:
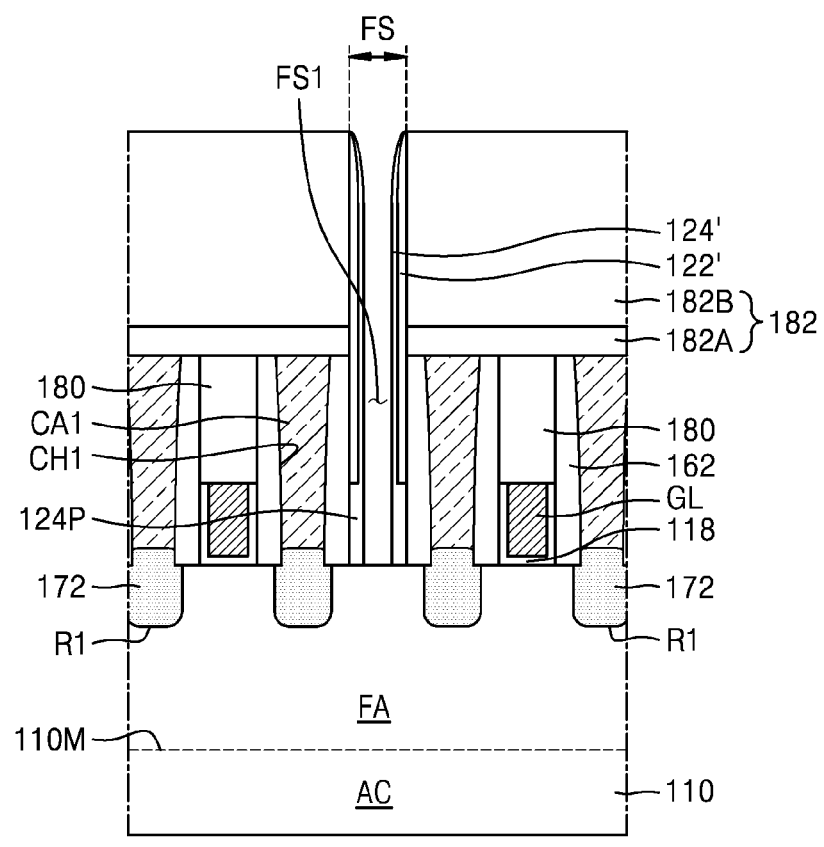
Figure 7N:
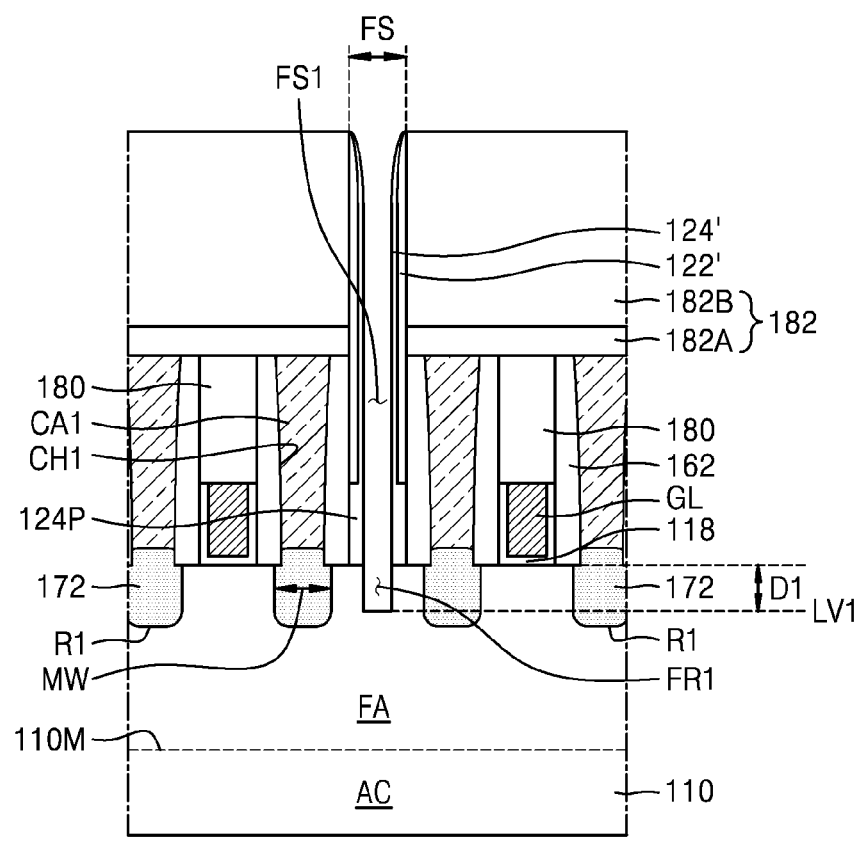
Figure 70:
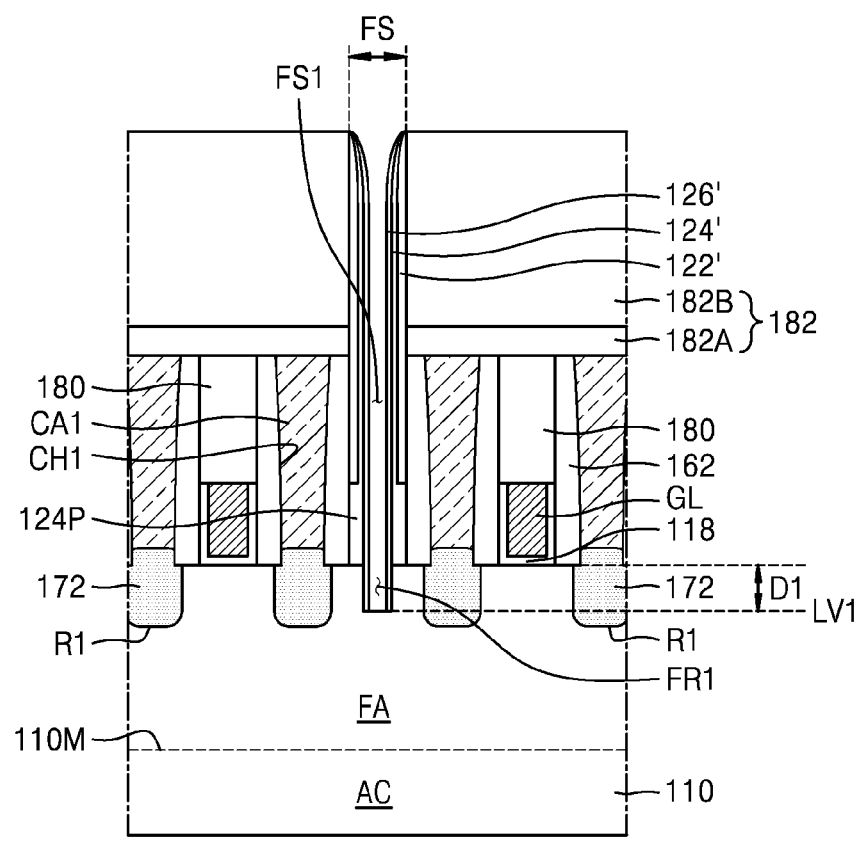
Figure 7P:
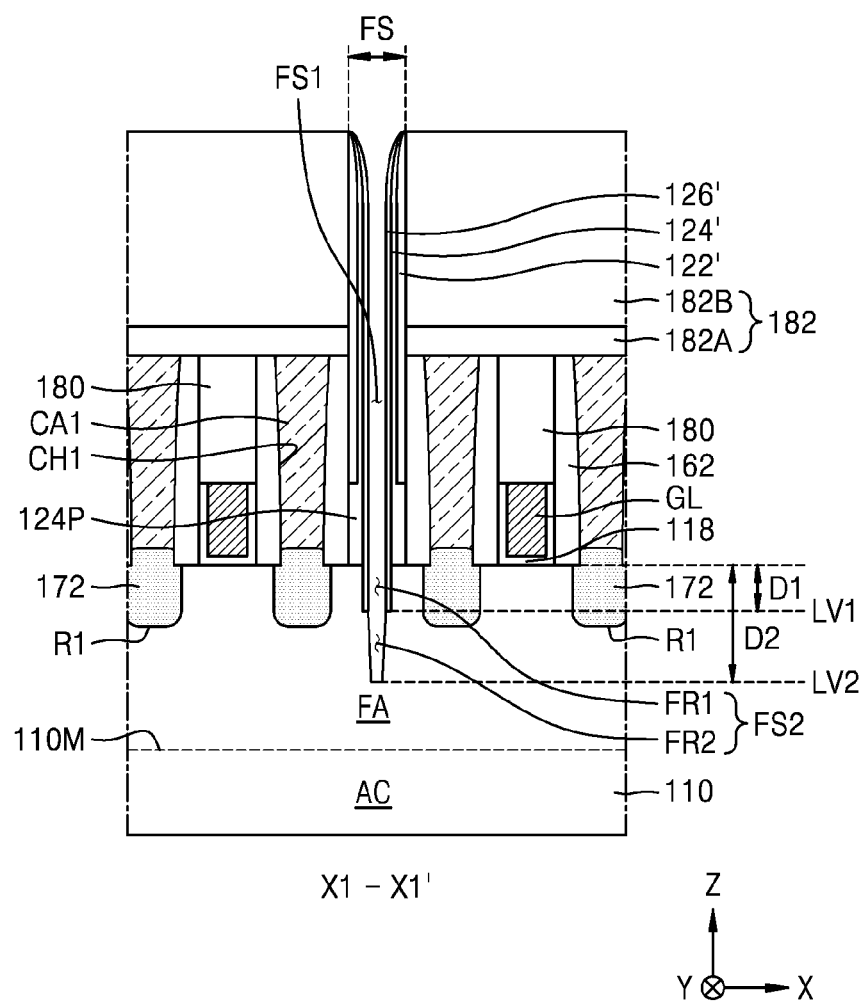
Figure 7Q:
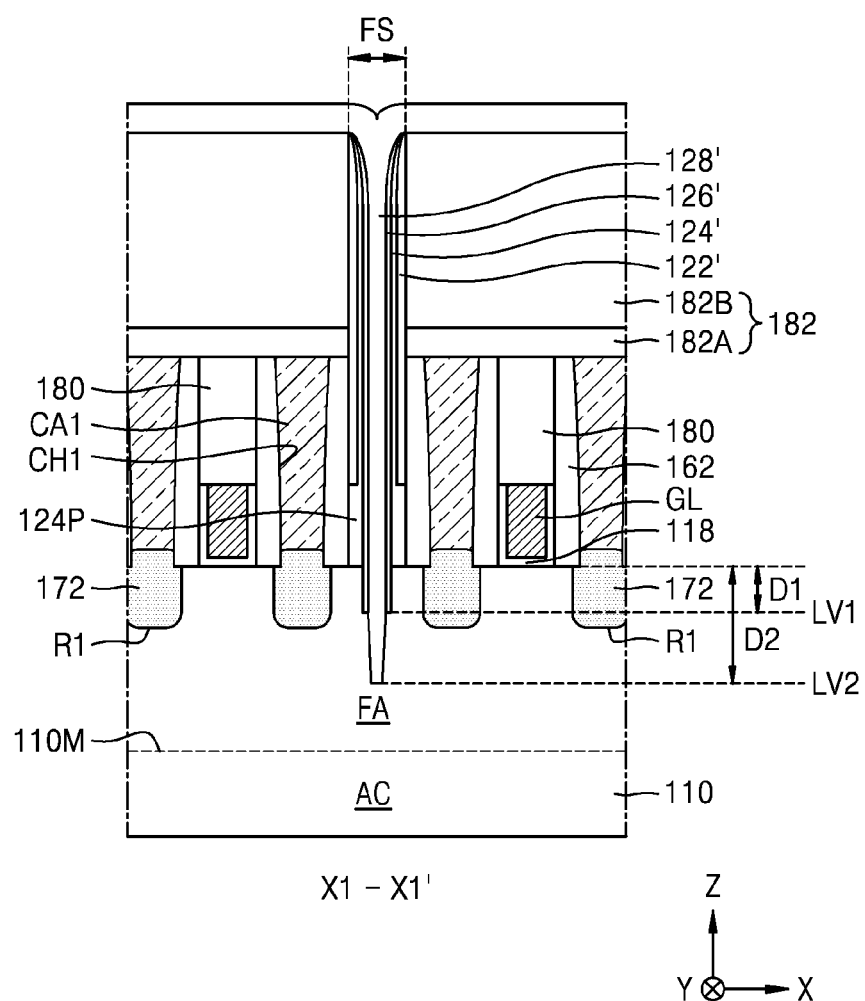
Figure 7R:
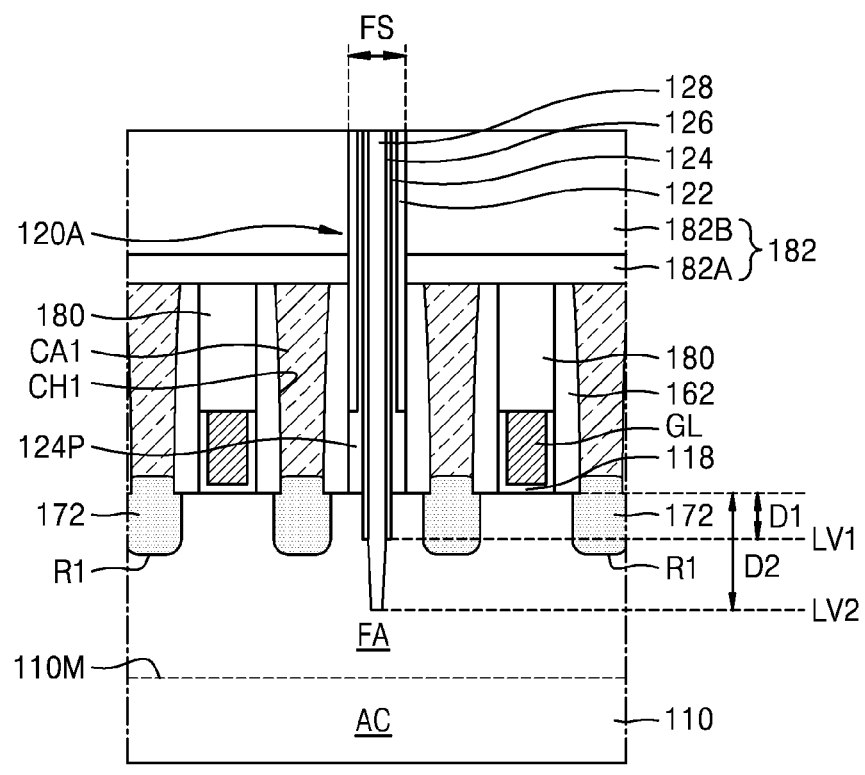
Figure 7S:
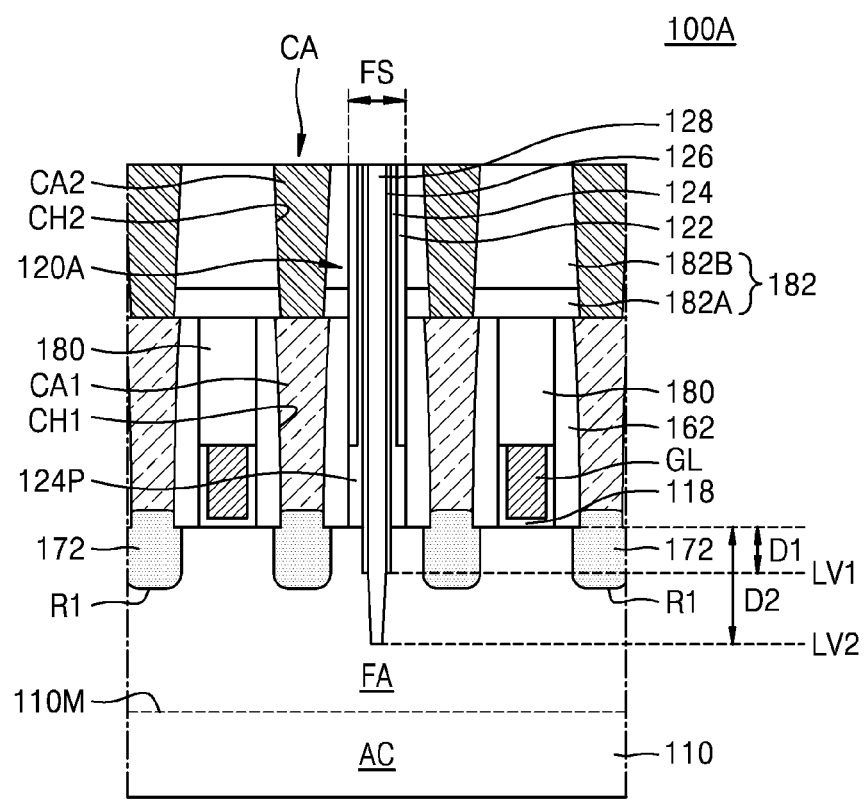

FIGS. 7A to 7S are cross-sectional views illustrating a method of fabricating an integrated circuit device, according to an exemplary embodiment. A method of fabricating the integrated circuit device 100A shown in FIGS. 2A to 2C will be described with reference to FIGS. 7A to 7S.

Referring to FIG. 7A, the device active region AC of the substrate 110 is partially etched, thereby forming the plurality of fin-type active regions FA, which protrude from the main surface 110M of the substrate 110 in an upward direction (Z direction) and extends in one direction (X direction). The plurality of fin-type active regions FA each has a cross-sectional shape in the Y direction as shown in FIG. 2C. The plurality of fin-type active regions FA each is spaced apart from another as shown in FIG. 1.

The isolation insulating film 112 (see FIG. 2C) is formed on the substrate 110 to cover both lower sidewalls of the plurality of fin-type active regions FA. The plurality of fin-type active regions FA each protrude upwards from the top surface of the isolation insulating film 112.

Referring to FIG. 7B, a plurality of dummy gate structures DGS are formed on one of the plurality of fin-type active regions FA. The plurality of dummy gate structures DGS each may extend to intersect the plurality of fin-type active regions FA in the Y direction. Each of the plurality of dummy gate structures DGS includes a dummy gate insulating film D214, a dummy gate line D216, and a dummy gate insulating capping layer D218, which are stacked on the one of the plurality of fin-type active regions FA in this stated order. The dummy gate insulating film D214 may include silicon oxide. The dummy gate line D216 may include polysilicon. The dummy gate insulating capping layer D218 may include silicon oxide, silicon nitride, or silicon oxynitride.

The plurality of insulating spacers 162 are formed on both sidewalls of each of the plurality of dummy gate structures DGS. The plurality of insulating spacers 162 may include a silicon nitride film, a SiOCN film, a SiCN film, or a combination thereof. In an exemplary embodiment, the plurality of insulating spacers 162 may each include a material film having a dielectric constant less than a silicon nitride film, for example, a SiOCN film, a SiCN film, or a combination thereof. In order to form the plurality of insulating spacers 162, an atomic layer deposition (ALD) or chemical vapor deposition (CVD) process may be used.

The plurality of recess regions R1 are formed by partially etching the plurality of fin-type active regions FA exposed on both sides of each of the plurality of dummy gate structures DGS. The plurality of source/drain regions 172 are formed by forming semiconductor layers on the plurality of recess regions R1 by an epitaxial growth process. The plurality of source/drain regions 172 have top surfaces at a level that is higher than that of the top surface of the one of the plurality of fin-type active regions FA. In an exemplary embodiment, the plurality of source/drain regions 172 may have top surfaces at a level that may be the same as that of the top surface of the one of the plurality of fin-type active regions FA.

The inter-gate dielectric 164 is formed to cover the plurality of source/drain regions 172, the plurality of dummy gate structures DGS, and the plurality of insulating spacers 162. In order to form the inter-gate dielectric 164, an insulating film having a thickness sufficient to cover a structure including the plurality of dummy gate structures DGS and the plurality of source/drain regions 172 may be formed, followed by planarizing the insulating film to expose a top surface of the dummy gate insulating capping layer D218.

Referring to FIG. 7C, the plurality of dummy gate structures DGS is removed from the resultant structure of FIG. 7B, thereby forming a plurality of gate spaces GS. The plurality of insulating spacers 162 and the plurality of fin-type active regions FA are exposed by the plurality of gate spaces GS. The plurality of gate spaces GS may further expose the isolation insulating film 112 (See, FIG. 2C).

In order to remove the plurality of dummy gate structures DGS, a wet etching process may be used. In order to perform the wet etching process, for example, an etching solution including $HNO_3$, diluted fluoric acid (DHF), $NH_4OH$, tetramethyl ammonium hydroxide (TMAH), KOH, or a combination thereof may be used.

Referring to FIG. 7D, a gate insulating film layer 118' and a gate conductive layer 119 are formed in the plurality of gate spaces GS (see FIG. 7C). Before forming the gate insulating film layer 118', an interfacial layer (not shown) may be further formed on a surface of the plurality of fin-type active regions FA exposed by the plurality of gate spaces GS. In order to form the interfacial layer, the plurality of fin-type active regions FA exposed by the plurality of gate spaces GS may be partially oxidized.

The gate insulating film layer 118' and the gate conductive layer 119 cover a top surface of the inter-gate dielectric 164 while filling the inside of each of the plurality of gate spaces GS. The gate insulating film layer 118' and the gate conductive layer 119 may be formed by an ALD, CVD, physical vapor deposition (PVD), a metal organic ALD (MOALD), or a metal organic CVD (MOCVD) process.

Referring to FIG. 7E, the gate insulating film layer 118' and the gate conductive layer 119 (see FIG. 7D) are partially removed such that the top surface of the inter-gate dielectric 164 is exposed, and a plurality of preliminary gate insulating films 118'' and a plurality of preliminary gate lines GL' remain only in the plurality of gate spaces GS.

Referring to FIG. 7F, the plurality of preliminary gate lines GL' and the plurality of preliminary gate insulating films 118'' are partially removed from a top portion thereof, thereby preparing a plurality of capping spaces CS over the plurality of gate lines GL and the plurality of gate insulating films 118.

Referring to FIG. 7G, in the resultant structure of FIG. 7F, the plurality of gate insulating capping layers 180 are formed to respectively fill the plurality of capping spaces CS. The plurality of gate insulating capping layers 180 may each include a silicon nitride film. Next, the inter-gate dielectric 164 may be etched by using a mask pattern (not shown), thereby forming a plurality of lower source/drain contact holes CH1 each exposing one of the plurality of source/drain regions 172. The plurality of lower source/drain contact holes CH1 may be self-aligned by the plurality of insulating spacers 162.

Referring to FIG. 7H, the lower source/drain contact CA1 is formed to fill one of the plurality of lower source/drain contact holes CH1. In order to form the lower source/drain contact CA1. a conductive layer may be formed on the plurality of gate insulating capping layers 180, filling the plurality of lower source/drain contact holes CH1. A chemical mechanical polishing (CMP) or an etch-back process may be followed such that the conductive layer remains only in the plurality of lower source/drain contact holes CH1. The lower source/drain contact CA1 may be self-aligned by the plurality of insulating spacers 162. In an exemplary embodiment, a metal silicide film (not shown) may be arranged between the plurality of source/drain regions 172 and the lower source/drain contact CA1.

Referring to FIG. 7I, the insulating cover 182 is formed to simultaneously cover the plurality of gate insulating capping layers 180, the plurality of gate insulating films 118, the lower source/drain contact CA1. and the inter-gate dielectric 164. The insulating cover 182 includes the first insulating cover 182A and the second insulating cover 182B, which may include different materials from each other. For example, the first insulating cover 182A may include a silicon nitride film, and the second insulating cover 182B may include a silicon oxide film.

Referring to FIG. 7J, a mask pattern M1, in which a hole H1 corresponding to the fin isolation region FS is formed on the insulating cover 182, followed by etching the insulating cover 182 and a gate insulating capping layer 180, which are exposed by the hole H1, by using the mask pattern M1 as an etch mask, thereby forming a fin outside isolation space FS1, which exposes a top surface of one of the plurality of gate lines GL selected from among the plurality of gate lines GL and a top surface of one of the plurality of gate insulating films 118 covering the sidewall of the one of the plurality of gate lines GL. The fin outside isolation space FS1 may be etched in the manner of being self-aligned by the plurality of insulating spacers 162, one of which covers both sidewalls of the one of the plurality of gate lines GL. In the fin outside isolation space FS1, sidewalls of two insulating spacers of the plurality of insulating spacers 162, a sidewall of the first insulating cover 182A, and a sidewall of the second insulating cover 182B are exposed.

The mask pattern M1 may include a material having etch selectivity with respect to the insulating cover 182 and the plurality of gate insulating capping layers 180. For example, the mask pattern M1 may include a spin-on-hardmask (SOH) film, a photoresist film, or a combination thereof, without being limited thereto.

Referring to FIG. 7K, the mask pattern M1 is removed, followed by forming a preliminary first fin isolation spacer 122' on an inner sidewall of the fin outside isolation space FS1. The preliminary first fin isolation spacer 122' is formed on a portion 118P of the one of the plurality of gate insulating films 118 to cover the sidewalls of the two insulating spacers of the plurality of insulating spacers 162, the sidewall of the first insulating cover 182A, and the sidewall of the second insulating cover 182B. The portion 118P of the one of the plurality of gate insulating films 118 may remain after the formation of the fin outside isolation space FS1. Next, the one of the plurality of gate lines GL is removed through the fin outside isolation space FS1 by an anisotropic dry etching process, and the one of the plurality of gate insulating films 118 is then partially removed, thereby forming the portion 118P and exposing the top portion of one of the plurality of fin-type active regions FA. After the top portion of the one of the plurality of fin-type active regions FA is exposed, the portion 118P of the one of the plurality of gate insulating films 118, which covers the insulating spacer 162, is exposed by the fin outside isolation space FS1.

FIG. 7K also illustrates a cross-sectional view of the one of the plurality of fin-type active regions FA and the fin outside isolation space FS1 in the fin isolation region FS, along the Y direction, after the one of the plurality of gate lines GL is removed. After the one of the plurality of gate lines GL is removed, a depth of the fin outside isolation space FS1 is increased, whereby the top portion of the one of the plurality of fin-type active regions FA and the top surface of the one of the plurality of isolation insulating films 112 are exposed in the fin outside isolation space FS1.

Referring to FIG. 7L, the portion 118P of the one of the plurality of gate insulating films 118 exposed in the fin outside isolation space FS1 is removed, thereby exposing the two insulating spacers of the plurality of insulating spacers 162 in the fin outside isolation space FS1. In order to remove the portion 118P of the one of the plurality of gate insulating films 118, a wet etching process may be used.

Referring to FIG. 7M, a preliminary second fin isolation spacer 124' is formed to cover a sidewall of the preliminary first fin isolation spacer 122' and the sidewalls of the two insulating spacers of the plurality of insulating spacers 162 are exposed in the fin outside isolation space FS1. The preliminary second fin isolation spacer 124' includes the protrusion 124P under the preliminary first fin isolation spacer 122', the protrusion 124P protruding toward an outside of the fin outside isolation space FS1. In an exemplary embodiment, the preliminary second fin isolation spacer 124' may include a silicon nitride film. In an exemplary embodiment, the process of forming the preliminary second fin isolation spacer 124' may be omitted.

Referring to FIG. 7N, the one of the plurality of fin-type active regions FA exposed by the fin outside isolation space FS1 is etched by using the second insulating cover 182B, the preliminary first fin isolation spacer 122', and the preliminary second fin isolation spacer 124' as an etch mask, thereby forming the upper fin recess FR1 having the first depth D1 from the top surface of the one of the plurality of fin-type active regions FA. A sidewall of the upper fin recess 1-R1 may be self-aligned with a sidewall of the preliminary second fin isolation spacer 124'.

The upper fin recess FR1 extends lower than the level of the portion of the source/drain region 172, which has the maximum width MW in the X direction, that is, the length direction of the one of the plurality of fin-type active regions FA, and thus, the bottom level LV1 of the upper fin recess FR1 may be closer to the substrate 110 than the maximum-width MW portion of the source/drain region 172.

Referring to FIG. 7O, a preliminary third fin isolation spacer 126' is formed in the fin outside isolation space FS1 and the upper fin recess FRE The preliminary third fin isolation spacer 126' covers the sidewall of the preliminary second fin isolation spacer 124' and the sidewall of the upper fin recess FRE If the process of forming the preliminary second fin isolation spacer 124' is omitted, the third fin isolation spacer 126 may be formed directly on the preliminary first fin isolation spacer 122' and the two insulating spacers of the plurality of insulating spacers 162. The third fin isolation spacer 126 may include a silicon nitride film.

Referring to FIG. 7P, the one of the plurality of fin-type active regions FA exposed at the bottom surface of the upper fin recess FR1 is etched by using the the second insulating cover 182B, the preliminary first fin isolation spacer 122', the preliminary second fin isolation spacer 124', and the preliminary third fin isolation spacer 126' as an etch mask, thereby forming the lower fin recess FR2 having a bottom level LV2 corresponding to a second depth D2 greater than the first depth D1 from the top surface of the one of the plurality of fin-type active regions FA. A sidewall of the lower fin recess 1-R2 may be self-aligned with a sidewall of the preliminary third fin isolation spacer 126'.

The lower fin recess FR2 communicates with the upper fin recess FR1 and has a smaller width in the X direction than the upper fin recess FRE For example, the lower fin recess FR2 is connected to the upper fin recess FRE The lower fin recess FR2 and the upper fin recess FR1 constitutes the fin inside isolation space FS2.

Referring to FIG. 7Q, a preliminary fin isolation insulating film 128' is formed to fill the fin inside isolation space FS2 and the fin outside isolation space FS1 (see FIG. 7P). The preliminary fin isolation insulating film 128' is also formed on a top surface of the second insulating cover 182B.

The preliminary fin isolation insulating film 128' may include a silicon oxide film, a silicon nitride film, or a combination thereof. In an exemplary embodiment, the preliminary fin isolation insulating film 128' may include only a silicon nitride film. In an exemplary embodiment, to form the preliminary fin isolation insulating film 128', first, a silicon oxide film may be formed to cover inner walls of the fin inside isolation space FS2 and the fin outside isolation space FS1, followed by forming a silicon nitride film on the silicon oxide film to fill remaining spaces of the fin inside isolation space FS2 and the fin outside isolation space FS1. In order to form the preliminary fin isolation insulating film 128', an ALD or CVD process may be used.

Referring to FIG. 7R, a planarization process is performed on a top surface of the preliminary fin isolation insulating film 128' and the second insulating cover 182B such that a portion of the preliminary fin isolation insulating film 128', which covers the top surface of the second insulating cover 182B, is removed, thereby forming the fin isolation insulating film 128 only in the fin inside isolation space FS2 and the fin outside isolation space FS1. Here, each of the second insulating cover 182B, the preliminary first fin isolation spacer 122', the preliminary second fin isolation spacer 124', and the preliminary third fin isolation spacer 126' has a reduced height so that the first fin isolation spacer 122, the second fin isolation spacer 124, and the third fin isolation spacer 126 are formed. The first fin isolation spacer 122, the second fin isolation spacer 124, the third fin isolation spacer 126, and the fin isolation insulating film 128, which remain in the fin isolation region FS, constitute the fin isolation insulating unit 120A. The second insulating cover 182B and the fin isolation insulating unit 120A have top surfaces planarized to extend on the same plane.

Referring to FIG. 7S, the second insulating cover 182B and the first insulating cover 182A are etched in this stated order by a photolithography process, thereby forming a plurality of upper source/drain contact holes CH2, which respectively expose the lower source/drain contact CA1. During the formation of the plurality of upper source/drain contact holes CH2, the second insulating cover 182B may be etched by using the first insulating cover 182A as an etch stop layer, followed by etching the first insulating cover 182A to form the plurality of upper source/drain contact holes CH2, thereby exposing top surfaces of the lower source/drain contact CA1.

Next, the upper source/drain contact CA2 are formed to respectively fill the plurality of upper source/drain contact holes CH2. The upper source/drain contact CA2 is connected to the lower source/drain contact CA1. The lower source/drain contact CA1 and the upper source/drain contact CA2 constitute a source/drain contact CA.

During the formation of the upper source/drain contact CA2, the plurality of gate contacts CB shown in FIGS. 2B and 2C may be simultaneously formed. For example, during the formation of the plurality of upper source/drain contact holes CH2, the second insulating cover 182B, the first insulating cover 182A, and the gate insulating capping layer 180 may be etched in this stated order, thereby forming the plurality of gate contact holes CH3 (see FIGS. 2B and 2C), which exposes top surfaces of the plurality of gate lines GL. In addition, during the formation of the upper source/drain contact CA2, the plurality of gate contacts CB may be respectively formed in the plurality of gate contact holes CH3. The plurality of gate contacts CB may include the same material as the upper source/drain contact CA2.

According to the method of fabricating the integrated circuit device 100A, which has been described with reference to FIGS. 7A to 7S, after the plurality of gate lines GL and the lower source/drain contact CA1 are formed, the fin isolation insulating unit 120A is formed on the plurality of fin-type active regions FA to extend parallel to the plurality of gate lines GL. For example, since the fin isolation insulating unit 120A is formed on the plurality of fin-type active regions FA, after the plurality of gate lines GL and the lower source/drain contact CA1 are formed over the one of the plurality of fin-type active regions FA, a stress concentration of a compressive stress, for example, on the plurality of fin-type active regions FA around the fin isolation insulating unit 120A may be suppressed. Thus, problems due to electrical deterioration, such as a problem in which threshold voltages of transistors adjacent to the fin isolation region FS among a plurality of transistors formed on the plurality of fin-type active regions FA vary depending upon distances from the fin isolation insulating unit 120A, may be solved. Therefore, according to the method of fabricating the integrated circuit device 100A, which has been described with reference to FIGS. 7A to 7S, an electrical characteristic deviation in a highly down-scaled integrated circuit device due to such a complicated structure thereof may be suppressed, and the reliability of the integrated circuit device may be increased.

Although the method of fabricating the integrated circuit device 100A having a structure, in which the top surface of the fin isolation insulating unit 120A is at the same level as the top surfaces of the plurality of source/drain contacts CA and the top surfaces of the plurality of gate contacts CB, has been described with reference to FIGS. 7A to 7S, integrated circuit devices according to various embodiments of the inventive concept may be fabricated based on the descriptions made with reference to FIGS. 7A to 7S.

Figure 8A:
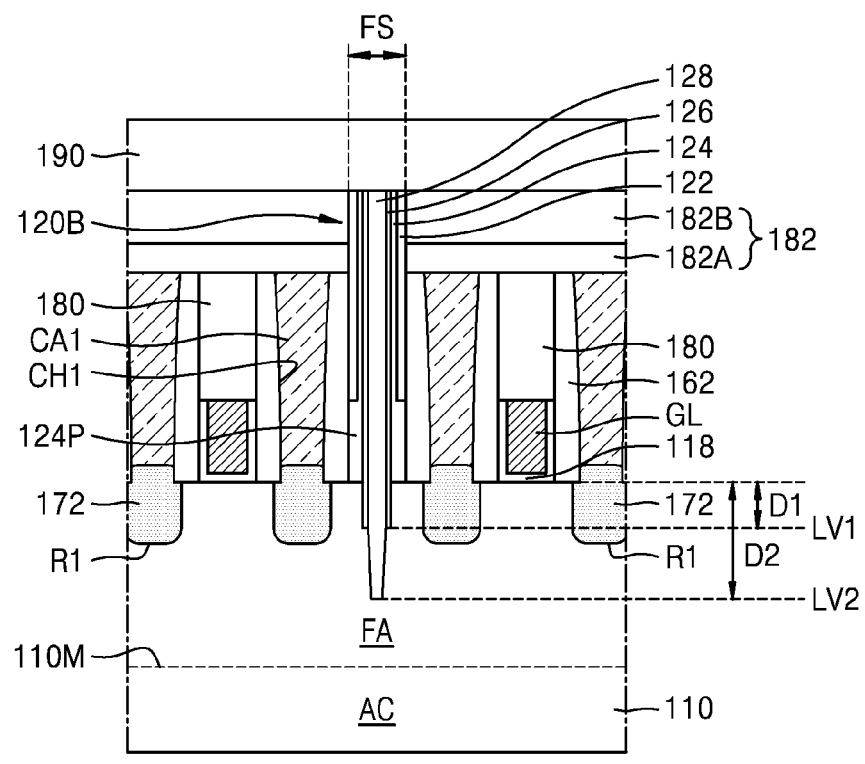
FIGS. 8A and 8B are cross-sectional views illustrating a method of fabricating an integrated circuit device, according to an exemplary embodiment of the present inventive concept.
Figure 8B:
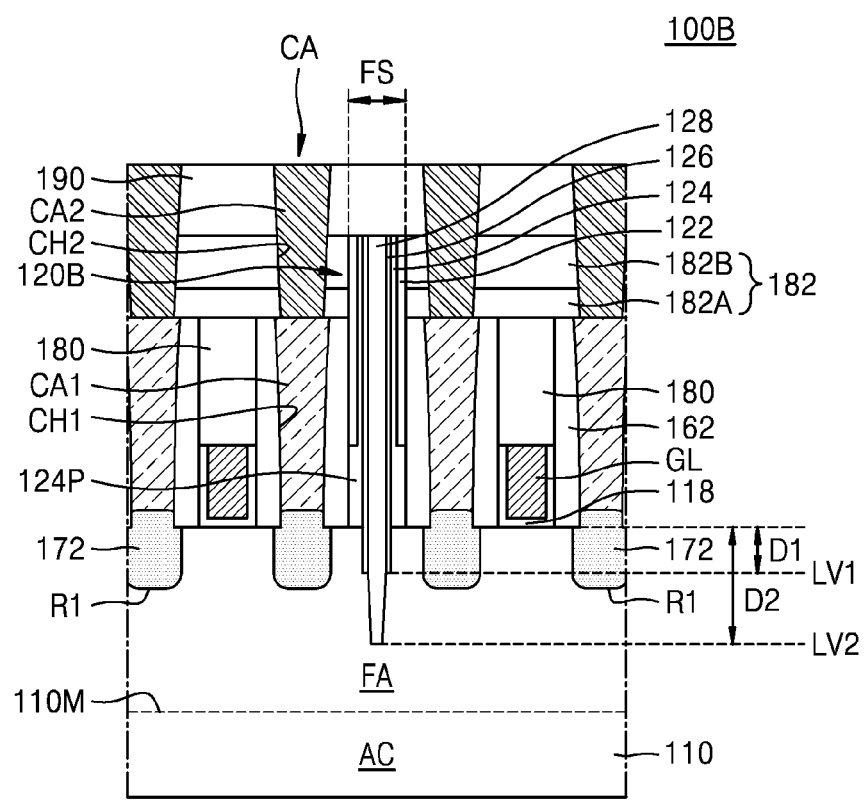

FIGS. 8A and 8B are cross-sectional views illustrating a method of fabricating an integrated circuit device, according to an exemplary embodiment. A method of fabricating the integrated circuit device 100B shown in FIGS. 3A and 3B will be described with reference to FIGS. 8A and 8B.

Referring to FIG. 8A, the processes described with reference to FIGS. 7A to 7R are performed. However, the planarization process is performed up to a level lower than the level of the top surface of the fin isolation insulating unit 120A and the top surface of the second insulating cover 182B shown in FIG. 7R, thereby forming the fin isolation insulating unit 120B having a smaller height than the fin isolation insulating unit 120A. Next, the upper insulating film 190 is formed to cover the fin isolation insulating unit 120B and the second insulating cover 182B.

Referring to FIG. 8B, the plurality of upper source/drain contact holes CH2, which respectively exposes the lower source/drain contact CA1, are formed by etching the upper insulating film 190, the second insulating cover 182B, and the first insulating cover 182A in this stated order by a photolithography process, followed by forming the upper source/drain contact CA2, which respectively fills the plurality of upper source/drain contact holes CH2. The plurality of gate contact holes CH3 shown in FIG. 3B may be formed during the formation of the plurality of upper source/drain contact holes CH2, and the plurality of gate contacts CB shown in FIG. 3B may be formed during the formation of the upper source/drain contact CA2.

FIGS. 9A to 9E are cross-sectional views illustrating a method of fabricating an integrated circuit device, according to an exemplary embodiment. A method of fabricating the integrated circuit device 100C shown in FIG. 4 will be described with reference to FIGS. 9A to 9E.

Figure 9A:
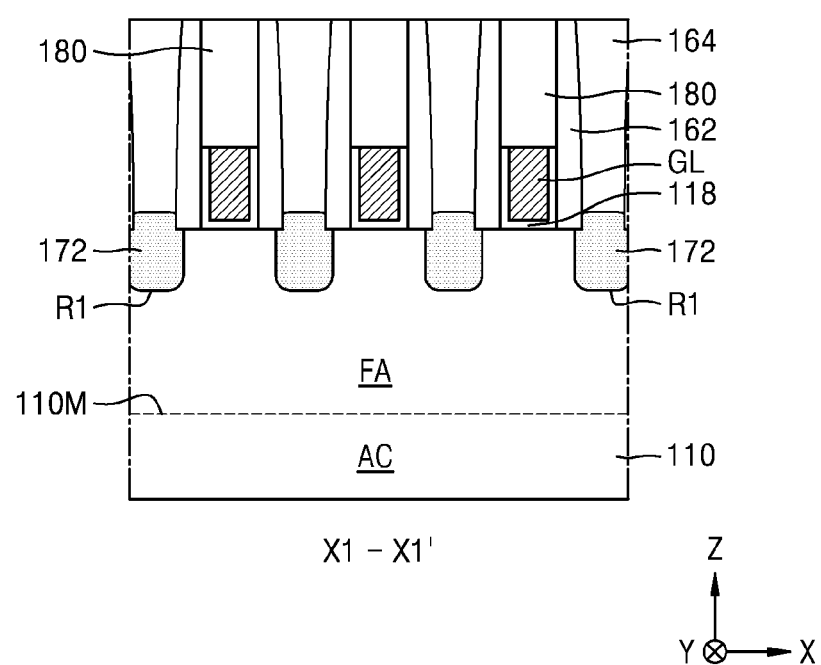
FIGS. 9A to 9E are cross-sectional views illustrating a method of fabricating an integrated circuit device, according to an exemplary embodiment of the present inventive concept.

Referring to FIG. 9A, the plurality of gate insulating capping layers 180 are formed to respectively fill the plurality of capping spaces CS formed after the process described with reference to FIGS. 7A to 7F.

Figure 9B:
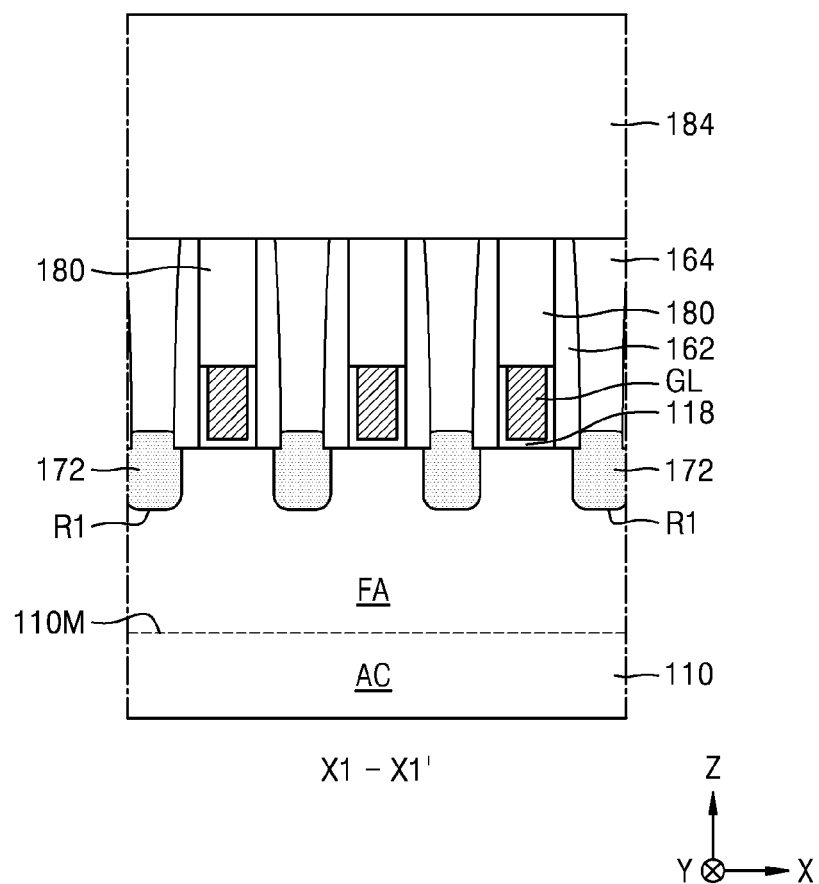

Referring to FIG. 9B, the insulating cover 184 is formed to simultaneously cover the plurality of gate insulating capping layers 180, the plurality of gate insulating films 118, and the inter-gate dielectric 164. The insulating cover 184 may include a single layer. In an exemplary embodiment, the insulating cover 184 may include silicon oxide.

Figure 9C:
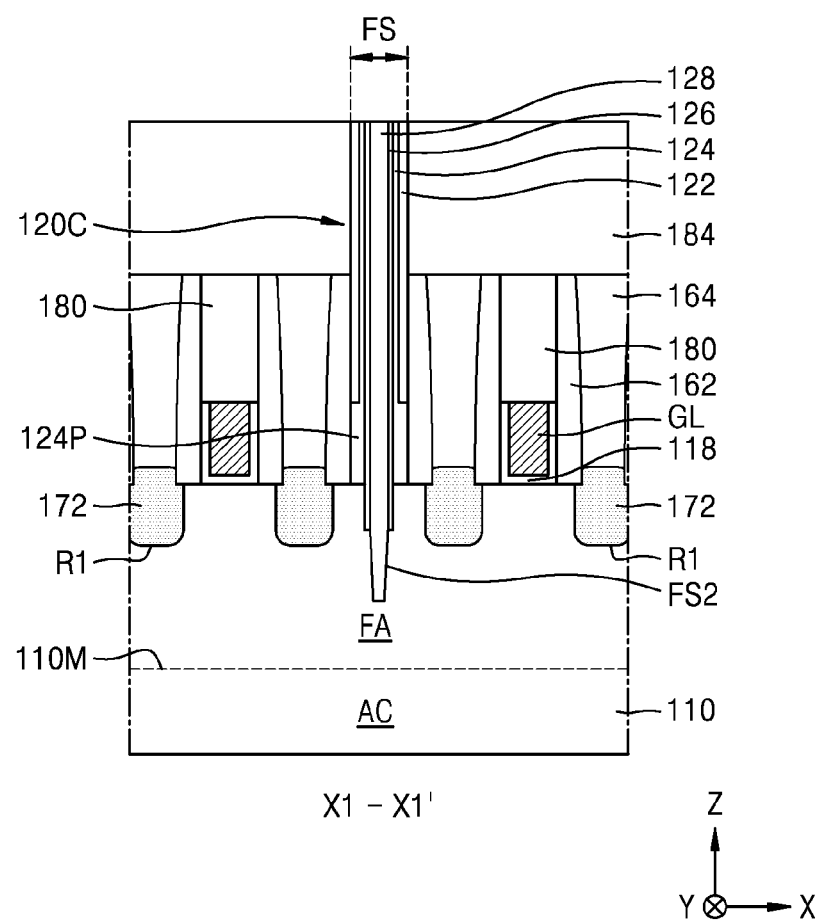

Referring to FIG. 9C, in a similar method to the process of forming the fin isolation insulating unit 120A, which has been described with reference to FIGS. 7J to 7R, the fin isolation insulating unit 120C is formed to be self-aligned by the plurality of insulating spacers 162 covering the sidewall of each of the plurality of gate lines GL adjacent to the fin isolation region FS. The fin isolation insulating unit 120C has an end filling the fin inside isolation space FS2 in one of the plurality of fin-type active regions FA and extend to the top surface of the insulating cover 184 through the insulating cover 184.

Figure 9D:
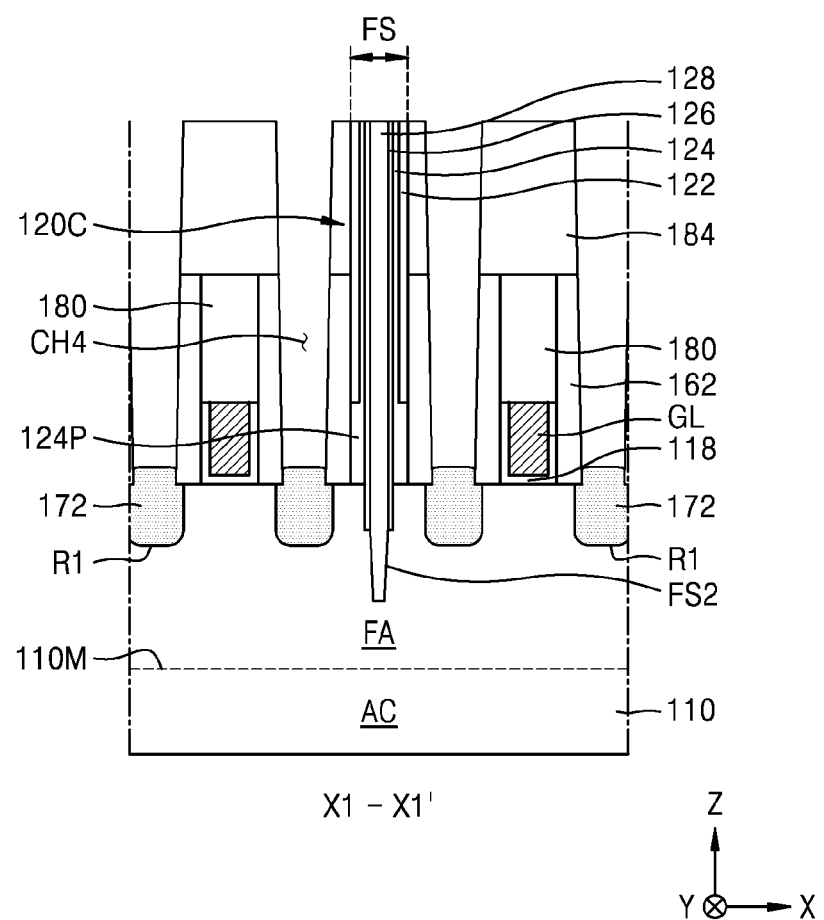

Referring to FIG. 9D, the insulating cover 184 and the inter-gate dielectric 164 are etched in this stated order by a photolithography process, thereby forming a plurality of source/drain contact holes CH4, which respectively exposes the plurality of source/drain regions 172. During the formation of the plurality of source/drain contact holes CH4, at least one gate contact hole (not shown) may be simultaneously formed to be connected to one of the plurality of gate lines GL. For example, during the formation of the plurality of source/drain contact holes CH4, the insulating cover 184 and the gate insulating capping layer 180 may be etched in this stated order, thereby forming the at least one gate contact hole (not shown), which exposes the top surface of the plurality of gate lines GL.

Figure 9E:
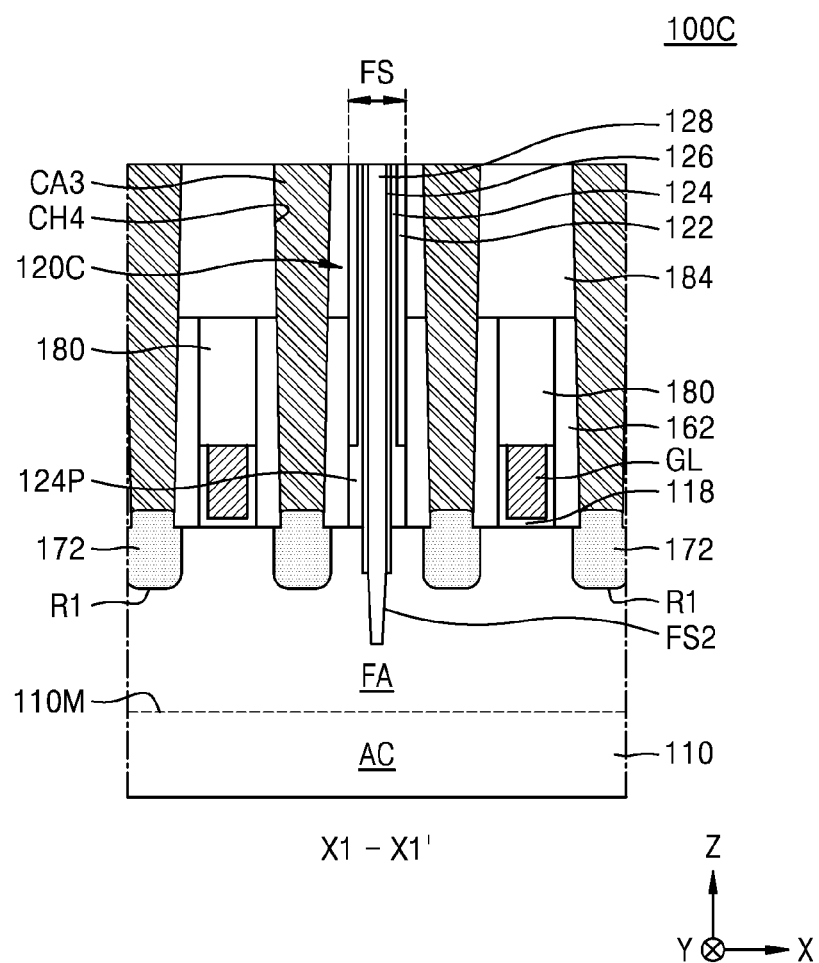

Referring to FIG. 9E, the plurality of source/drain contacts CA3 are formed to respectively fill the plurality of source/drain contact holes CH4. The plurality of source/drain contacts CA3 each is connected to one of the plurality of source/drain regions 172. During the formation of the plurality of source/drain contacts CA3, a gate contact (not shown) may be formed in the at least one gate contact hole described above. The gate contact may include the same material as the plurality of source/drain contacts CA3.

Although the method of fabricating the integrated circuit device 100C having a structure, in which a top surface of the fin isolation insulating unit 120C and the top surfaces of the source/drain contacts CA3 are on the same plane, has been described, various modifications and changes may be made therefrom. For example, similarly to the descriptions made with reference to FIGS. 8A and 8B, before forming the source/drain contacts CA3, the upper insulating film 190 may be formed to cover the fin isolation insulating unit 120C and the insulating cover 184, the plurality of source/drain contact holes CH4 may be formed to respectively expose the plurality of source/drain regions 172 by etching the upper insulating film 190, the insulating cover 184, and the inter-gate dielectric 164 in this stated order, and the plurality of source/drain contacts CA3 may be formed to respectively fill the plurality of source/drain contact holes CH4. In this way, an integrated circuit having a structure, in which the fin isolation insulating unit 120C penetrates the insulating cover 184 at a higher level than the gate insulating capping layer 180 covering the plurality of gate lines GL, and in which the top surface of the fin isolation insulating unit 120C and the top surface of the insulating cover 184 extend on the same plane, may be obtained. In this case, the plurality of source/drain contacts CA3 in the integrated circuit device may have a structure protruding from the top surface of the insulating cover 184 in an opposite direction to the substrate 110.

Figure 10B:
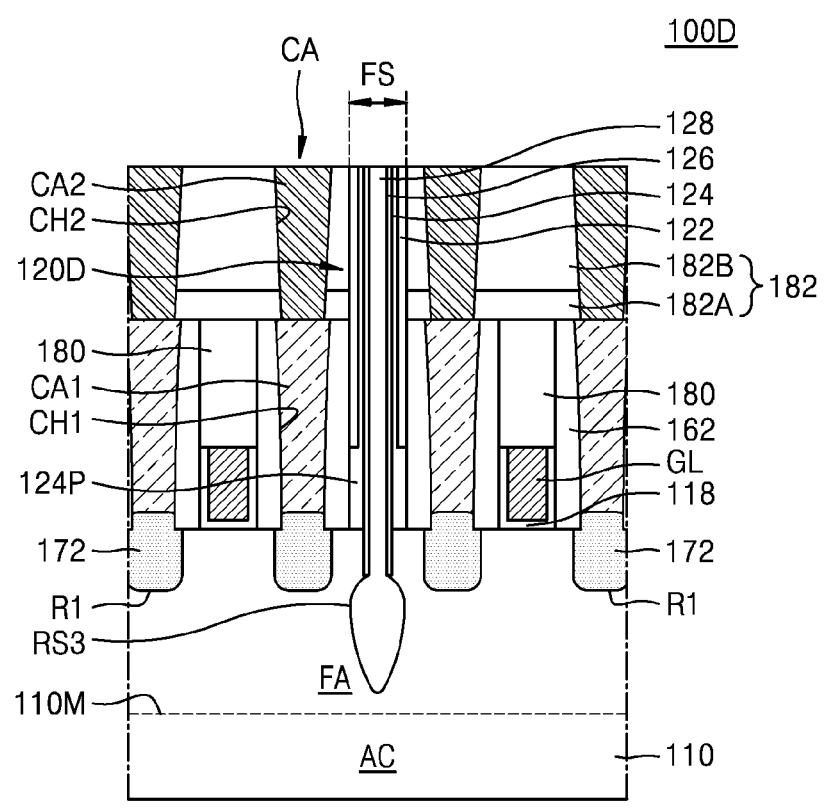

FIGS. 10A and 10B are cross-sectional views illustrating a method of fabricating an integrated circuit device, according to an exemplary embodiment. A method of fabricating the integrated circuit device 100D shown in FIGS. 5A and 5B will be described with reference to FIGS. 10A and 10B.

Referring to FIG. 10A, a first fin etching process for forming the upper fin recess FR1 having the first depth D1 from the top surface of the one of the plurality of fin-type active regions FA is performed using the processes described with reference to FIGS. 7A to 7N, followed by performing up to the process of forming the preliminary third fin isolation spacer 126' in the fin outside isolation space FS1 and the upper fin recess FR1 as described with reference to FIG. 7O. The first fin etching process may be an anisotropic dry etching process.

Next, a second fin etching process for etching the upper fin recess FR1 from the bottom surface of the upper fin recess FR1 by using the second insulating cover 182B, the preliminary first fin isolation spacer 122', the preliminary second fin isolation spacer 124', and the preliminary third fin isolation spacer 126' as an etch mask is performed, thereby forming the lower fin recess FR3 having a bottom level lower than the first depth D1 from the top surface of the one of the plurality of fin-type active regions FA. The lower fin recess FR3 and the upper fin recess FR1 constitute the fin inside isolation space FS2'.

FIG. 10A also illustrates a cross-sectional view of the one of the plurality of fin-type active regions FA and the fin outside isolation space FS1 in the fin isolation region FS, along the Y direction, after the lower fin recess FR3 is formed. In addition, in the cross-sectional view of FIG. 10A along the Y direction, a cross-sectional profile of the one of the plurality of fin-type active regions FA before forming the upper fin recess FR1 and the lower fin recess FR3 is marked by a dashed line.

As shown in the cross-sectional view FIG. 10A taken along the line X1-X1', the lower fin recess FR3 has the round-shaped sidewall RS3 extending in the depth direction of the one of the plurality of fin-type active regions FA. Thus, in the X direction, a width of the lower fin recess FR3 is greater than a width of the upper fin recess FR1. In the second fin etching process for forming the lower fin recess FR3 having the round-shaped sidewall RS3, dry etching conditions may be controlled to simultaneously perform vertical etching and horizontal etching, unlike in the first fin etching process. Here, a horizontal etching amount may be controlled to be less than a vertical etching amount. As a result, a Z-direction depth of the lower fin recess FR3 is greater than an X-direction width thereof. As such, vertical etching and horizontal etching are simultaneously performed in the second fin etching process, whereby, in a Y-direction cross-sectional profile of the one of the plurality of fin-type active regions FA obtained after forming the lower fin recess FR3 in the one of the plurality of fin-type active regions FA, a top portion FT of the one of the plurality of fin-type active regions FA around the lower fin recess FR3 may maintain a round shape without being too sharp. If the top portion FT of the one of the plurality of fin-type active regions FA is too sharp, there may occur a problem such as poor electric field distribution in the top portion FT of the one of the plurality of fin-type active regions FA. According to the inventive concept, the top portion FT of the one of the plurality of fin-type active regions FA maintains a round shape after forming the lower fin recess FR3 by simultaneously performing vertical etching and horizontal etching upon the second fin etching process, whereby the occurrence of electrical defects due to a shape of the top portion FT of the one of the plurality of fin-type active regions FA may be suppressed.

In addition, since the lower fin recess FR3 is formed at a position lower than the bottom level LV1 of the upper fin recess FR1, the level LV3 of the portion of the lower fin recess FR3, which has the maximum width FMW in the X direction, corresponds to the third depth D3 that is greater than the first depth D1 from the top surface of the one of the plurality of fin-type active regions FA. The level LV3 of the portion of the lower fin recess FR3 is a different level from the level of the portion of the source/drain region 172, which has the maximum width MW in the X direction. Therefore, the maximum width FMW is increased due to the round-shaped sidewall RS3 of the lower fin recess FR3 without having an adverse effect on the plurality of source/drain regions 172.

Referring to FIG. 10B, the fin isolation insulating unit 120D is formed by forming the fin isolation insulating film 128, which fills the fin inside isolation space FS2' and the fin outside isolation space FS1 (see FIG. 10A), in the same manner as described with reference to FIGS. 7Q and 7R, followed by forming the plurality of upper source/drain contact holes CH2 in the same manner as described with reference to FIG. 7S, and then, the upper source/drain contact CA2 is formed to respectively fill the plurality of upper source/drain contact holes CH2. The plurality of gate contact holes CH3 (see FIG. 5B) may be formed during the formation of the plurality of upper source/drain contact holes CH2, and the plurality of gate contacts CB may be formed during the formation of the upper source/drain contact CA2.

Figure 11A:
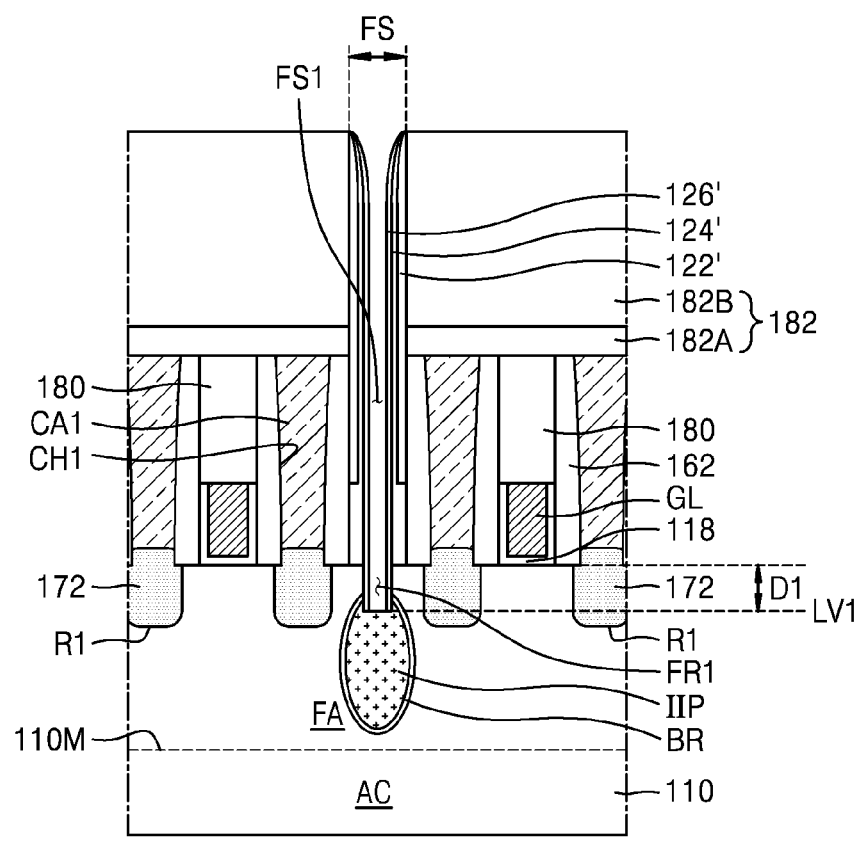
FIGS. 11A and 11B are cross-sectional views illustrating a method of fabricating an integrated circuit device, according to an exemplary embodiment of the present inventive concept.
Figure 11B:
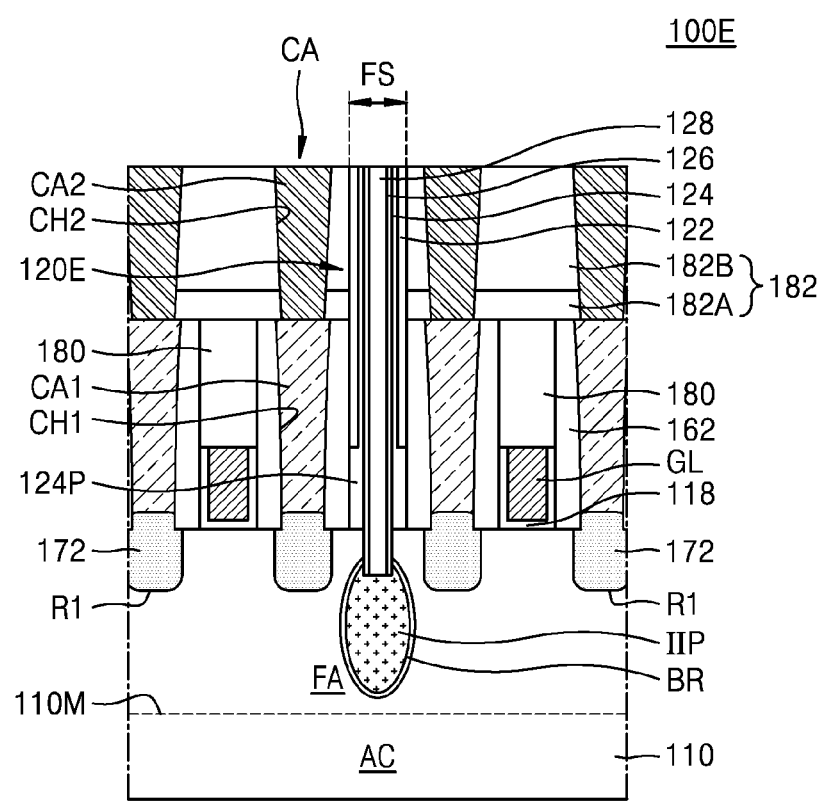

FIGS. 11A and 11B are cross-sectional views illustrating a method of fabricating an integrated circuit device, according to an exemplary embodiment. A method of fabricating the integrated circuit device 100E shown in FIGS. 6A and 6B will be described with reference to FIGS. 11A and 11B.

Referring to FIG. 11A, the first fin etching process for forming the upper fin recess FR1 having the first depth D1 from the top surface of one of the plurality of fin-type active regions FA is performed by performing the processes described with reference to FIGS. 7A to 7N, followed by performing up to the process of forming the third fin isolation spacer 126 in the fin outside isolation space FS1 and the upper fin recess FR1 as described with reference to FIG. 7O.

Next, impurity ions are implanted into a portion of the one of the plurality of fin-type active regions FA exposed by the fin outside isolation space FS1 and the upper fin recess FR1, thereby forming the barrier ion implantation region BR and the insulating ion implantation region IIP in this stated order.

Referring to FIG. 11B, the fin isolation insulating unit 120E is formed by forming the fin isolation insulating film 128, which fills the fin outside isolation space FS1 and the upper fin recess FR1 (see FIG. 11A) in a similar method to the method described with reference to FIGS. 7Q and 7R, followed by forming the plurality of upper source/drain contact holes CH2 in the same manner as described with reference to FIG. 7S, and then, the upper source/drain contact CA2 is formed to fill the plurality of upper source/drain contact holes CH2. The plurality of gate contact holes CH3 (see FIG. 6B) may be formed during the formation of the plurality of upper source/drain contact holes CH2, and the plurality of gate contacts CB may be formed during the formation of the upper source/drain contact CA2.

According to the method of fabricating the integrated circuit device 100B, 100C, 100D, or 100E, which has been described with reference to FIGS. 8A to 11B, even though a highly down-scaled integrated circuit device has a reduced area of the device active region and a reduced feature size, the fin isolation insulating unit 120B, 120C, 120D, or 120E for insulation between adjacent transistors may be easily formed by a simplified process, and the reliability of the integrated circuit device may be increased by suppressing an electrical characteristic deviation caused by such a complicated structure.

Figure 12A:
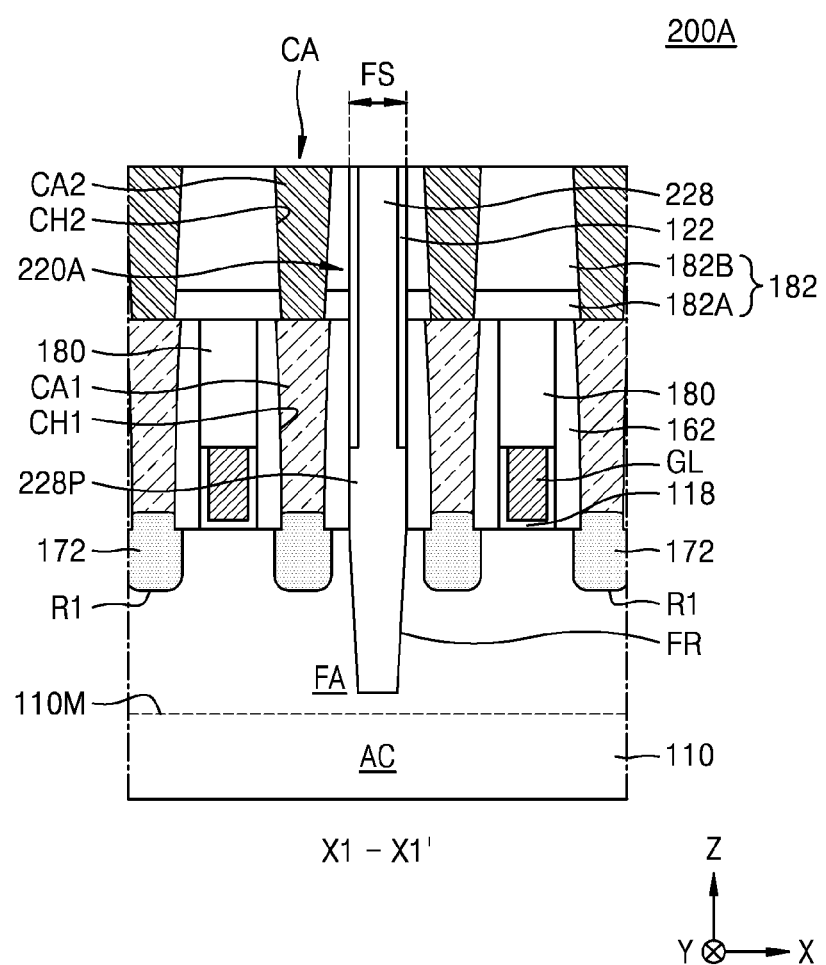
FIGS. 12A and 12B, FIGS. 13A and 13B, and FIG. 14 are cross-sectional views illustrating integrated circuit devices, according to an exemplary embodiment of the present inventive concept.
Figure 12B:
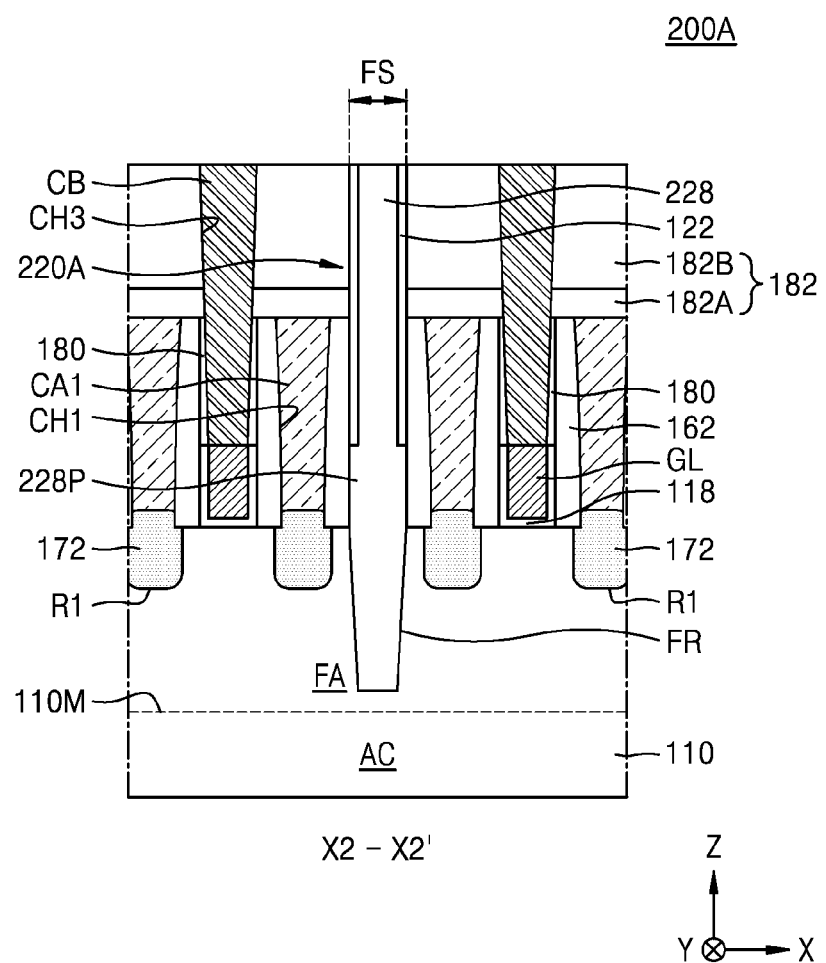

FIGS. 12A and 12B are cross-sectional views illustrating an integrated circuit device, according to an exemplary embodiment. FIGS. 12A and 12B respectively illustrate configurations of portions of the integrated circuit device, which correspond to cross-sections taken along the lines X1-X1' and X2-X2' of FIG. 1.

An integrated circuit device 200A shown in FIGS. 12A and 12B has substantially the same configuration as the integrated circuit device 100A shown in FIGS. 2A to 2C. A fin isolation insulating unit 220A in the fin isolation region FS of the integrated circuit device 200A includes the first fin isolation spacer 122, similarly to the fin isolation insulating unit 120A shown in FIGS. 2A to 2C. However, unlike the fin isolation insulating unit 120A, the fin isolation insulating unit 220A includes a fin isolation insulating film 228 having a protrusion 228P between one of the plurality of fin-type active regions FA and the first fin isolation spacer 122, the protrusion 228P protruding toward an outside the fin isolation insulating unit 220A. The fin isolation insulating film 228 has an end, which fills a fin recess FR in the one of the plurality of fin-type active regions FA, and a sidewall covered with the insulating cover 182, and extends parallel to the plurality of gate lines GL. A constituent material of the fin isolation insulating film 228 is as described regarding the fin isolation insulating film 128 with reference to FIGS. 2A to 2C.

Figure 13A:
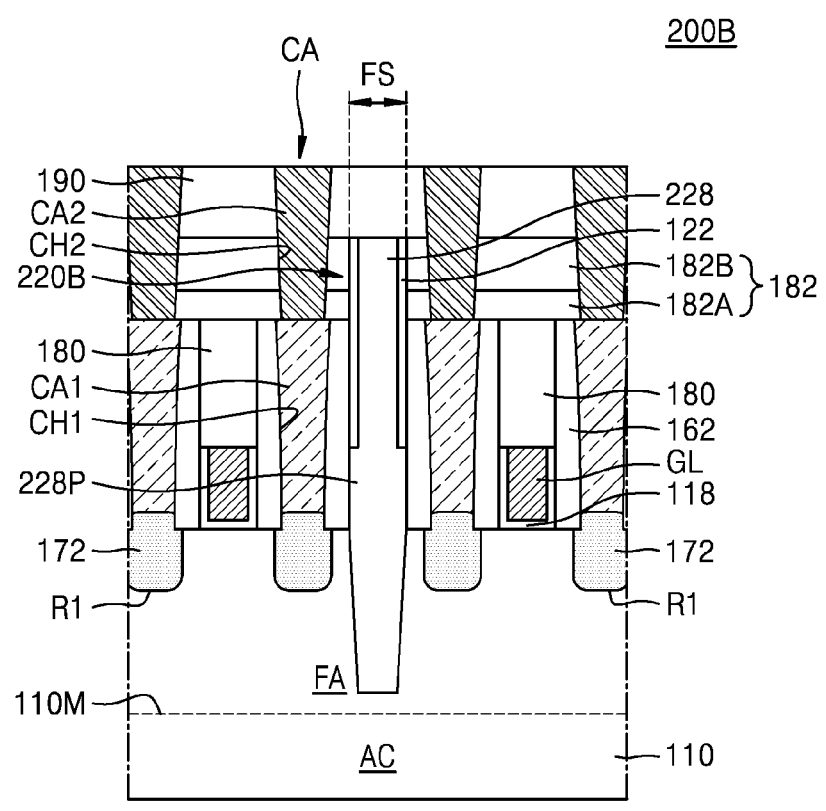
Figure 13B:
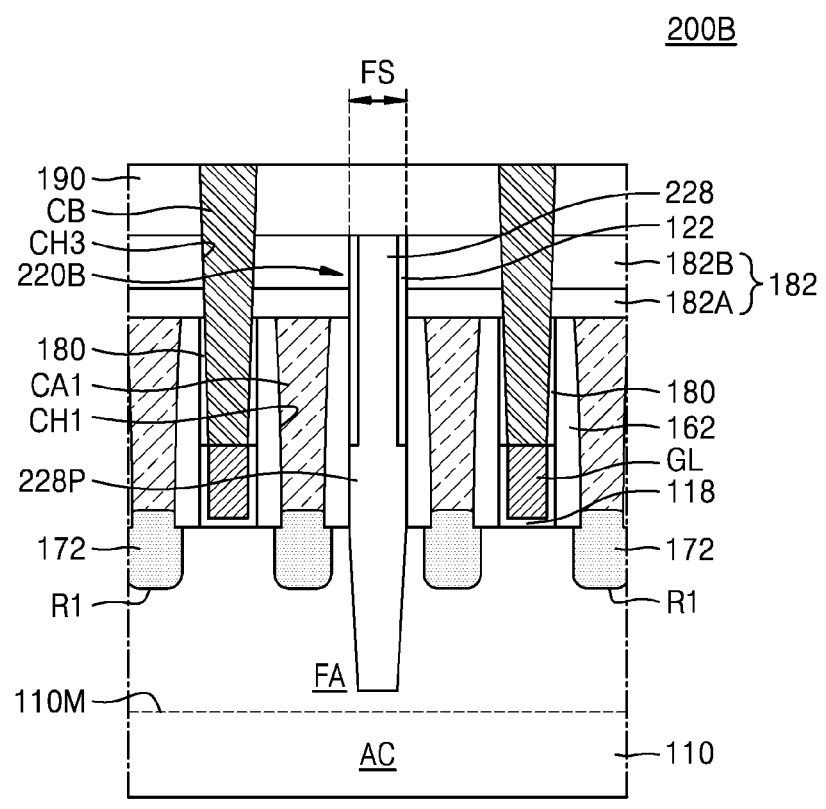

FIGS. 13A and 13B are cross-sectional views illustrating an integrated circuit device, according to an exemplary embodiment. FIGS. 13A and 13B respectively illustrate configurations of portions of the integrated circuit device, which correspond to cross-sections taken along the lines X1-X1' and X2-X2' of FIG. 1.

An integrated circuit device 200B shown in FIGS. 13A and 13B has substantially the same configuration as the integrated circuit device 200A shown in FIGS. 12A and 12B. However, the integrated circuit device 200B includes a fin isolation insulating unit 220B in the fin isolation region FS, a top surface of the fin isolation insulating unit 220B and the top surface of the insulating cover 182 are covered with the upper insulating film 190. The fin isolation insulating unit 220B has substantially the same configuration as the fin isolation insulating unit 220A, except that the fin isolation insulating unit 220B has a smaller height than the fin isolation insulating unit 220A shown in FIGS. 12A and 12B. A detailed configuration of the upper insulating film 190 is as described with reference to FIGS. 3A and 3B.

In the integrated circuit device 200B, the top surface of the fin isolation insulating unit 220B and the top surface of the insulating cover 182 extend on the same plane, and the top surfaces of the plurality of source/drain contacts CA and the top surfaces of the plurality of gate contacts CB extend on the same plane as the top surface of the upper insulating film 190 covering the fin isolation insulating unit 220B. Each of the plurality of source/drain contacts CA and the plurality of gate contacts CB protrudes from the top surface of the insulating cover 182 in an opposite direction to the substrate 110.

Figure 14:
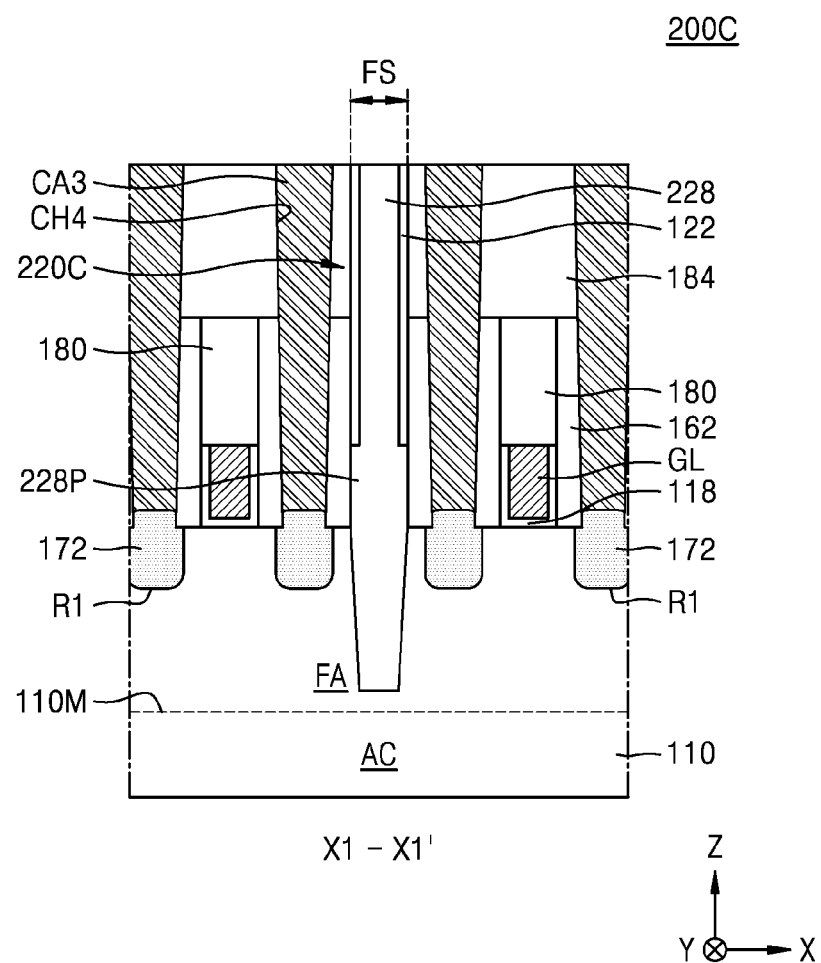

FIG. 14 is a cross-sectional view illustrating an integrated circuit device, according to an exemplary embodiment. FIG. 14 illustrates a configuration of a portion of the integrated circuit device, which corresponds to a cross-section taken along the line X1-X1' of FIG. 1.

Referring to FIG. 14, an integrated circuit device 200C has substantially the same configuration as the integrated circuit device 200A shown in FIGS. 12A and 12B. A fin isolation insulating unit 220C is formed in the fin isolation region FS of the integrated circuit device 200C. The fin isolation insulating unit 220C has the same configuration as the fin isolation insulating unit 220A shown in FIGS. 12A and 12B. However, the integrated circuit device 200C includes the plurality of gate lines GL, the plurality of source/drain regions 172, the insulating cover 184 including a single layer covering the plurality of fin-type active regions FA, and the plurality of source/drain contacts CA3 each connected to one of the plurality of source/drain regions 172. Detailed configurations of the insulating cover 184 and the plurality of source/drain contacts CA3 are as described with reference to FIGS. 4A and 4B. The top surfaces of the plurality of source/drain contacts CA3, a top surface of the fin isolation insulating unit 220C, and the top surface of the insulating cover 184 extend on the same plane.

The integrated circuit devices 200A, 200B, or 200C described with reference to FIGS. 12A to 14 include the fin isolation insulating unit 220A, 220B, or 220C in the fin isolation region FS, the fin isolation insulating unit 220A, 220B, or 220C extending from the inside of the plurality of fin-type active regions FA through the insulating cover 182 or 184. Even though the integrated circuit devices 200A, 200B, or 200C according to the inventive concept include the gate lines having limited line widths due to high down-scaling, since the integrated circuit devices 200A, 200B, or 200C have a structure in which each of the plurality source/drain contacts CA or CA3 and the fin isolation insulating unit 220A, 220B, or 220C are self-aligned by the plurality of insulating spacers 162 extending in a line shape to cover the sidewalls of the plurality of gate lines GL adjacent to each of the plurality source/drain contacts CA or CA3 and the fin isolation insulating unit 220A, 220B, or 220C, the fin isolation insulating unit 220A, 220B, or 220C with a relatively small area for stable insulation may be provided, and the integrated circuit device 200A, 200B, or 200C may exhibit desired performance with a minimum area.

Figure 15A:
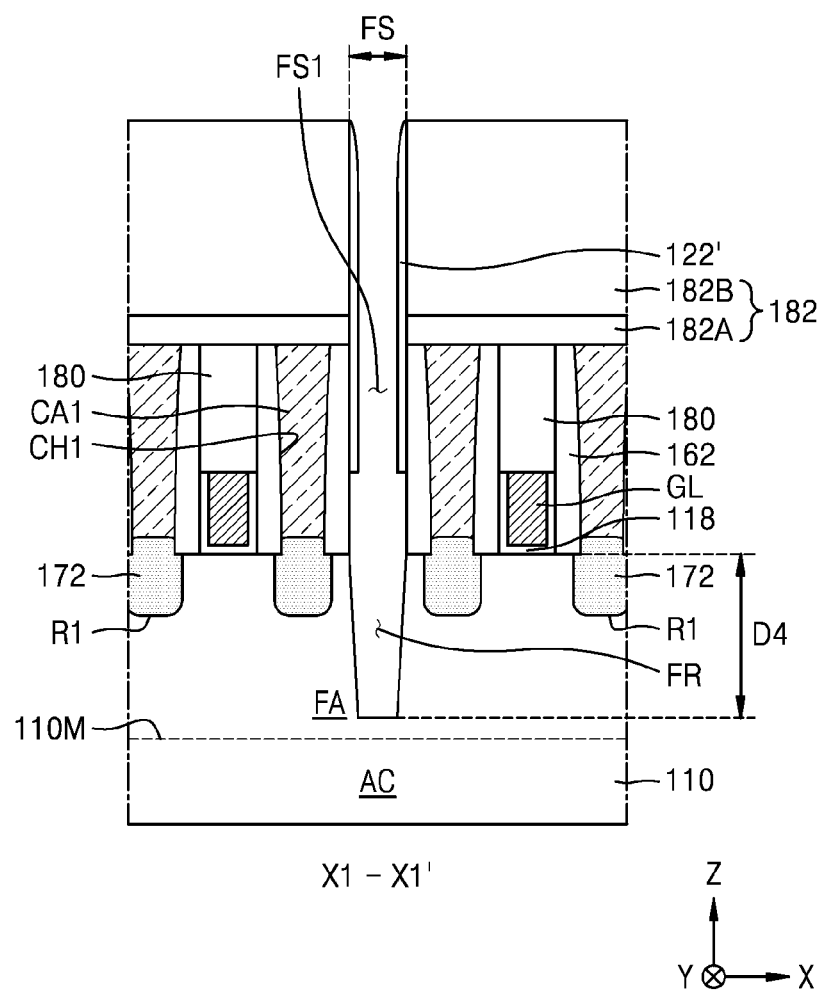
FIGS. 15A and 15B are cross-sectional views illustrating a method of fabricating an integrated circuit device, according to an exemplary embodiment of the present inventive concept.
Figure 15B:
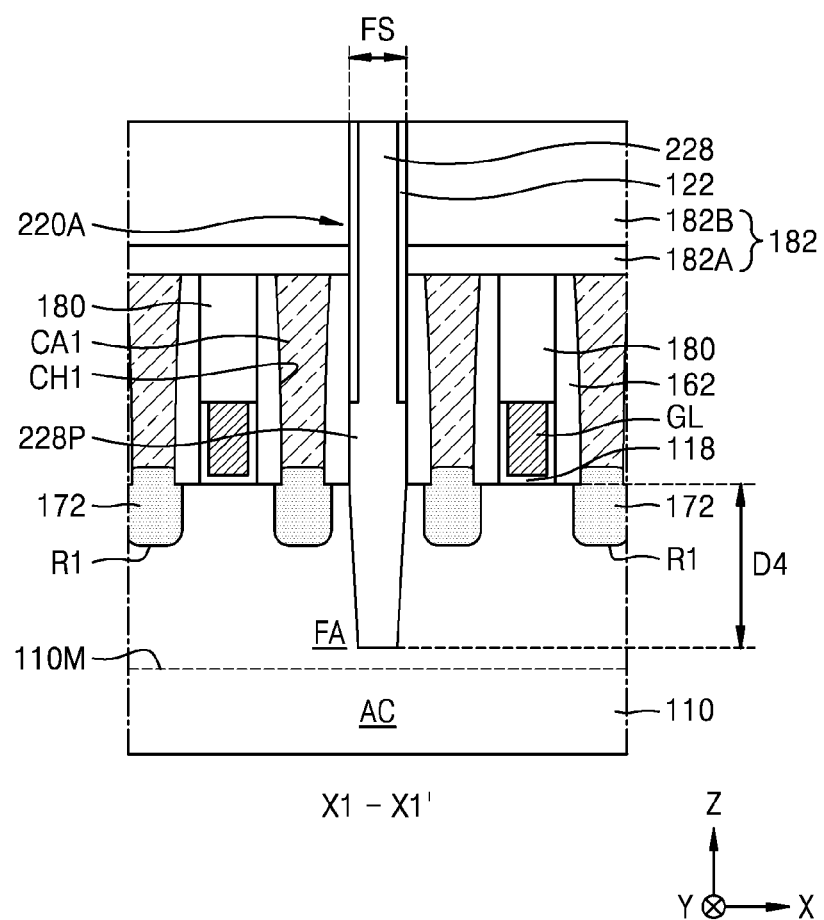

FIGS. 15A and 15B are cross-sectional views illustrating a method of fabricating an integrated circuit device, according to an exemplary embodiment. A method of fabricating the integrated circuit device 200A shown in FIGS. 12A and 12B will be described with reference to FIGS. 15A and 15B.

Referring to FIG. 15A, after the processes described with reference to FIGS. 7A to 7L are performed, one of the plurality of fin-type active regions FA exposed in the fin outside isolation space FS1 is etched by using the second insulating cover 182B and a preliminary first fin isolation spacer 122' as an etch mask, thereby forming the fin recess FR having a bottom surface at a fourth depth D4 from the top surface of the one of the plurality of fin-type active regions FA. The fourth depth D4 is greater than a depth corresponding to a bottom surface of one of the plurality of source/drain regions 172.

To form the fin recess FR, an anisotropic dry etching process may be used. The fin recess FR is self-aligned with the sidewalls of two insulating spacers of the plurality of insulating spacers 162 adjacent to each other.

Referring to FIG. 15B, in a similar method to the process of forming the fin isolation insulating film 128, which has been described with reference to FIGS. 7Q and 7R, the fin isolation insulating film 228 is formed in the fin recess FR and the fin outside isolation space FS1. The fin isolation insulating film 228 may have substantially the same configuration as the fin isolation insulating film 128. The first fin isolation spacer 122 and the fin isolation insulating film 228 in the fin isolation region FS constitute the fin isolation insulating unit 220A.

Next, in the same manner as described with reference to FIG. 7S, the plurality of upper source/drain contact holes CH2 may be formed to penetrate the second insulating cover 182B and the first insulating cover 182A and to respectively expose the lower source/drain contact CA1. followed by forming the upper source/drain contact CA2 in the plurality of upper source/drain contact holes CH2, thereby fabricating the integrated circuit device 200A shown in FIGS. 12A and 12B. During the formation of the upper source/drain contact CA2, the plurality of gate contacts CB shown in FIG. 12B may be simultaneously formed.

It will be understood by those skilled in the art that integrated circuit devices having various structures may be fabricated by various modifications and changes of the method described with reference to FIGS. 15A and 15B without departing from the spirit and scope of the inventive concept. For example, the integrated circuit device 200B shown in FIGS. 13A and 13B may be fabricated by combining the method described with reference to FIGS. 15A and 15B and the method described with reference to FIGS. 8A and 8B. In addition, the integrated circuit device 200C shown in FIG. 14 may be fabricated by combining the method described with reference to FIGS. 15A and 15B and the method described with reference to FIGS. 9A to 9E.

Figure 16A:
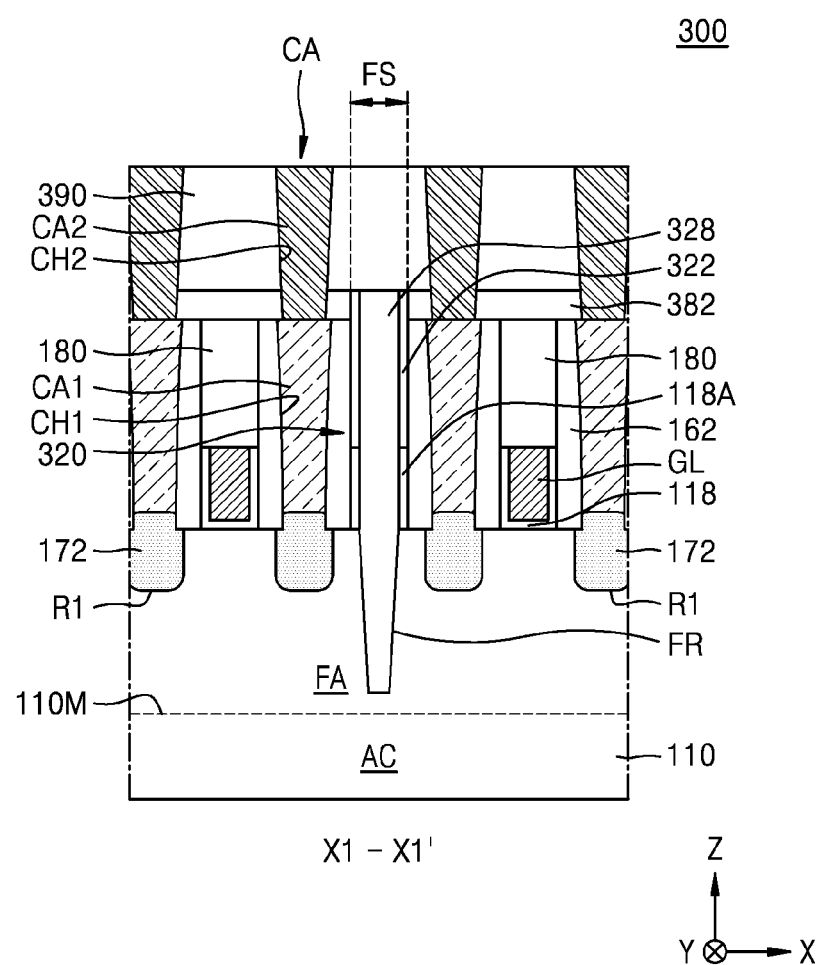
FIGS. 16A and 16B are cross-sectional views illustrating integrated circuit devices, according to an exemplary embodiment of the present inventive concept.
Figure 16B:
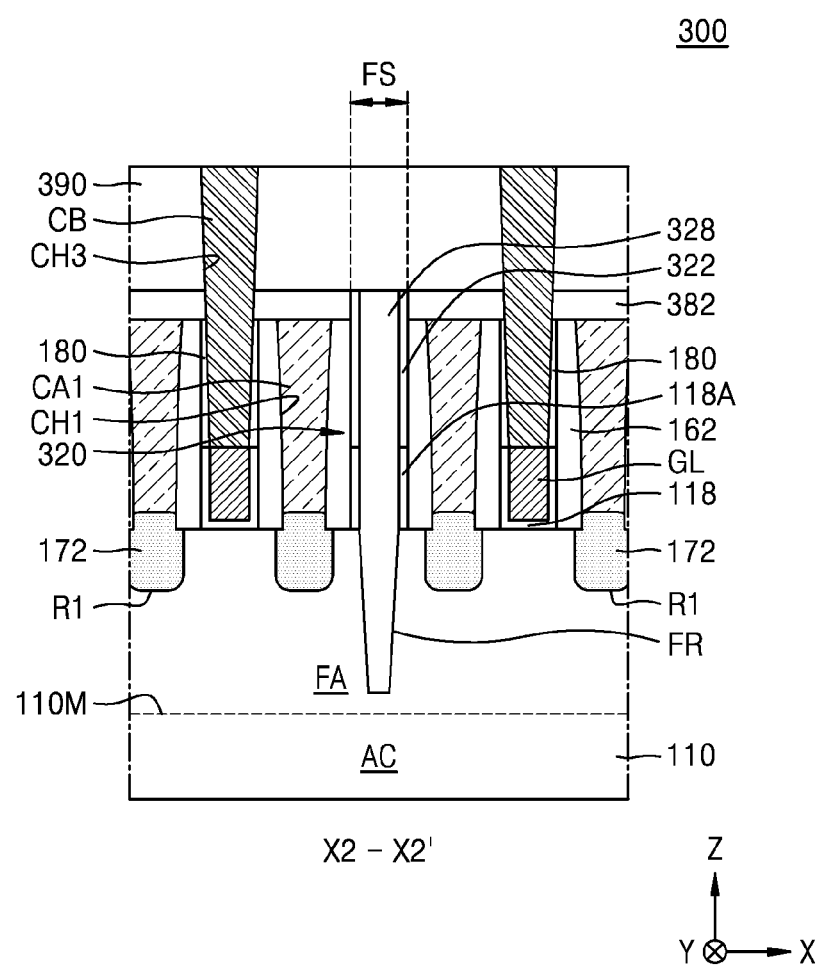

FIGS. 16A and 16B are cross-sectional views illustrating an integrated circuit device, according to an exemplary embodiment. FIGS. 16A and 16B respectively illustrate configurations of portions of the integrated circuit device, which correspond to cross-sections taken along the lines X1-X1' and X2-X2' of FIG. 1.

Referring to FIGS. 16A and 16B, an integrated circuit device 300 may have a configuration similar to that of the integrated circuit device 200B shown in FIGS. 13A and 13B. However, the integrated circuit device 300 includes a fin isolation insulating unit 320 in the fin isolation region FS, an insulating cover 382 covering the device active region AC around the fin isolation region FS, and an upper insulating film 390 covering a top surface of the fin isolation insulating unit 320 and a top surface of the insulating cover 382. The insulating cover 382 may include a silicon nitride film, without being limited thereto. A detailed configuration of the upper insulating film 390 is as described regarding the upper insulating film 190 with reference to FIGS. 3A and 3B. The fin isolation insulating unit 320 includes a fin isolation insulating film 328 and a first fin isolation spacer 322. The fin isolation insulating film 328 has a sidewall covered with the first fin isolation spacer 322. A detailed configuration of the fin isolation insulating film 328 is as described regarding the fin isolation insulating film 128 with reference to FIGS. 2A to 2C.

The fin isolation insulating film 328 has an end, which fills the fin recess FR in one of the plurality of fin-type active regions FA, and a sidewall covered with the insulating cover 382, and extends parallel to the plurality of gate lines GL. A constituent material of the fin isolation insulating film 328 is as described regarding the fin isolation insulating film 128 with reference to FIGS. 2A to 2C. The fin isolation insulating unit 320 further includes a gate level fin isolation insulating film 118A between the one of the plurality of fin-type active regions FA and first fin isolation spacer 322, the gate level fin isolation insulating film 118A covering the sidewall of the fin isolation insulating film 328. The gate level fin isolation insulating film 118A is located at the same level as the plurality of gate lines GL and the plurality of gate insulating films 118. The gate level fin isolation insulating film 118A and the plurality of gate insulating films 118 may include the same material.

In the integrated circuit device 300, the top surface of the fin isolation insulating unit 320 and the top surface of the insulating cover 382 extend on the same plane, and the top surfaces of the plurality of source/drain contacts CA and the top surfaces of the plurality of gate contacts CB extend on the same plane as a top surface of the upper insulating film 390 covering the insulating cover 382. Each of the plurality of source/drain contacts CA and the plurality of gate contacts CB extends from the top surface of the insulating cover 382 in an opposite direction to the substrate 110.

The integrated circuit device 300 described with reference to FIGS. 16A and 16B includes the fin isolation insulating unit 320 extending from the inside of the one of the plurality of fin-type active regions FA through the insulating cover 382. Even though the integrated circuit device 300 according to the inventive concept includes the gate lines having limited line widths due to high down-scaling, since the integrated circuit device 300 has a structure in which each of the plurality source/drain contacts CA and the fin isolation insulating unit 320 is self-aligned by the plurality of insulating spacers 162 each extending in a line shape to cover the sidewalls of the plurality of gate lines GL adjacent to the fin isolation insulating unit 320, the fin isolation insulating unit 320 with a relatively small area for stable insulation may be provided, and the integrated circuit device 300 may exhibit desired performance with a minimum area.

FIGS. 17A to 17J are cross-sectional views illustrating sequential processes of a method of fabricating an integrated circuit device, according to embodiments. A method of fabricating the integrated circuit device 300 shown in FIGS. 16A and 16B will be described with reference to FIGS. 17A to 17J.

Figure 17A:
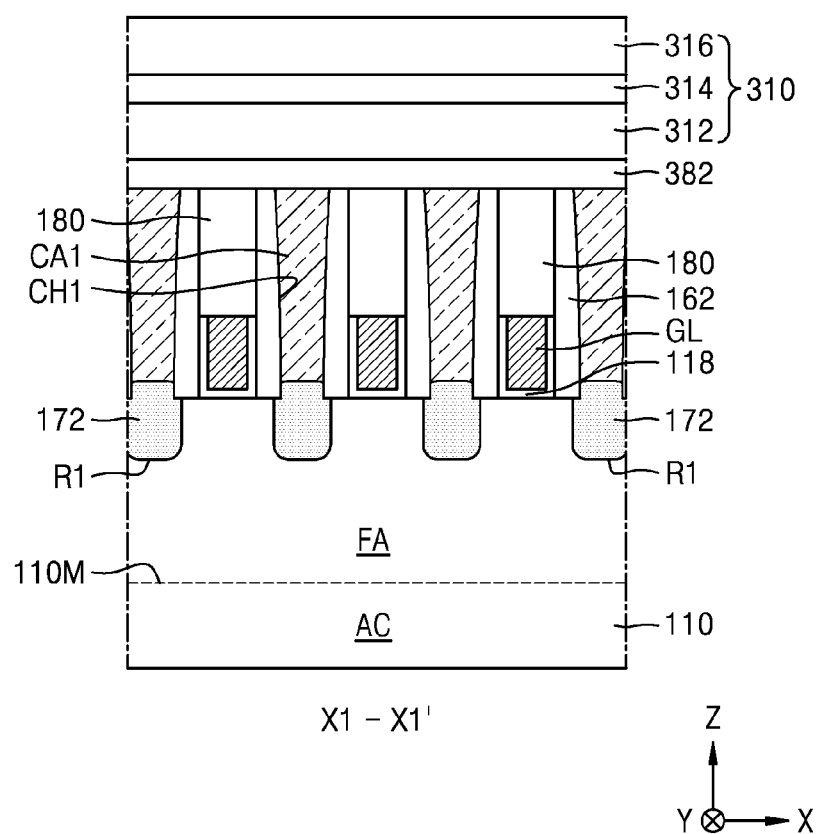
FIGS. 17A to 17J are cross-sectional views illustrating a method of fabricating an integrated circuit device, according to an exemplary embodiment of the present inventive concept.

Referring to FIG. 17A, after performing up to the process of forming the lower source/drain contact CA1 according to the method described with reference to FIGS. 7A to 7H, the insulating cover 382 and a hardmask pattern 310 covering the insulating cover 382 are formed, the insulating cover 382 simultaneously covering the plurality of gate insulating capping layers 180, the plurality of gate insulating films 118, the lower source/drain contact CA1, and the inter-gate dielectric 164. The insulating cover 382 may have the same configuration as the first insulating cover 182A described with reference to FIG. 7I.

The hardmask pattern 310 has a triple-layered structure in which two material layers having different etch selectivity from each other are alternately stacked. For example, a first hardmask pattern 312 and a third hardmask pattern 316 may each include a silicon oxide film, and a second hardmask pattern 314 may include a silicon nitride film. The number of layers constituting the hardmask pattern 310, and constituent materials of the layers are not limited to the example as set forth above and may be variously modified.

Figure 17B:
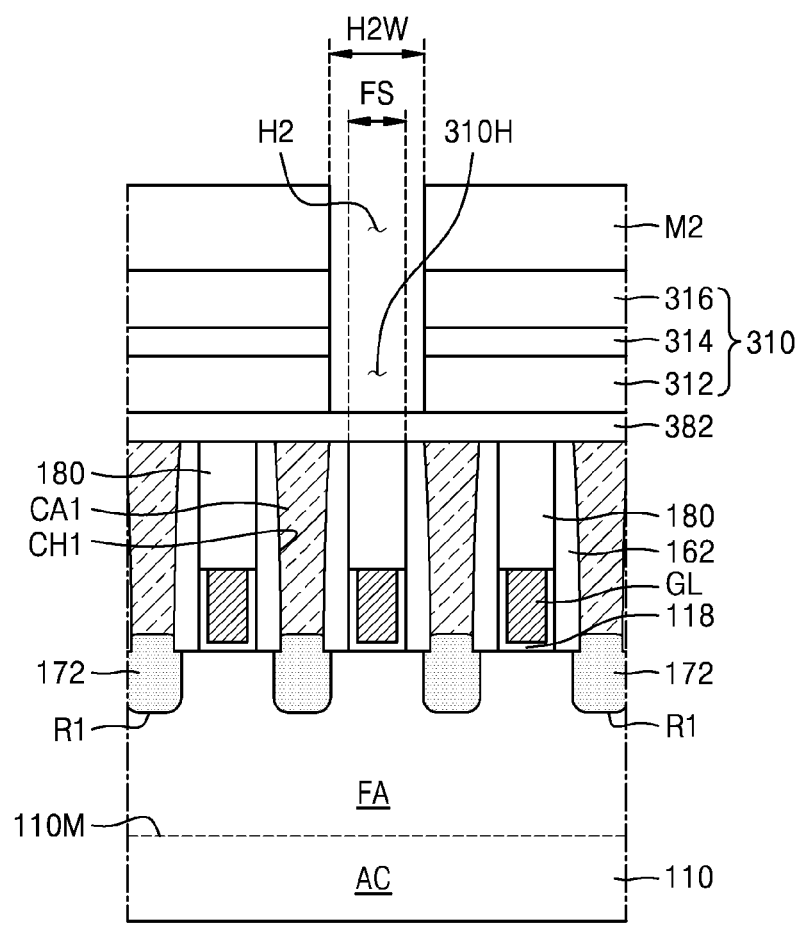

Referring to FIG. 17B, a mask pattern M2 having a hole H2 corresponding to the fin isolation region FS is formed on the insulating cover 382, followed by etching the hardmask pattern 310 exposed by the hole H2 by using the mask pattern M2 as an etch mask, thereby forming a hardmask hole 310H, which exposes the top surface of the insulating cover 382. In the X direction, a width H2W of the hole H2 is greater than a width of the fin isolation region FS.

Figure 17C:
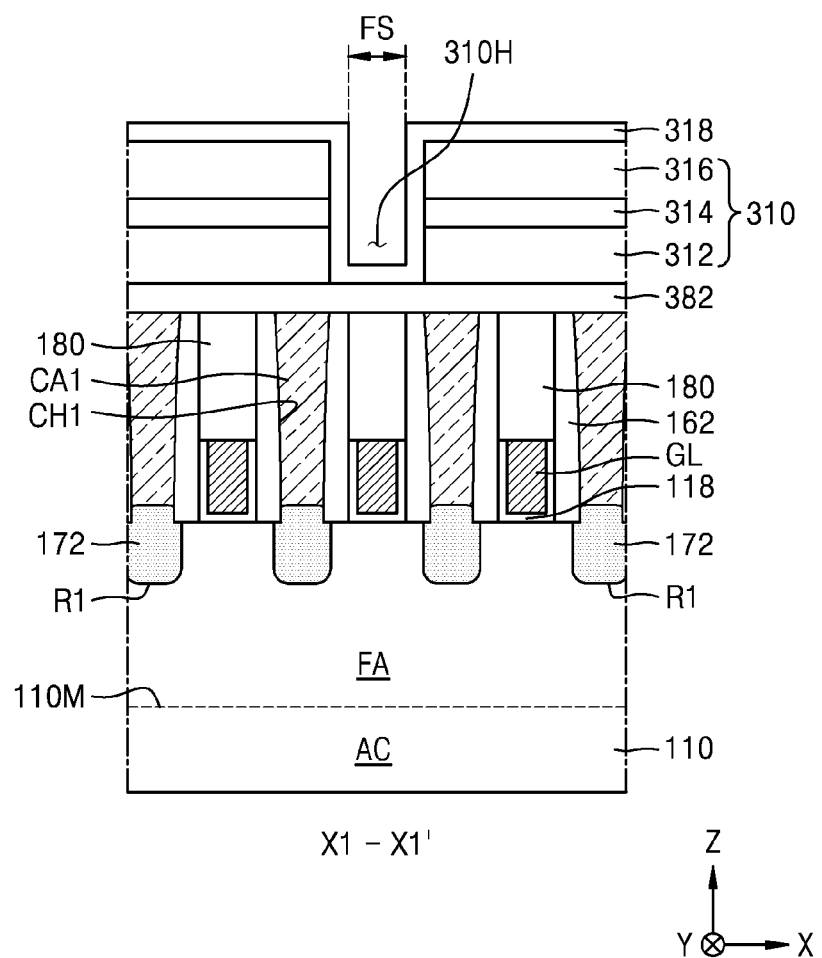

Referring to FIG. 17C, the mask pattern M2 is removed, followed by forming a spacer 318, which covers an inner sidewall of the hardmask hole 310H and a top surface of the hardmask pattern 310. The spacer 318 may include a silicon nitride film. The spacer 318 changes its shape in the method of fabricating the integrated circuit device, but for the convenience of description, the same reference numeral will indicate to the corresponding elements of the spacer 318 in FIG. 17C in the remaining drawings.

Figure 17D:
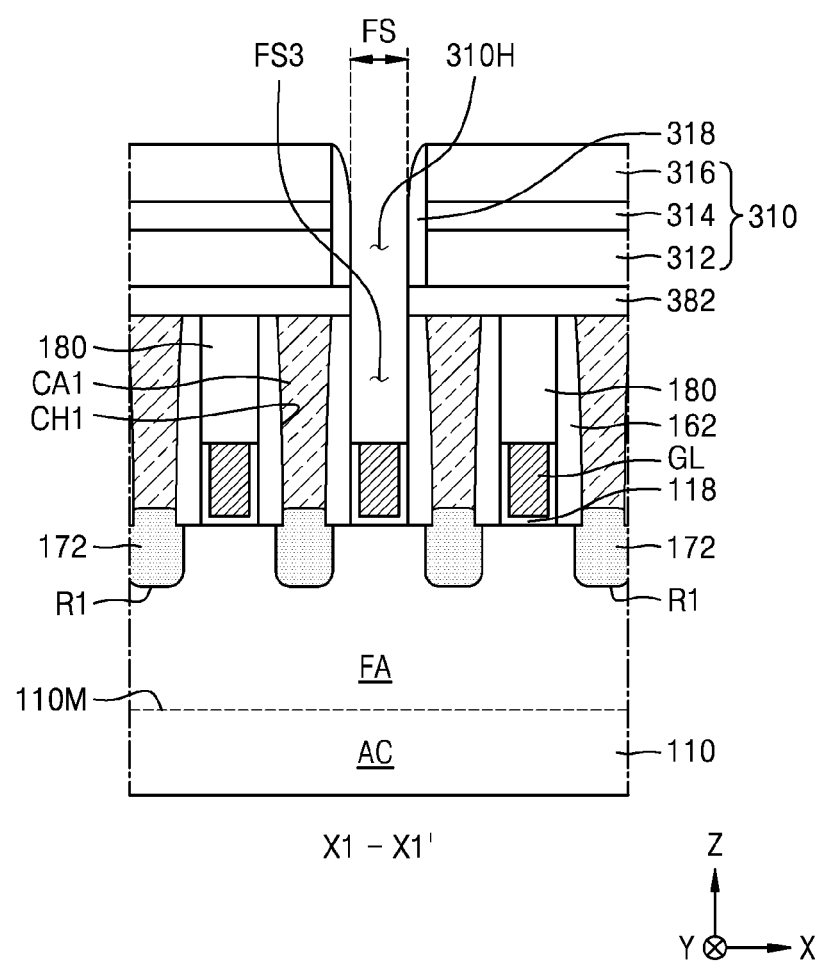

Referring to FIG. 17D, etch-back of the spacer 318 is performed by an anisotropic etching process, thereby exposing the third hardmask pattern 316 at the top surface of the hardmask pattern 310 and exposing the insulating cover 382 in the fin isolation region FS by the hardmask hole 310H. Next, an exposed portion of the insulating cover 382 may be etched, and the gate insulating capping layer 180 exposed by the hardmask hole 310H as a result may be etched, thereby forming a fin outside isolation space FS3, which communicates with the hardmask hole 310H and exposes the top surface of the gate line GL and the top surface of one of the plurality of gate insulating films 118. The sidewalls of two neighboring insulating spacers of the plurality of insulating spacers 162 are exposed by the fin outside isolation space FS3, and the spacer 318 remains only on the inner sidewall of the hardmask hole 310H.

Figure 17E:
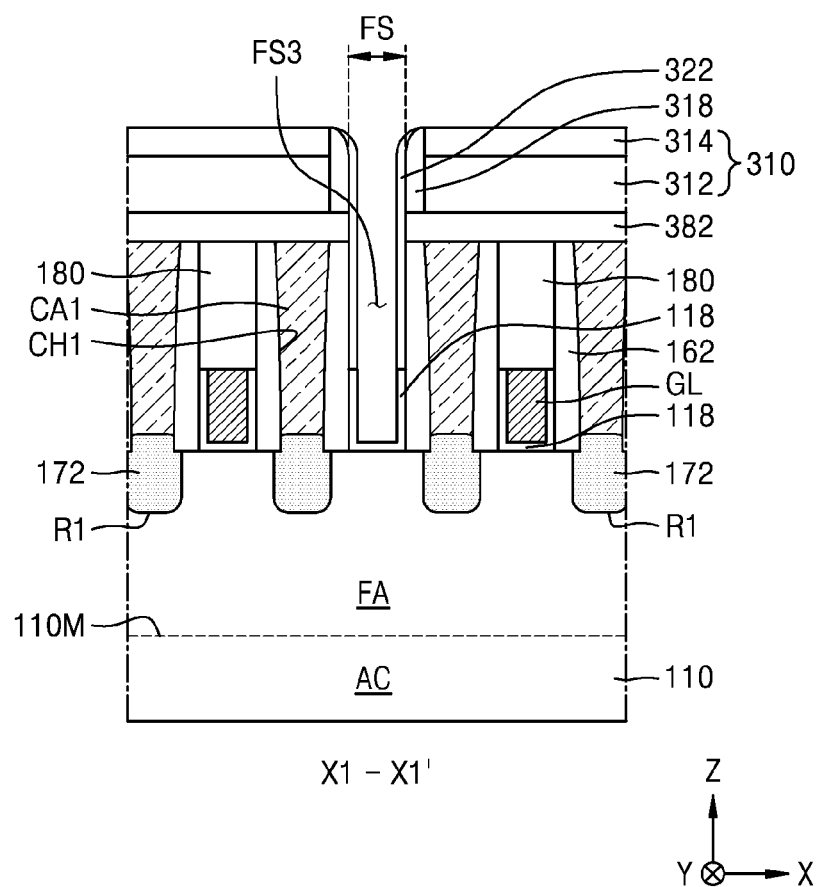

Referring to FIG. 17E, the first fin isolation spacer 322 is formed in the fin outside isolation space FS3 to cover a surface of each of the spacer 318, the insulating cover 382, and the two neighboring insulating spacers of the plurality of insulating spacers 162, followed by removing the one of the plurality of gate lines GL exposed by the fin outside isolation space FS3 by dry etching, wet etching, or a combination thereof. During the removal of the one of the plurality of gate lines GL, the third hardmask pattern 316 of the hardmask pattern 310 is consumed, and a top surface of the second hardmask pattern 314 is exposed.

Figure 17F:
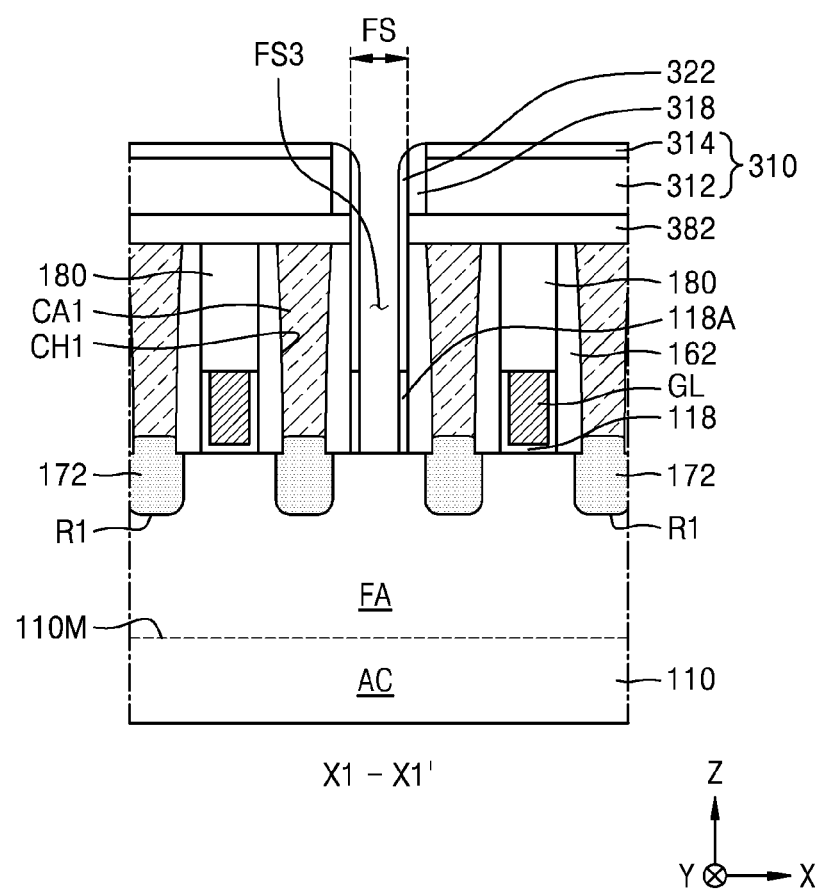

Referring to FIG. 17F, one of the plurality of gate insulating films 118 exposed by the fin outside isolation space FS3 is partially removed by an anisotropic dry etching process, thereby exposing the top surface of the one of the plurality of fin-type active regions FA through the fin outside isolation space FS3. Here, in the fin isolation region FS, a portion of the one of the plurality of gate insulating films 118, which covers the sidewalls of the two neighboring insulating spacers of the plurality of insulating spacers 162, remains as the gate level fin isolation insulating film 118A without being removed.

During the etching process for partially removing the one of the plurality of gate insulating films 118 exposed through the fin outside isolation space FS3, each of the second hardmask pattern 314 of the hardmask pattern 310, the spacer 318, and the first fin isolation spacer 322 may be partially consumed from a top portion thereof.

Figure 17G:
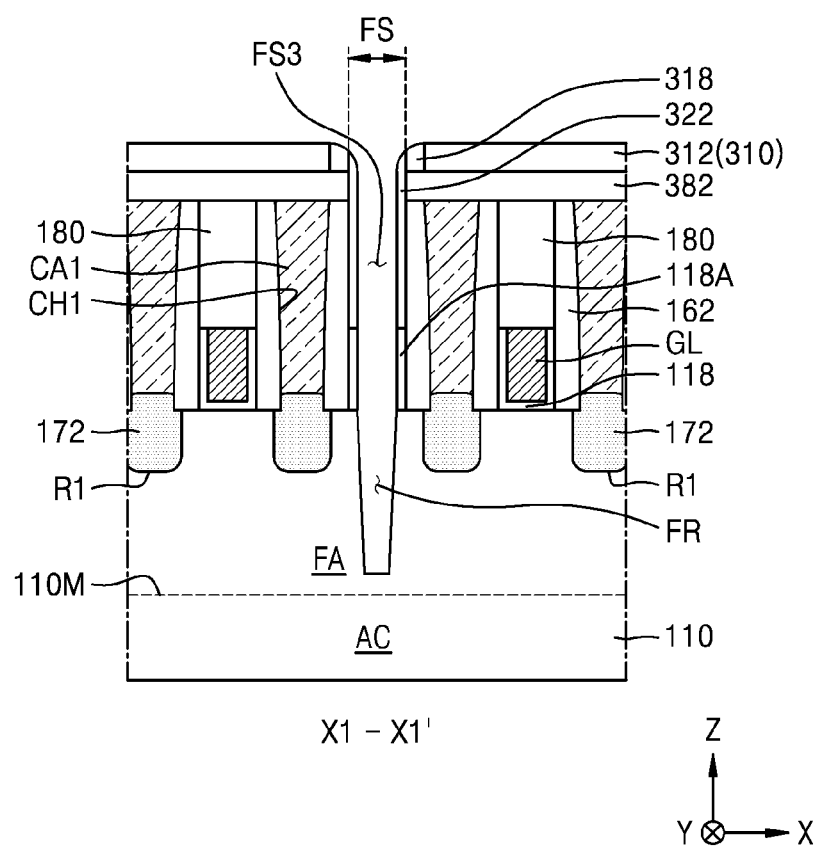

Referring to FIG. 17G, in a similar method to the method described with reference to FIG. 15A, the one of the plurality of fin-type active regions FA exposed through the fin outside isolation space FS3 is etched by using the hardmask pattern 310, the spacer 318, and the first fin isolation spacer 322 as an etch mask, thereby forming the fin recess FR. The fin recess FR may be self-aligned with a sidewall of the first fin isolation spacer 322 and a sidewall of the gate level fin isolation insulating film 118A. During the formation of the fin recess FR, the second hardmask pattern 314 constituting the hardmask pattern 310 may be consumed, and each of the first hardmask pattern 312, the spacer 318, and the first fin isolation spacer 322 may be partially consumed from a top portion thereof.

Figure 17H:
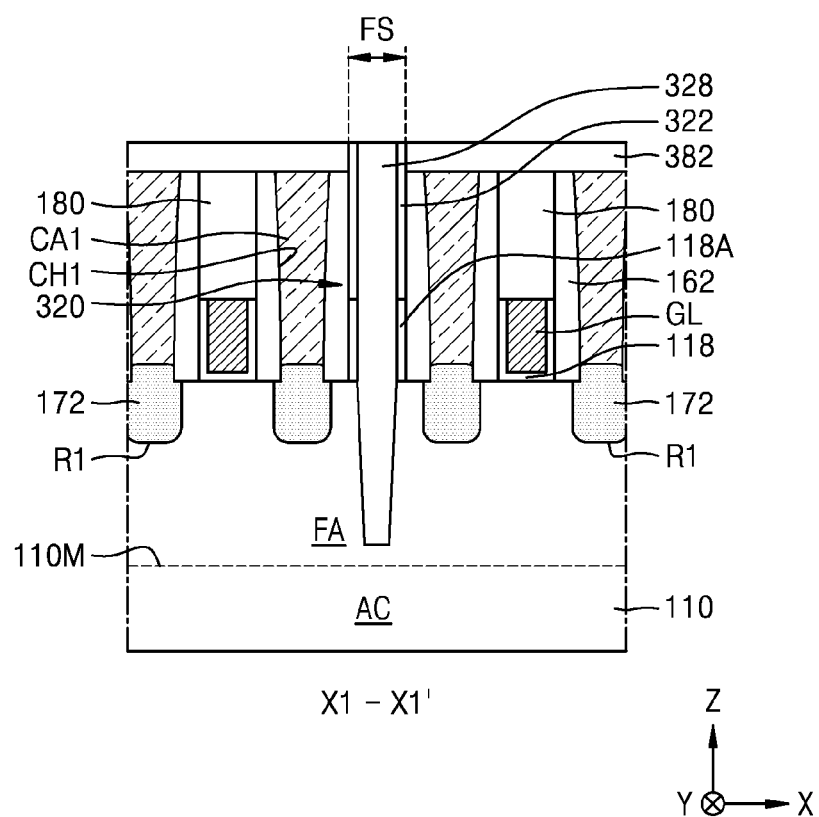

Referring to FIG. 17H, in a similar method to the process of forming the fin isolation insulating film 128, which has been described with reference to FIGS. 7Q and 7R, a preliminary fin isolation insulating film may be formed in the fin recess FR and the fin outside isolation space FS3 (see FIG. 17G), and unnecessary portions of the fin isolation insulating film may be removed by a planarization process such that the top surface of the insulating cover 382 is exposed and a fin isolation insulating film 328 is formed.

The fin isolation insulating film 328, the first fin isolation spacer 322, and the gate level fin isolation insulating film 118A, which remain in the fin isolation region FS, constitute the fin isolation insulating unit 320.

Figure 17I:
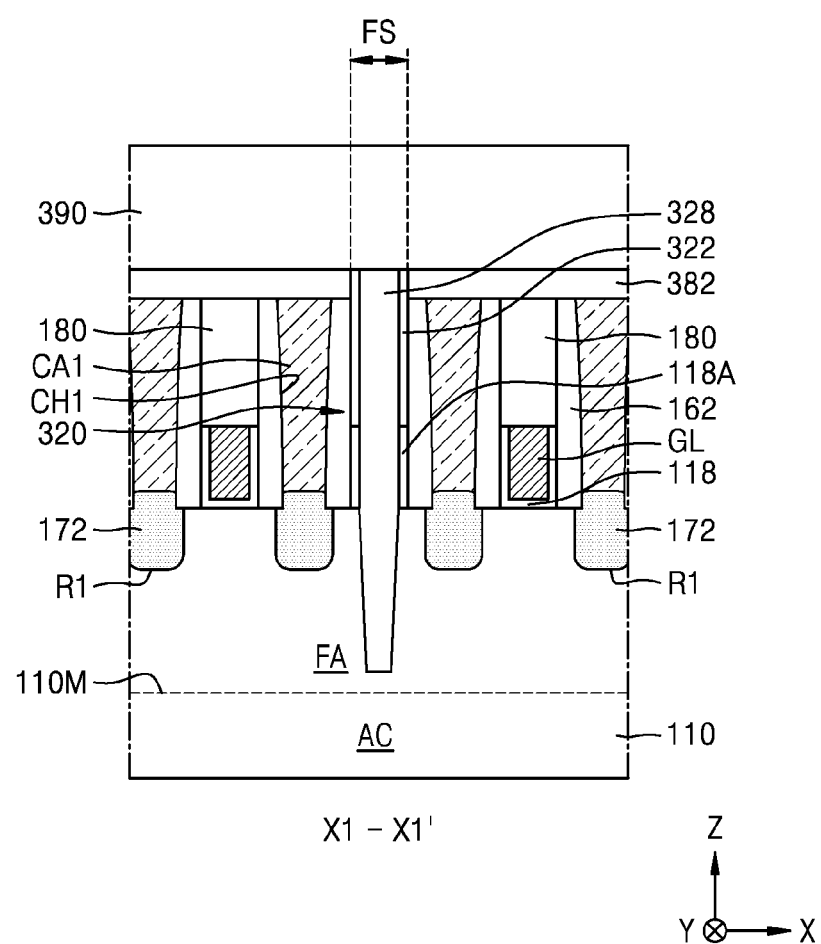

Referring to FIG. 17I, in a similar method to the method described with reference to FIG. 8A, the upper insulating film 390 is formed to cover the fin isolation insulating unit 320 and the insulating cover 382.

Figure 17J:
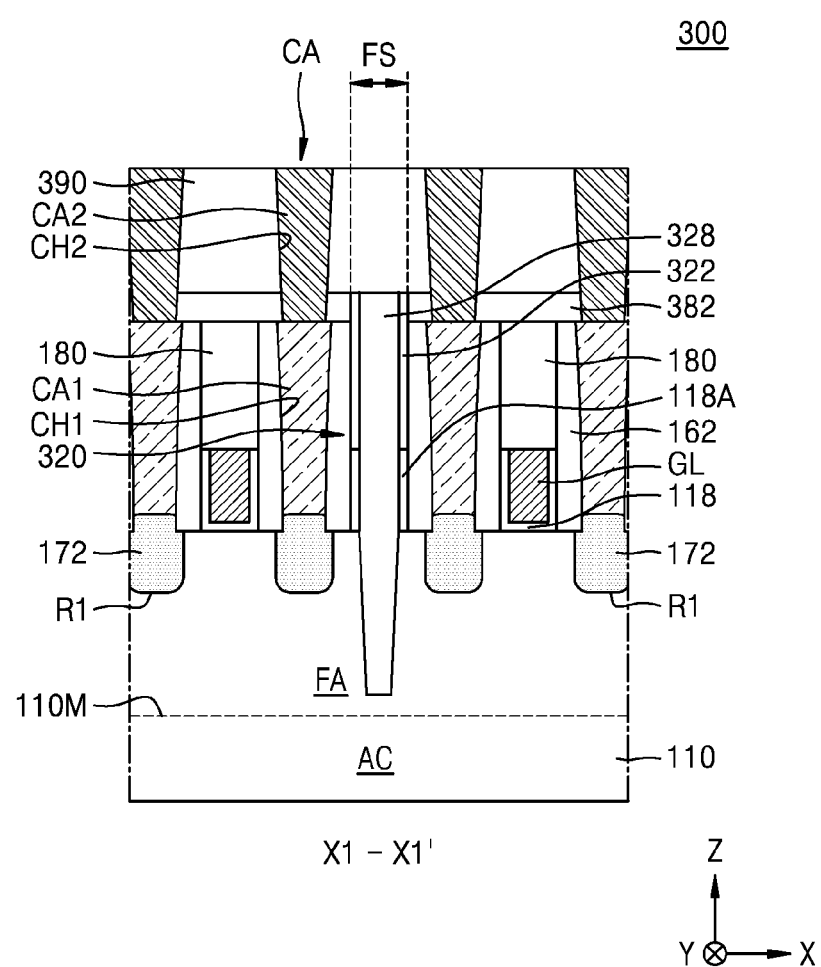

Referring to FIG. 17J, the plurality of upper source/drain contact holes CH2 are formed to penetrate the upper insulating film 390 and the insulating cover 382, followed by forming the upper source/drain contact CA2, which fills the plurality of upper source/drain contact holes CH2. The plurality of gate contact holes CH3 shown in FIG. 16B may be formed during the formation of the plurality of upper source/drain contact holes CH2, and the plurality of gate contacts CB shown in FIG. 16B may be formed during the formation of the upper source/drain contact CA2.

According to the method of fabricating the integrated circuit device 300, which has been described with reference to FIGS. 17A to 17J, in a highly down-scaled integrated circuit device, the fin isolation insulating unit 320 for insulation between adjacent transistors may be easily formed by a simplified process, and the reliability of the integrated circuit device may be increased by suppressing an electrical characteristic deviation caused by such a complicated structure.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. An integrated circuit device comprising:
   a fin-type active region extending on a substrate in a first horizontal direction;
   a gate line extending on the fin-type active region in a second horizontal direction intersecting the first horizontal direction;
   a source/drain region in the fin-type active region at one side of the gate line;
   an insulating cover extending parallel to the substrate, with the gate line and the source/drain region arranged between the insulating cover and the substrate, the insulating cover vertically overlying the gate line and the source/drain region;

a source/drain contact vertically extending through the insulating cover, the source/drain contact having a first sidewall covered with the insulating cover and an end connected to the source/drain region; and a fin isolation insulating unit vertically extending through the insulating cover into the fin-type active region, the fin isolation insulating unit being spaced apart from the gate line, with the source/drain region arranged between the fin isolation insulating unit and the gate line.

2. The integrated circuit device of claim 1,
wherein a top surface of the source/drain contact and a top surface of the fin isolation insulating unit extend on a same plane.

3. The integrated circuit device comprising:
a fin-type active region extending on a substrate in a first horizontal direction:
a gate line extending on the fin-type active region in a second horizontal direction intersecting the first horizontal direction;
a source/drain region in the fin-type active region at one side of the gate line;
an insulating cover extending parallel to the substrate, with the gate line and the source/drain region arranged between the insulating cover and the substrate, the insulating cover vertically overlying the gate line and the source/drain region;
a source/drain contact vertically extending through the insulating cover, the source/drain contact having a first sidewall covered with the insulating cover and an end connected to the source/drain region; and
a fin isolation insulating unit vertically extending through the insulating cover into the fin-type active region, the fin isolation insulating unit being spaced apart from the gate line, with the source/drain region arranged between the fin isolation insulating unit and the gate line,
wherein the insulating cover comprises:
a first insulating cover covering the gate line, the source/drain region, and the fin-type active region and comprising a first material; and
a second insulating cover covering the first insulating cover and comprising a second material different from the first material, and
wherein a top surface of the source/drain contact, a top surface of the fin isolation insulating unit, and a top surface of the second insulating cover extend on a same plane.

4. The integrated circuit device of claim 1,
wherein the insulating cover comprises:
a first insulating cover covering the gate line, the source/drain region, and the fin-type active region and comprising a first material; and
a second insulating cover covering the first insulating cover and comprising a second material different from the first material,
wherein a top surface of the fin isolation insulating unit and a top surface of the first insulating cover extend on a same plane,
wherein a top surface of the source/drain contact and a top surface of the second insulating cover extend on a same plane, and
wherein the top surface of the source/drain contact is higher than the top surface of the fin isolation insulating unit.

5. The integrated circuit device of claim 1,
wherein the insulating cover is formed of a single layer covering the gate line, the source/drain region, and the fin-type active region, and
wherein a top surface of the source/drain contact, a top surface of the fin isolation insulating unit, and a top surface of the insulating cover extend on a same plane.

6. The integrated circuit device of claim 1,
wherein the insulating cover is formed of a single layer covering the gate line, the source/drain region, and the fin-type active region, and
wherein a top surface of the source/drain contact is higher than a top surface of the fin isolation insulating unit.

7. The integrated circuit device of claim 1,
wherein the source/drain contact comprises a lower source/drain contact and an upper source/drain contact, which are vertically connected to each other,
wherein the lower source/drain contact has an end connected to the source/drain region, and
wherein the upper source/drain contact has the first sidewall.

8. The integrated circuit device of claim 1,
wherein the source/drain contact integrally extends from the source/drain region to a top surface of the insulating cover, and
wherein a top surface of the source/drain contact, a top surface of the fin isolation insulating unit, and the top surface of the insulating cover extend on a same plane.

9. The integrated circuit device of claim 1, further comprising:
a gate contact vertically extending through the insulating cover, the gate contact having an end connected to a top surface of the gate line, and
wherein a top surface of the gate contact, a top surface of the fin isolation insulating unit, and a top surface of the insulating cover extend on a same plane.

10. The integrated circuit device of claim 1, further comprising:
a gate contact vertically extending through the insulating cover, the gate contact having an end connected to a top surface of the gate line,
wherein a top surface of the gate contact is higher than a top surface of the fin isolation insulating unit, and
wherein the top surface of the gate contact and a top surface of the insulating cover extend on a same plane.

11. The integrated circuit device of claim 1,
wherein the fin isolation insulating unit comprises:
a fin isolation insulating film extending in the second horizontal direction parallel to the gate line and having a sidewall covered with the insulating cover and an end filling a fin recess in the fin-type active region; and
a first fin isolation spacer between the fin isolation insulating film and the insulating cover, the first fin isolation spacer covering the sidewall of the fin isolation insulating film and having a bottom surface higher than an uppermost surface of the fin-type active region.

12. The integrated circuit device of claim 11,
wherein the fin isolation insulating unit further comprises:
a second fin isolation spacer between the fin isolation insulating film and the first fin isolation spacer, and
wherein the second fin isolation spacer comprises a protrusion between the first fin isolation spacer and the fin-type active region.

13. The integrated circuit device of claim 11,
wherein the fin isolation insulating unit further comprises:
a third fin isolation spacer between the fin isolation insulating film and the first fin isolation spacer, and
wherein the third fin isolation spacer extends from an inside of the fin recess to a same level as a top surface of the source/drain contact.

14. The integrated circuit device of claim 11,
wherein the fin isolation insulating film has a first width in the fin recess and a second width over the fin-type active region, and
wherein the first width is greater than the second width.

15. The integrated circuit device of claim 11,
wherein the fin isolation insulating film comprises a protrusion between the fin-type active region and the first fin isolation spacer.

16. An integrated circuit device comprising:
a fin-type active region extending on a substrate in a first direction;
a gate line extending on the fin-type active region in a second direction intersecting the first direction;
a first source/drain region and a second source/drain region in the fin-type active region;
an insulating cover extending parallel to the substrate, with the gate line, the first source/drain region and the second source/drain region arranged between the insulating cover and the substrate; and
a fin isolation insulating unit extending vertically through the insulating cover between the first source/drain region and the second source/drain region and having an end buried in the fin-type active region,
wherein the end of the fin isolation insulating unit is lower than a bottom surface of the first source/drain region.

17. The integrated circuit device of claim 16, further comprising:
a lower source/drain contact vertically extending from the first source/drain region, and
an upper source/drain contact vertically extending from a top surface of the lower source/drain contact to a top surface of the insulating cover.

18. The integrated circuit device of claim 16, further comprising:
a gate contact vertically extending from the gate line to a top surface of the insulating cover.

* * * * *